United States Patent
Fan et al.

(10) Patent No.: US 12,497,453 B2
(45) Date of Patent: *Dec. 16, 2025

(54) ROR1 SPECIFIC CHIMERIC ANTIGEN RECEPTORS AND THEIR THERAPEUTIC APPLICATIONS

(71) Applicant: NANJING IMMUNOPHAGE BIOTECH CO., LTD., Nanjing (CN)

(72) Inventors: Guohuang Fan, Shanghai (CN); Jianfei Wang, Shanghai (CN)

(73) Assignee: NANJING IMMUNOPHAGE BIOTECH CO., LTD., Nanjing (CN)

( * ) Notice: Subject to any disclaimer, the term of this patent is extended or adjusted under 35 U.S.C. 154(b) by 924 days.

This patent is subject to a terminal disclaimer.

(21) Appl. No.: 17/763,663

(22) PCT Filed: Sep. 24, 2020

(86) PCT No.: PCT/CN2020/117268
§ 371 (c)(1),
(2) Date: Mar. 25, 2022

(87) PCT Pub. No.: WO2021/057823
PCT Pub. Date: Apr. 1, 2021

(65) Prior Publication Data
US 2022/0356247 A1  Nov. 10, 2022

(30) Foreign Application Priority Data

Sep. 27, 2019 (CN) .......................... 201910929922.3
Jan. 9, 2020 (WO) ................ PCT/CN2020/071118

(51) Int. Cl.
| | | |
|---|---|---|
| C07K 16/28 | (2006.01) | |
| A61K 39/00 | (2006.01) | |
| A61K 40/11 | (2025.01) | |
| A61K 40/31 | (2025.01) | |
| A61K 40/42 | (2025.01) | |
| A61P 35/02 | (2006.01) | |
| C07K 14/725 | (2006.01) | |
| C12N 5/0783 | (2010.01) | |

(52) U.S. Cl.
CPC .......... *C07K 16/2803* (2013.01); *A61K 40/11* (2025.01); *A61K 40/31* (2025.01); *A61K 40/4202* (2025.01); *A61K 40/4211* (2025.01); *A61P 35/02* (2018.01); *C07K 14/7051* (2013.01); *C12N 5/0638* (2013.01); *A61K 2039/572* (2013.01); *A61K 2239/31* (2023.05); *A61K 2239/38* (2023.05); *A61K 2239/47* (2023.05); *A61K 2239/59* (2023.05); *C07K 2317/21* (2013.01); *C07K 2317/34* (2013.01); *C07K 2317/622* (2013.01); *C07K 2317/73* (2013.01); *C07K 2319/02* (2013.01); *C07K 2319/03* (2013.01); *C12N 2510/00* (2013.01)

(58) Field of Classification Search
CPC ............................ A61K 40/31; C12N 5/0636
See application file for complete search history.

(56) References Cited

U.S. PATENT DOCUMENTS

| | | | |
|---|---|---|---|
| 10,752,684 B2 | 8/2020 | Schiffer-Mannioui | |
| 2016/0208018 A1 | 7/2016 | Chen et al. | |
| 2017/0051035 A1* | 2/2017 | Payne | A61K 40/4211 |
| 2018/0044404 A1* | 2/2018 | Oda | A61P 31/12 |
| 2018/0147271 A1 | 5/2018 | Morgan et al. | |
| 2018/0346876 A1* | 12/2018 | Xiao | C07K 14/525 |
| 2019/0083596 A1* | 3/2019 | Orentas | C07K 16/2887 |
| 2020/0405759 A1 | 12/2020 | Nathwani et al. | |

FOREIGN PATENT DOCUMENTS

CN   110590951 A   12/2019

* cited by examiner

*Primary Examiner* — Christopher M Babic
*Assistant Examiner* — Jennifer S Spence
(74) *Attorney, Agent, or Firm* — HDLS IPR SERVICES; Chun-Ming Shih

(57) ABSTRACT

The present invention provides ROR1 specific chimeric antigen receptors (CAR) and their therapeutic use. The CAR comprises a signal peptide, a ROR1 antigen binding domain, a hinge, a transmembrane domain, a co-stimulatory domain and an intracellular signaling domain. The modified immune cells endowed with such CARs are suitable for treating malignancies such as cancer, chronic lymphocyte leukemia (CLL), and acute lymphocytic leukemia (ALL).

22 Claims, 16 Drawing Sheets

Specification includes a Sequence Listing.

ROR1 SPECIFIC CHIMERIC ANTIGEN RECEPTORS AND THEIR THERAPEUTIC APPLICATIONS

TECHNICAL FIELD

The invention relates to the field of biomedical or biopharmaceutical technology and particularly to ROR1 specific chimeric antigen receptors and their therapeutic applications.

BACKGROUND OF THE INVENTION

A rapidly emerging immunotherapy is called adoptive cell transfer (ACT). ACT is a form of treatment that uses our immune cells to eliminate cancer. Some of these approaches involve taking our natural immune cells and simply expanding their numbers, whereas others involve genetically engineering the immune cells to enhance their cancer-fighting capabilities.

In the case of cancer, immune cells known as killer T cells are particularly powerful against cancer, due to their ability to bind to markers on the surface of cancer cells known as antigens. Cellular immunotherapies take advantage of this natural ability in different ways, including tumor-infiltrating lymphocyte (TIL) therapy, engineered T cell receptor (TCR) therapy, chimeric antigen receptor (CAR) T cell therapy, natural killer (NK) cell therapy, etc. Though there are several types of ACT described above, thus far, the one that has advanced the furthest in clinical development is called CAR-T-cell therapy.

A growing number of CAR-T cell therapies are being developed and tested in clinical studies. Although there are important differences between these therapies, they all share similar components. The CAR on the cell's surface is composed of fragments, or domains, of synthetic antibodies. The domains that are used can affect how well the receptor recognizes or binds to the antigen on the tumor cell. The receptors rely on stimulation signals from inside the cell to do their job. So each CAR-T cell has signaling and "co-stimulatory" domains inside the cell that signal the cell from the surface receptor. The different domains that are used can affect the cells' overall function. Over time, advances in the intracellular engineering of CAR-T cells have improved the engineered T cells' ability to produce more T cells after infusion into the patient (expansion) and survive longer in the circulation (persistence). However, this approach has so far proven efficiency only with respect to patients with acute lymphocytic leukemia (ALL).

ROR1 is a highly conserved member of orphan receptors among species and involved in a variety of signaling pathways governing cell growth and epithelial-mesenchymal transition [Shabani M, Naseri J, Shokri F. Receptor tyrosine kinase-like orphan receptor 1: a novel target for cancer immunotherapy. Expert Opin Ther Targets. 2015 July; 19(7): 941-55.]. One of the ligands for ROR1 is Wnt5a [Fukuda T, Chen L, Endo T, Tang L, Lu D, Castro J E, et al. Antisera induced by infusions of autologous Ad-CD154-leukemia B cells identify ROR1 as an oncofetal antigen and receptor for Wnt5a. Proc Natl Acad Sci USA. 2008; 105(8):3047-52.].

ROR1 has been suggested to be a survival factor for various malignancies including chronic lymphocytic leukemia (CLL), breast cancer, lung adenocarcinoma, ovarian carcinoma, pancreatic carcinoma and glioblastoma [Hojjat-Farsangi M, Moshfegh A, Daneshmanesh A H, Khan A S, Mikaelsson E, Osterborg A, et al. The receptor tyrosine kinase ROR1—an oncofetal antigen for targeted cancer therapy. Semin Cancer Biol. 2014, 29:21-31].

At the amino terminus of ROR1 is an extracellular immunoglobulin-like domain, a cysteine-rich domain, also named the Frizzled domain, and a highly folded, cysteine-rich Kringle transmembrane domain. The cytoplasmic segment of ROR1 contains a tyrosine kinase domain with debatable kinase activity, a Serine/Threonine-rich domain, a Proline-rich domain, and another Serine/Threonine-rich domain at the carboxyl terminus, presumably involved in protein-protein interactions [Shabani M., Naseri J, Shokri F. Receptor tyrosine kinase-like orphan receptor1:a novel target for cancer immunotherapy. Expert Opin Ther Targets. 2015 July; 19(7):941-55]. WNT5A, the only known ligand for ROR1, binds to ROR1 via the Frizzled domain. The Kringle domain is responsible for the heterodimerization with another ROR family protein ROR2 in CLL cells, which leads to the activation of Rho family small GTPase, the subsequent cancer cell proliferation and migration.

ROR1 is highly expressed during embryogenesis of the central nervous system as well as in the heart, skeletal muscle and pulmonary systems. Adult normal tissues with the exception of adipose tissue, a small early B-cell subset and cells of the upper gastrointestinal tract do not express ROR1 [Balakrishnan et al., Analysis of ROR1 protein expression in human cancer and normal tissues. Clin Cancer Res. 2016. Epub 2016/11/18].

ROR1 seems to play an important role in cell signaling of significance for tumorigenesis as the PI3K/AKT/mTOR pathway and EGFR mediated signaling.

An important approach for targeting ROR1 for the treatment of cancer is the adoptive transfer of CAR-T cells that target ROR1. CAR-T cells are engineered T cells that express a CAR that is comprised of a binding domain or a single chain antibody specific to a tumor antigen, such as ROR1. ROR1 specific CARs have been generated that show potent recognition of ROR1-expressing tumor cells, both in vitro and in vivo. Adoptive transfer of these ROR1 specific CAR-T cells has been shown to be safe and effective of eliminating ROR1+ B cells in primates. The effects of current ROR1-targeting CAR-T are still unsatisfactory.

Double negative T cells (DNT cells) are mature peripheral T lymphocytes that express the CD3-TCR complex but do not express CD4, CD8, or NKT cell marker αGalCer-loaded CD1d and Jα24-Vα14; the represent 1-5% of peripheral blood mononuclear cells (PBMC) in human (zhang et al., 2000). The treatment can prevent death in more than 75% of the recipient that were inoculated with a lethal dose of autologous A20 lymphoma cells either systemically or locally (Young et al., 2001; Young et al., 2003). Moreover, protocols for expanding DNT cells from AML patients during chemotherapy-induced complete remission have been described and AML patients DNT cells have been shown to have significant anti-leukemic activity against the primary AML cells obtained from the same patient in vitro (Young et al., 2003). Unlike CD4 or CD8 T cells, infusion of in vitro activated allogeneic DNT cells did not cause GVHD. Furthermore, the injected allogeneic DNT cells can also prevent CD8 T cell induced GVHD in recipients.

DNT cells have very good anti-tumor properties and can prevent GVHD, so DNT cells are very suitable for the preparation of allogeneic CAR-T cells.

Therefore, there is an urgent need in the art to develop an effective ROR1-targeting immune cell which can effectively and specifically target and kill ROR1 positive cancer cells while causing minimal adverse side effects in humans.

SUMMARY OF THE INVENTION

The purpose of the invention is to provide an effective ROR1-targeting immune cell which can effectively and specifically target and kill ROR1 positive cancer cells while causing minimal adverse side effects in humans.

In the first aspect of invention, it provides a chimeric antigen receptor (CAR), which comprises:
(1) an extracellular domain comprising at least one antigen binding domain (or scFv) that specifically binds ROR1;
(2) a hinge region;
(3) a transmembrane region; and
(4) an intracellular signaling domain:
wherein the antigen binding domain comprises a heavy chain variable region which has a heavy chain complementarity determining region 1 (HCDR1), HCDR2, and HCDR3, and a light chain variable region which has complementarity determining region1 (LCDR1), LCDR2, and LCDR3;
wherein the polypeptide sequences of HCDR1, HCDR2, HCDR3, LCDR1, LCDR2, and LCDR3 have selected from the group consisting of:
a. SEQ ID NOs: 2, 3, 4, 6, 7 and 8;
b. SEQ ID NOs: 16, 17, 18, 20, 21 and 22;
c. SEQ ID NOs: 30, 31, 32, 34, 35 and 36;
or the polypeptide sequences of HCDR1, HCDR2, HCDR3, LCDR1, LCDR2, and LCDR3 have selected from the group consisting of:
a1. SEQ ID NOs: 9, 10, 11, 12, position 1-2 of SEQ ID No:13 (DA), and SEQ ID No: 14;
b1. SEQ ID NOs: 23, 24, 25, 26, position 1-2 of SEQ ID No:27 (DA), and SEQ ID No: 28;
c1. SEQ ID NOs: 37, 38, 39, 40, position 1-2 of SEQ ID No: 41 (DA), and SEQ ID No: 42.

In preferred embodiments, the antigen binding domain or scFv specifically binds receptor tyrosine kinase-like orphan receptor 1 (ROR1), preferably human ROR1; and any of the above amino acid sequences further includes a derivative sequence formed by optionally addition, deletion, modification, and/or substitution of 1-5 (or 1, 2, 3) amino acids, and capable of retaining ROR1 binding affinity.

In other particular embodiments, the ROR1 antigen binding domain is a single-chain variable fragment (scFv).

In preferred embodiments, the antigen binding domain comprises:
(i). a heavy chain variable region having the polypeptide sequence of SEQ ID NO: 1, and a light chain variable region having the polypeptide sequence of SEQ ID NO: 5; or
(ii). a heavy chain variable region having the polypeptide sequence of SEQ ID NO: 15, and a light chain variable region having the polypeptide sequence of SEQ ID NO:19; or
(iii). a heavy chain variable region having the polypeptide sequence of SEQ ID NO:29, and a light chain variable region having the polypeptide sequence of SEQ ID NO:33.

In preferred embodiments, the scFv further comprises a linker peptide located between the heavy chain variable region and the light chain variable region.

In preferred embodiments, the scFv is represented by the following formula A or formula B:

$$V_H\text{-}V_L \quad (A);$$

$$V_L\text{-}V_H \quad (B)$$

wherein, $V_H$ is the variable region of the heavy chain of the antibody; and $V_L$ is the variable region of the light chain of the antibody; "-" is a linker peptide or peptide bond.

In preferred embodiments, the linker peptide between $V_H$ and $V_L$ is $(GGGGS)_n$, wherein n is 1, 2, 3, or 4.

In preferred embodiments, the linker peptide between $V_H$ and $V_L$ is $(GGGGS)_3$. (SEQ ID No: 47).

In preferred embodiments, the structure of the CAR is shown in the following formula I:

$$L\text{-scFv-H-TM-C-CD3}\zeta \quad (I)$$

wherein
L is none or a signal peptide sequence;
scFv is ROR1-targeting antigen binding domain as defined hereinabove;
H is none or a hinge;
TM is a transmembrane domain;
C is a costimulatory signal domain;
CD3ζ is a cytoplasmic signaling sequence derived from CD3ζ; and
each "-" is independently a linker peptide or a peptide bond.

In preferred embodiments, L is a signal peptide of a protein selected from the group consisting of CD8, CD28, GM-CSF, CD4, CD137, and a combination thereof.

In preferred embodiments, L is a signal peptide derived from CD8.

In preferred embodiments, L has an amino acid sequence as shown in SEQ ID NO: 43.

In preferred embodiments, H is a hinge region of a protein selected from the group consisting of CD8, CD28, CD137, and a combination thereof.

In preferred embodiments, H is a hinge region derived from CD8.

In preferred embodiments, H has an amino acid sequence as shown in position 1-44 in SEQ ID NO: 44.

In preferred embodiments, TM is a transmembrane region of a protein selected from the group consisting of CD28, CD3 epsilon, CD45, CD4, CD5, CD8, CD9, CD16, CD22, CD33, CD37, CD64, CD80, CD86, CD134, CD137, CD154, and a combination thereof.

In preferred embodiments, TM is a transmembrane region derived from CD8 or CD28.

In preferred embodiments, the transmembrane region derived from CD8 has the amino acid sequence shown as position 45-69 in SEQ ID NO: 44.

In preferred embodiments, C is a costimulatory signal domain selected from the group consisting of: OX40, CD2, CD7, CD27, CD28, CD30, CD40, CD70, CD134, 4-1BB (CD137), PD1, Dap10, CDS, ICAM-1, LFA-1 (CD11a/CD18), ICOS (CD278), NKG2D, GITR, TLR2, and a combination thereof.

In preferred embodiments, C is a costimulatory signal domain derived from CD28 and/or 4-1BB.

In preferred embodiments, the 4-1BB-derived costimulatory signal molecule has an amino acid sequence as shown in SEQ ID NO: 45.

In preferred embodiments, CD3ζ has an amino acid sequence as shown in SEQ ID NO: 46.

In a preferred embodiment, a ROR1 specific CAR shares at least 85%, preferably at least 90%6, more preferably at least 95%, and even more preferably at least 99% sequence identity with the amino acid sequence of SEQ ID NO: 48, 49, or 50.

In particular preferred embodiments, the $V_H$ chain and the $V_L$ chain have at least 80%, preferably at least 90%, more preferably at least 95%, and even more preferably at least 99% sequence identity respectively with the amino acid sequence of SEQ ID NO: 1, 15 or 29 ($V_H$) and SEQ ID NO: 5, 19 or 33 ($V_L$).

In the second aspect of the present invention, it provides a bispecific CAR, which targets a first target and a second target, wherein the first target is ROR1.

In preferred embodiments, the second target is selected from the following group: CD19, CD20, or a combination thereof.

In preferred embodiments, the scFv is a human, chimeric, or fully humanized.

In the third aspect of the present invention, it provides a nucleic acid molecule encoding the CAR of the first aspect of the present invention or the bispecific CAR of the second aspect.

In preferred embodiments, the nucleic acid molecule is DNA, or RNA.

In the fourth aspect of the present invention, it provides a vector containing the nucleic acid molecule according to the third aspect of the present invention.

In preferred embodiments, the vector is selected from the group consisting of plasmid, virus vector (such as lentiviral vector, adenoviral vector, or retroviral vector), and a combination thereof.

In preferred embodiments, the vector is a lentiviral vector.

In the fifth aspect of the present invention, it provides an engineered host cell, which comprises a vector of the fourth aspect of the present invention, or in which a nucleic acid molecule of the third aspect of the present invention is integrated into chromosome or genome, or which expresses the CAR of the first aspect of the present invention or the bispecific CAR of the second aspect.

In the sixth aspect of the present invention, it provides an engineered immune cell which comprises a vector of the fourth aspect of the present invention, or in which a nucleic acid molecule of the third aspect of the present invention is integrated into chromosome or genome, or which expresses the CAR of the first aspect of the present invention or the bispecific CAR of the second aspect.

In preferred embodiments, the modified immune cell is autologous or allogeneic cell.

In preferred embodiments, the engineered immune cell is selected from the following group:
(i) chimeric antigen receptor T cell (CAR-T cell); or
(ii) chimeric antigen receptor NK cell (CAR-NK cell).

In preferred embodiments, the modified immune cell is cytotoxic T-lymphocytes.

In preferred embodiments, the modified immune cell is double negative T cell (DNT cell).

In preferred embodiments, a modified immune cell expresses ROR1 specific CARs at the cell surface.

In the seventh aspect of the present invention, it provides a pharmaceutical composition or preparation containing the CAR of the first or second aspect of the invention, the vector of the fourth aspect or the engineered immune cell of the sixth aspect of the invention, and a pharmaceutically acceptable carrier, diluent or excipient.

In preferred embodiments, the pharmaceutical composition is a liquid preparation.

In preferred embodiments, the pharmaceutical composition is an injection.

In preferred embodiments, the concentration of the engineered immune cell in the pharmaceutical composition is $1\times10^3$-$1\times10^8$ cells/mL, and preferably $1\times10^4$-$1\times10^7$ cells/mL.

In the eighth aspect of the present invention, it provides a use of the CAR of the first or second aspect of the present invention, the vector of the fourth aspect, or the engineered immune cell of the sixth aspect of the present invention, for preparing a medicine or formulation for preventing and/or treating cancer.

In the ninth aspect of the present invention, it provides a method for preparing an engineered immune cell, wherein the engineered immune cell expresses a CAR of the first aspect or the second aspect of the present invention, wherein the method comprises the following steps: transducing a nucleic acid molecule of the third aspect or a vector of the fourth aspect of the present invention into an immune cell, thereby obtaining the engineered immune cell.

In preferred embodiments, the immune cell is T cell or NK cell.

In preferred embodiments, the immune cell is DNT cell.

In the tenth aspect of the present invention, it provides a kit for preparing the engineered immune cells of the sixth aspect of the present invention, which comprises a container which contains a nucleic acid molecule of the third aspect of the present invention, or a vector of the fourth aspect of the present invention.

In the 11th aspect of the present invention, it provides a use of the vector of the fourth aspect, or the engineered immune cells of the sixth aspect of the present invention for preventing and/or treating cancer or tumor.

In the 12th aspect of the present invention, it provides a method for treating a disease, which comprises administering the vector of the fourth aspect, or the engineered immune cell of the sixth aspect of the present invention or a formulation or composition of the seventh aspect of the present invention to a subject in need of.

In preferred embodiments, the disease is cancer.
In preferred embodiments, the subject is human.
In preferred embodiments, the cancer is pre-malignant or malignant cancer characterized by ROR1-expressing cells.

In a preferred embodiment, the cancer comprises non-solid tumor.

In a preferred embodiment, the cancer is hematological malignancy.

In a particular preferred embodiment, the hematological malignancy is chronic lymphocyte leukemia (CLL), small lymphocytic lymphoma (SLL), acute myelogenous leukemia, chronic myelogenous leukemia, myelodysplastic syndrome, mantle cell lymphoma (MCL), or acute lymphocytic leukemia (ALL).

In a preferred embodiment, the cancer comprises solid tumor.

In a particular preferred embodiment, the solid tumor is breast cancer, prostate cancer, liver cancer, lung cancer, pancreatic cancer, colon cancer, or kidney cancer.

In the 13th aspect of the present invention, it provides a method of engineering the modified immune cell, which comprises:
(a) providing immune cell,
(b) expressing at least one ROR1 specific CAR.

In another embodiment, the engineering method comprising:
(a) providing immune cell,
(b) introducing at least one polynucleotide encoding a ROR1 specific CAR into the modified immune cell, (c) expressing at least one polynucleotide at the surface of the modified immune cell.

In another embodiment, the engineering method comprising:
(a) providing immune cell,
(b) introducing at least one CAR expression vector into the modified immune cell,
(c) expressing at least one polynucleotide at the surface of the modified immune cell.

The modified immune cells of the present invention are particularly useful for therapeutic applications. In an embodiment, the modified immune cells the modified immune cells are used to manufacture of a medicament for treating cancer.

DETAILED DESCRIPTION OF THE INVENTION

After extensive and intensive research and extensive screening, the inventors unexpectedly obtained a set of fully human ROR1 antibodies with a completely new amino acid sequence. The ROR1 antibodies of the present invention have excellent high affinity with human ROR1 protein, have extremely low immunogenicity or even no immunogenicity to human, so that they are particularly suitable for constructing ROR-targeting chimeric antigen receptors for treating ROR1-related diseases such as tumors. The present invention has been completed on this basis.

Figure 1A:
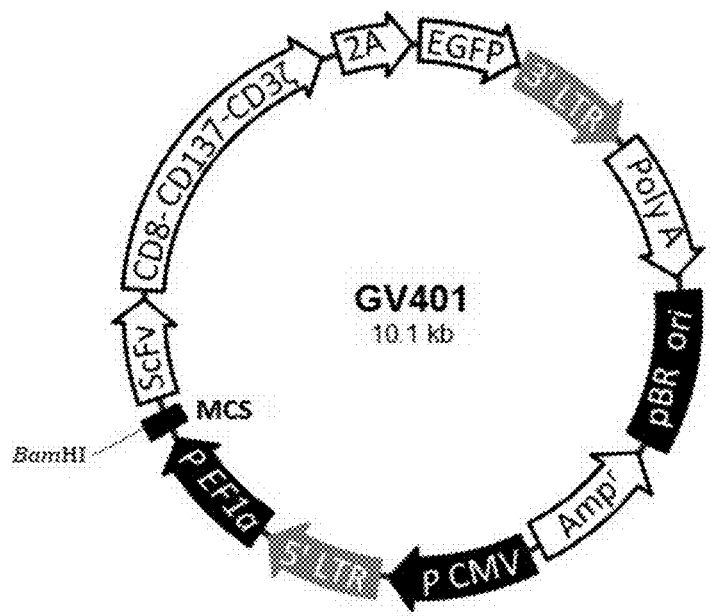
FIG. 1A depicts the lentiviral vectors and FIG. 1B depicts the structure of anti-ROR1 chimeric antigen receptor (CAR).
Figure 1B:
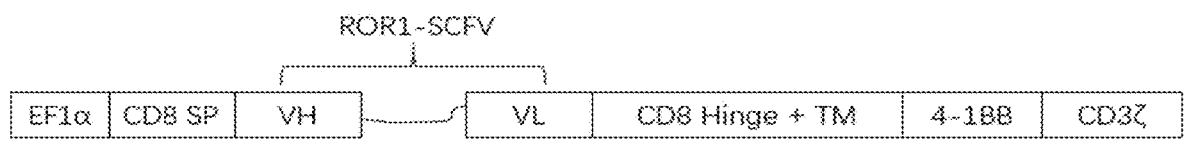

Specifically, the inventors have utilized scFv from different ROR1 antibodies to construct CAR-T cells, and compare the effects. Unexpectedly, certain scFvs have a more favorable effect, including high ability to kill ROR1 overexpressing cells and ROR1 positive tumor target cells. The ROR1 specific chimeric antigen receptor (CAR) according to the present invention comprises a signal peptide, an extra cellular ROR1 antigen binding domain comprising $V_H$ and $V_L$ from anti-ROR1 antibody, a hinge, a transmembrane domain, a co-stimulatory domain and an intracellular signaling domain (FIG. 1B). Such ROR1 specific CAR have been found to have unexpected superior anti-tumor effect.

Terms

Unless defined otherwise, all technical and scientific terms used herein have the same meaning as commonly understood to one of ordinary skill in the art to which this invention pertains. Otherwise, certain terms used herein have the meanings as set forth in the specification.

It must be noted that as used herein and in the appended claims, the singular forms "a", "an", and "the" include plural reference unless the context clearly dictates otherwise.

Unless otherwise stated, any numerical values, such as a concentration or a concentration range described herein, are to be understood as being modified in all instances by the term "about." Thus, a numerical value typically includes ±10% of the recited value. For example, a concentration of 1 mg/mL includes 0.9 mg/mL to 1.1 mg/mL. Likewise, a concentration range of 1% to 10% (w/v) includes 0.9% (w/v) to 11% (w/v). As used herein, the use of a numerical range expressly includes all possible subranges, all individual numerical values within that range, including integers within such ranges and fractions of the values unless the context clearly indicates otherwise.

Unless otherwise indicated, the term "at least" preceding a series of elements is to be understood to refer to every element in the series. Those skilled in the art will recognize or be able to ascertain using no more than routine experimentation, many equivalents to the specific embodiments of the invention described herein. Such equivalents are intended to be encompassed by the invention.

As used herein, the terms "comprises", "comprising", "includes", "including", "has", "having", "contains" or "containing", or any other variation thereof, will be understood to imply the inclusion of a stated integer or group of integers but not the exclusion of any other integer or group of integers and are intended to be non-exclusive or open-ended. For example, a composition, a mixture, a process, a method, an article, or an apparatus that comprises a list of elements is not necessarily limited to only those elements but can include other elements not expressly listed or inherent to such composition, mixture, process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the conjunctive term "and/or" between multiple recited elements is understood as encompassing both individual and combined options. For instance, where two elements are conjoined by "and/or", a first option refers to the applicability of the first element without the second. A second option refers to the applicability of the second element without the first. A third option refers to the applicability of the first and second elements together. Any one of these options is understood to fall within the meaning, and therefore satisfy the requirement of the term "and/or" as used herein. Concurrent applicability of more than one of the options is also understood to fall within the meaning, and therefore satisfy the requirement of the term "and/or."

As used herein, the term "consists of", or variations such as "consist of" or "consisting of", as used throughout the specification and claims, indicate the inclusion of any recited integer or group of integers, but that no additional integer or group of integers can be added to the specified method, structure, or composition.

As used herein, the term "consists essentially of", or variations such as "consist essentially of" or "consisting essentially of", as used throughout the specification and claims, indicate the inclusion of any recited integer or group of integers, and the optional inclusion of any recited integer or group of integers that do not materially change the basic or novel properties of the specified method, structure or composition. See M.P.E.P. § 2111.03.

As used herein, "subject" means any animal, preferably a mammal, most preferably a human. The term "mammal" as used herein, encompasses any mammal. Examples of mammals include, but are not limited to, cows, horses, sheep, pigs, cats, dogs, mice, rats, rabbits, guinea pigs, monkeys, humans, etc., more preferably a human.

It should also be understood that the terms "about", "approximately", "generally", "substantially", and like terms, used herein when referring to a dimension or characteristic of a component of the preferred invention, indicate that the described dimension/characteristic is not a strict boundary or parameter and does not exclude minor variations therefrom that are functionally the same or similar, as would be understood by one having ordinary skill in the art. At a minimum, such references that include a numerical parameter would include variations that, using mathematical and industrial principles accepted in the art (e.g., rounding, measurement or other systematic errors, manufacturing tolerances, etc.), would not vary the least significant digit.

The terms "identical" or percent "identity", in the context of two or more nucleic acids or polypeptide sequences (e.g., anti-ROR1 antibodies and polynucleotides that encode them, ROR1 polypeptides and ROR1 polynucleotides that encode them), refer to two or more sequences or subsequences that are the same or have a specified percentage of amino acid residues or nucleotides that are the same, when compared and aligned for maximum correspondence, as measured using one of the following sequence comparison algorithms or by visual inspection.

For sequence comparison, typically one sequence acts as a reference sequence, to which test sequences are compared. When using a sequence comparison algorithm, test and reference sequences are input into a computer, subsequence coordinates are designated, if necessary, and sequence algorithm program parameters are designated. The sequence comparison algorithm then calculates the percent sequence identity for the test sequence(s) relative to the reference sequence, based on the designated program parameters.

Optimal alignment of sequences for comparison can be conducted, e.g., by the local homology algorithm of Smith & Waterman, Adv. Appl. Math. 2:482 (1981), by the homology alignment algorithm of Needleman & Wunsch, J. Mol. Biol. 48:443 (1970), by the search for similarity method of Pearson & Lipman, Proc. Nat'l. Acad. Sci. USA 85:2444 (1988), by computerized implementations of these algorithms (GAP, BESTFIT, FASTA, and TFASTA in the Wisconsin Genetics Software Package, Genetics Computer Group, 575 Science Dr., Madison, WI), or by visual inspection (see generally, Current Protocols in Molecular Biology, F. M. Ausubel et al., eds., Current Protocols, a joint venture between Greene Publishing Associates, Inc. and John Wiley & Sons, Inc., (1995 Supplement) (Ausubel)).

Examples of algorithms that are suitable for determining percent sequence identity and sequence similarity are the BLAST and BLAST 2.0 algorithms, which are described in Altschul et al. (1990) J. Mol. Biol. 215: 403-410 and Altschul et al. (1997) Nucleic Acids Res. 25: 3389-3402, respectively. Software for performing BLAST analyses is publicly available through the National Center for Biotechnology Information. This algorithm involves first identifying high scoring sequence pairs (HSPs) by identifying short words of length W in the query sequence, which either match or satisfy some positive-valued threshold score T when aligned with a word of the same length in a database sequence. T is referred to as the neighborhood word score threshold (Altschul et al, supra). These initial neighborhood word hits act as seeds for initiating searches to find longer HSPs containing them. The word hits are then extended in both directions along each sequence for as far as the cumulative alignment score can be increased.

Cumulative scores are calculated using, for nucleotide sequences, the parameters M (reward score for a pair of matching residues; always >0) and N (penalty score for mismatching residues; always <0). For amino acid sequences, a scoring matrix is used to calculate the cumulative score. Extension of the word hits in each direction are halted when: the cumulative alignment score falls off by the quantity X from its maximum achieved value; the cumulative score goes to zero or below, due to the accumulation of one or more negative-scoring residue alignments; or the end of either sequence is reached. The BLAST algorithm parameters W, T, and X determine the sensitivity and speed of the alignment. The BLASTN program (for nucleotide sequences) uses as defaults a wordlength (W) of 11, an expectation (E) of 10, M=5, N=-4, and a comparison of both strands. For amino acid sequences, the BLASTP program uses as defaults a wordlength (W) of 3, an expectation (E) of 10, and the BLOSEIM62 scoring matrix (see Henikoff & Henikoff, Proc. Natl. Acad. Sci. ETSA 89: 10915 (1989)).

In addition to calculating percent sequence identity, the BLAST algorithm also performs a statistical analysis of the similarity between two sequences (see, e.g., Karlin & Altschul, Proc. NatT. Acad. Sci. ETSA 90:5873-5787 (1993)). One measure of similarity provided by the BLAST algorithm is the smallest sum probability (P(N)), which provides an indication of the probability by which a match between two nucleotide or amino acid sequences would occur by chance. For example, a nucleic acid is considered similar to a reference sequence if the smallest sum probability in a comparison of the test nucleic acid to the reference nucleic acid is less than about 0.1, more preferably less than about 0.01, and most preferably less than about 0.001.

A further indication that two nucleic acid sequences or polypeptides are substantially identical is that the polypeptide encoded by the first nucleic acid is immunologically cross reactive with the polypeptide encoded by the second nucleic acid, as described below. Thus, a polypeptide is typically substantially identical to a second polypeptide, for example, where the two peptides differ only by conservative substitutions. Another indication that two nucleic acid sequences are substantially identical is that the two molecules hybridize to each other under stringent conditions.

The term "polynucleotide" as used herein is defined as a chain of nucleotides. Furthermore, nucleic acids are polymers of nucleotides. Thus, nucleic acids and polynucleotides as used herein are interchangeable. One skilled in the art has the general knowledge that nucleic acids are polynucleotides, which can be hydrolyzed into the monomeric "nucleotides." The monomeric nucleotides can be hydrolyzed into nucleosides. As used herein polynucleotides include, but are not limited to, all nucleic acid sequences which are obtained by any means available in the art, including, without limitation, recombinant means, i.e., the cloning of nucleic acid sequences from a recombinant library or a cell genome, using ordinary cloning technology and PCR™, and the like, and by synthetic means.

As used herein, the terms "peptide", "polypeptide", and "protein" are used interchangeably, and refer to a compound comprised of amino acid residues covalently linked by peptide bonds. A protein or peptide must contain at least two amino acids, and no limitation is placed on the maximum number of amino acids that can comprise a protein's or peptide's sequence. Polypeptides include any peptide or protein comprising two or more amino acids joined to each other by peptide bonds. As used herein, the term refers to both short chains, which also commonly are referred to in the art as peptides, oligopeptides and oligomers, for example, and to longer chains, which generally are referred to in the art as proteins, of which there are many types. "Polypeptides" include, for example, biologically active fragments, substantially homologous polypeptides, oligopeptides, homodimers, heterodimers, variants of polypeptides, modified polypeptides, derivatives, analogs, fusion proteins, among others. The polypeptides include natural peptides, recombinant peptides, synthetic peptides, or a combination thereof.

The term "antigen-binding fragment" as used herein refers to a polypeptide fragment that contains at least one CDR of an immunoglobulin heavy and/or light chain that binds to the antigen of interest, which antigen in particularly preferred embodiments described herein is the receptor tyrosine kinase-like orphan receptor 1 (ROR1). In this regard, an antigen-binding fragment of the herein described antibodies may comprise one, two, three, four, five or all six CDRs of a $V_H$ and/or $V_L$ sequence set forth herein from antibodies that bind ROR1. An antigen-binding fragment of the herein described ROR1-specific antibodies is capable of binding to ROR1. In other embodiments, binding of an antigen-binding fragment prevents or inhibits binding of ROR1 ligand(s) to the ROR1 receptor, interrupting the biological response that would otherwise result from ligand binding to the receptor. In certain embodiments, the antigen-binding fragment binds specifically to and/or inhibits or modulates the biological activity of ROR1.

The term "antigen" refers to a molecule or a portion of a molecule capable of being bound by a selective binding agent, such as an antibody, and additionally capable of being used in an animal to produce antibodies capable of binding to an epitope of that antigen. An antigen may have one or more epitopes.

The term "epitope" includes any determinant, preferably a polypeptide determinant, that is capable of specific binding to an immunoglobulin or T-cell receptor. An epitope is a region of an antigen that is bound by an antibody. In certain embodiments, epitope determinants include chemically active surface groupings of molecules such as amino acids, sugar side chains, phosphoryl or sulfonyl, and may in certain embodiments have specific three-dimensional structural characteristics, and/or specific charge characteristics. In certain embodiments, an antibody is said to specifically bind an antigen when it preferentially recognizes its target antigen in a complex mixture of proteins and/or macromolecules. An antibody may according to certain embodiments be said to bind an antigen specifically when the equilibrium dissociation constant for antibody-antigen binding is less than or equal to $10^{-6}$ M, or less than or equal to $10^{-7}$ M, or less than or equal to $10^{-8}$ M. In some embodiments, the equilibrium dissociation constant may be less than or equal to $10^{-9}$ M or less than or equal to $10^{-10}$ M.

The term "vector" is used to refer to any molecule (e.g., nucleic acid, plasmid, or virus) used to transfer coding information to a host cell. The term "expression vector" refers to a vector that is suitable for transformation of a host cell and contains nucleic acid sequences that direct and/or control expression of inserted heterologous nucleic acid sequences. Expression includes, but is not limited to, processes such as transcription, translation, and RNA splicing, if introns are present.

The term "autologous" refers to any material derived from the same individual to which it is later to be re-introduced into the individual.

The term "allogeneic" refers to a graft derived from a different animal of the same species.

The term "xenograft" refers to a graft derived from an animal of a different species.

The term "lentivirus" as used herein refers to a genus of the Retroviridae family. Lentiviruses are unique among the retroviruses in being able to infect non-dividing cells; they can deliver a significant amount of genetic information into the DNA of the host cell, so they are one of the most efficient methods of a gene delivery vector. HIV, SIV, and FIV are all examples of lentiviruses. Vectors derived from lentiviruses offer the means to achieve significant levels of gene transfer in vivo.

The term "cancer" as used herein refers to disease characterized by the rapid and uncontrolled growth of aberrant cells. Cancer cells can spread locally or through the bloodstream and lymphatic system to other parts of the body. Examples of various cancers include but are not limited to, breast cancer, prostate cancer, ovarian cancer, cervical cancer, skin cancer, pancreatic cancer, colorectal cancer, renal cancer, liver cancer, brain cancer, lymphoma, leukemia, lung cancer and the like.

The term "anti-tumor effect" as used herein refers to a biological effect which can be manifested by a decrease in tumor volume, a decrease in the number of tumor cells, a decrease in the number of metastases, an increase in life expectancy, or amelioration of various physiological symptoms associated with the cancerous condition. An "antitumor effect" can also be manifested by the ability of the peptides, polynucleotides, cells and antibodies of the invention in prevention of the occurrence of tumor in the first place.

To "treat" a disease as the term is used herein refers to reduce the frequency or severity of at least one sign or symptom of a disease or disorder experienced by a subject.
Antibodies and scFv As used herein, the term "antibody" is used in a broad sense and includes immunoglobulin or antibody molecules including human, humanized, composite and chimeric antibodies and antibody fragments that are monoclonal or polyclonal. In general, antibodies are proteins or peptide chains that exhibit binding specificity to a specific antigen. Antibody structures are well known. According to particular embodiments, the antibodies of the invention include heavy and/or light chain constant regions from human antibodies. In addition to the heavy and light constant domains, antibodies contain an antigen-binding region that is made up of a light chain variable region and a heavy chain variable region, each of which contains three domains (i.e., complementarity determining regions 1-3; CDR1, CDR2, and CDR3). The light chain variable region domains are alternatively referred to as LCDR1, LCDR2, and LCDR3, and the heavy chain variable region domains are alternatively referred to as HCDR1, HCDR2, and HCDR3.

As used herein, the term an "isolated antibody" refers to an antibody which is substantially free of other antibodies having different antigenic specificities (e.g., an isolated antibody that specifically binds to ROR1 is substantially free of antibodies that do not bind to ROR1). In addition, an isolated antibody is substantially free of other cellular material and/or chemicals.

As used herein, the term "monoclonal antibody" refers to an antibody obtained from a population of substantially homogeneous antibodies, i.e., the individual antibodies comprising the population are identical except for possible naturally occurring mutations that may be present in minor amounts. The monoclonal antibodies of the invention can be made by the hybridoma method, phage display technology, single lymphocyte gene cloning technology, or by recombinant DNA methods. For example, the monoclonal antibodies can be produced by a hybridoma which includes a B cell obtained from a transgenic nonhuman animal, such as a transgenic mouse or rat, having a genome comprising a human heavy chain transgene and a light chain transgene.

As used herein, the term "antigen-binding fragment" refers to an antibody fragment such as, for example, a diabody, a Fab, a Fab', a F(ab')$_2$, an Fv fragment, a disulfide stabilized Fv fragment (dsFv), a (dsFv)$_2$, a bispecific dsFv (dsFv-dsFv1), a disulfide stabilized diabody (ds diabody), a single-chain antibody molecule (scFv), a single domain antibody (sdab) an scFv dimer (bivalent diabody), a multispecific antibody formed from a portion of an antibody comprising one or more CDRs, a camelized single domain antibody, a nanobody, a domain antibody, a bivalent domain antibody, or any other antibody fragment that binds to an antigen but does not comprise a complete antibody structure. An antigen-binding fragment is capable of binding to the same antigen to which the parent antibody or a parent antibody fragment binds. According to particular embodiments, the antigen-binding fragment comprises a light chain variable region, a light chain constant region, and an Fd segment of the heavy chain. According to other particular embodiments, the antigen-binding fragment comprises Fab and F(ab').

As used herein, the term "single-chain antibody" refers to a conventional single chain antibody in the field, which comprises a heavy chain variable region and a light chain variable region connected by a short peptide of about 5 to about 20 amino acids. As used herein, the term "single domain antibody" refers to a conventional single domain antibody in the field, which comprises a heavy chain variable region and a heavy chain constant region or which comprises only a heavy chain variable region.

As used herein, the term "human antibody" refers to an antibody produced by a human or an antibody having an amino acid sequence corresponding to an antibody produced by a human made using any technique known in the art. This definition of a human antibody includes intact or full-length antibodies, fragments thereof, and/or antibodies comprising at least one human heavy and/or light chain polypeptide.

As used herein, the term "humanized antibody" refers to a non-human antibody that is modified to increase the sequence homology to that of a human antibody, such that the antigen-binding properties of the antibody are retained, but its antigenicity in the human body is reduced.

As used herein, the term "chimeric antibody" refers to an antibody wherein the amino acid sequence of the immunoglobulin molecule is derived from two or more species. The variable region of both the light and heavy chains often corresponds to the variable region of an antibody derived from one species of mammal (e.g., mouse, rat, rabbit, etc.) having the desired specificity, affinity, and capability, while the constant regions correspond to the sequences of an antibody derived from another species of mammal (e.g., human) to avoid eliciting an immune response in that species.

As used herein, an antibody that "specifically binds to ROR1" refers to an antibody that binds to a ROR1, preferably a human ROR1, with a KD of $1\times10^{-7}$ M or less, preferably $1\times10^{-8}$ M or less, more preferably $5\times10^{-9}$ M or less, $1\times10^{-9}$ M or less, $5\times10^{-10}$ M or less, or $1\times10^{-10}$ M or less. The term "KD" refers to the dissociation constant, which is obtained from the ratio of Kd to Ka (i.e., Kd/Ka) and is expressed as a molar concentration (M). KD values for antibodies can be determined using methods in the art in view of the present disclosure. For example, the KD of an antibody can be determined by using surface plasmon resonance, such as by using a biosensor system, e.g., a Biacore® system, or by using bio-layer interferometry technology, such as an Octet RED96 system.

The smaller the value of the KD of an antibody, the higher affinity that the antibody binds to a target antigen.

By the term "specifically binds" as used herein with respect to an antibody, means an antibody which recognizes a specific antigen, but does not substantially recognize or bind other molecules in a sample. For example, an antibody that specifically binds to an antigen from one species may also bind to that antigen from one or more species. But, such cross-species reactivity does not itself alter the classification of an antibody as specific. In another example, an antibody that specifically binds to an antigen may also bind to different allelic forms of the antigen. However, such cross reactivity does not itself alter the classification of an antibody as specific. In some instances, the terms "specific binding" or "specifically binding", can be used in reference to the interaction of an antibody, a protein, or a peptide with a second chemical species, to mean that the interaction is dependent upon the presence of a particular structure (e.g., an antigenic determinant or epitope) on the chemical species; for example, an antibody recognizes and binds to a specific protein structure rather than to proteins generally. If an antibody is specific for epitope "A", the presence of a molecule containing epitope A (or free, unlabeled A), in a reaction containing labeled "A" and the antibody, will reduce the amount of labeled A bound to the antibody.

In certain embodiments, antibodies and antigen-binding fragments thereof as described herein include a heavy chain and a light chain CDR set, respectively interposed between a heavy chain and a light chain framework region (FR) set which provide support to the CDRs and define the spatial relationship of the CDRs relative to each other. As used herein, the term "CDR set" refers to the three hypervariable regions of a heavy or light chain V region. Proceeding from the N-terminus of a heavy or light chain, these regions are denoted as "CDR1", "CDR2", and "CDR3" respectively. An antigen-binding site, therefore, includes six CDRs, comprising the CDR set from each of a heavy and a light chain V region. A polypeptide comprising a single CDR, (e.g., a CDR1, CDR2 or CDR3) is referred to herein as a "molecular recognition unit." Crystallographic analysis of a number of antigen-antibody complexes has demonstrated that the amino acid residues of CDRs form extensive contact with bound antigen, wherein the most extensive antigen contact is with the heavy chain CDR3. Thus, the molecular recognition units are primarily responsible for the specificity of an antigen-binding site.

As used herein, the term "FR set" refers to the four flanking amino acid sequences which frame the CDRs of a CDR set of a heavy or light chain V region. Some FR residues may contact bound antigen; however, FRs are primarily responsible for folding the V region into the antigen-binding site, particularly the FR residues directly adjacent to the CDRs. Within FRs, certain amino residues and certain structural features are very highly conserved. In this regard, all V region sequences contain an internal disulfide loop of around 90 amino acid residues. When the V regions fold into a binding-site, the CDRs are displayed as projecting loop motifs which form an antigen-binding surface. It is generally recognized that there are conserved structural regions of FRs which influence the folded shape of the CDR loops into certain "canonical" structures-regardless of the precise CDR amino acid sequence. Further, certain FR residues are known to participate in non-covalent interdomain contacts which stabilize the interaction of the antibody heavy and light chains.

The structures and locations of immunoglobulin variable regions may be determined by reference to Kabat, E. A. et al, Sequences of Proteins of Immunological Interest, 4th Edition, US Department of Health and Human Services, 1987, and updates thereof, now available on the Internet (immuno.bme.nwu.edu).

An "antibody heavy chain" as used herein refers to the larger of the two types of polypeptide chains present in all antibody molecules in their naturally occurring conformations. The heavy chain from any vertebrate species can be assigned to one of five different classes (or isotypes): IgA, IgD, IgE, IgG, and IgM. These classes are also designated α, δ, ε, γ, and μ, respectively. The IgG and IgA classes are further divided into subclasses on the basis of differences in sequence and function. Humans express the following subclasses: IgG1, IgG2, IgG3, IgG4, IgA1, and IgA2.

An "antibody light chain" as used herein refers to the smaller of the two types of polypeptide chains present in all antibody molecules in their naturally occurring conformations. κ and λ light chains refer to the two major antibody light chain isotypes.

By the term "synthetic antibody" as used herein is meant an antibody which is generated using recombinant DNA technology, such as, for example, an antibody expressed by a bacteriophage as described herein. The term should also be construed to mean an antibody which has been generated by the synthesis of a DNA molecule encoding the antibody and which DNA molecule expresses an antibody protein, or an amino acid sequence specifying the antibody, wherein the DNA or amino acid sequence has been obtained using synthetic DNA or amino acid sequence technology which is available and well known in the art.

In preferred embodiments, the isolated monoclonal antibody or antigen-binding fragment (or scFV) thereof comprises a heavy chain complementarity determining region 1 (HCDR1), a HCDR2, a HCDR3, a light chain complementarity determining region 1 (LCDR1), a LCDR2, and a LCDR3, having the polypeptide sequences of:
  a. SEQ ID NOs: 2, 3, 4, 6, 7 and 8, respectively;
  b. SEQ ID NOs: 16, 17, 18, 20, 21 and 22, respectively;
  c. SEQ ID NOs: 30, 31, 32, 34, 35 and 36, respectively;
    wherein the antibody or antigen-binding fragment thereof specifically binds ROR1, preferably human ROR1.

In preferred embodiments, the isolated monoclonal antibody or antigen-binding fragment (or scFV) thereof comprises a heavy chain complementarity determining region 1 (HCDR1), a HCDR2, a HCDR3, a light chain complementarity determining region 1 (LCDR1), a LCDR2, and a LCDR3, having the polypeptide sequences of:
  a. SEQ ID NOs: 9, 10, 11, 12, position 1-2 of SEQ ID No:13 (DA), and SEQ ID No: 14, respectively;
  b. SEQ ID NOs: 23, 24, 25, 26, position 1-2 of SEQ ID No:27 (DA), and SEQ ID No: 28, respectively;
  c. SEQ ID NOs: 37, 38, 39, 40, position 1-2 of SEQ ID No: 41 (DA), and SEQ ID No: 42, respectively;
    wherein the antibody or antigen-binding fragment thereof specifically binds ROR1, preferably human ROR1.

According to another particular aspect, the invention relates to an isolated monoclonal antibody or antigen-binding fragment thereof (e.g., scFV) comprising a heavy chain variable region having a polypeptide sequence at least 85%, preferably 90%, more preferably 95% or more, such as 95%, 96%, 97%, 98%, or 99% identical to one of SEQ ID NO: 1, 15, or 29, and/or a light chain variable region having a polypeptide sequence at least 85%, preferably 90%, more preferably 95% or more, such as 95%, 96%, 97%, 98%, or 99% identical to one of SEQ ID NO: 5, 19, or 33.

In the present invention, the antibody of the present invention or antigen-binding fragment thereof (e.g., scFV) also includes a conservative variant thereof, which means that, compared to the amino acid sequence of the antibody of the present invention, there are up to 10, preferably up to 8 and more preferably up to 5, most preferably up to 3 amino acids are replaced by amino acids with similar or similar properties to form a polypeptide. These conservative variant polypeptides are preferably produced by amino acid substitution according to Table A

TABLE A

| Original residue | Representative replacement | Preferred replacement s |
|---|---|---|
| Ala (A) | Val; Leu; Ile | Val |
| Arg (R) | Lys; Gln; Asn | Lys |
| Asn (N) | Gln; His; Lys; Arg | Gln |
| Asp (D) | Glu | Glu |
| Cys (C) | Ser | Ser |
| Gln (Q) | Asn | Asn |
| Glu (E) | Asp | Asp |
| Gly (G) | Pro; Ala | Ala |

TABLE A-continued

| Original residue | Representative replacement | Preferred replacements |
|---|---|---|
| His (H) | Asn; Gln; Lys; Arg | Arg |
| Ile (I) | Leu; Val; Met; Ala; Phe | Leu |
| Leu (L) | Ile; Val; Met; Ala; Phe | Ile |
| Lys (K) | Arg; Gln; Asn | Arg |
| Met (M) | Leu; Phe; Ile | Leu |
| Phe (F) | Leu; Val; Ile; Ala; Tyr | Leu |
| Pro (P) | Ala | Ala |
| Ser (S) | Thr | Thr |
| Thr (T) | Ser | Ser |
| Trp (W) | Tyr; Phe | Tyr |
| Tyr (Y) | Trp; Phe; Thr; Ser | Phe |
| Val (V) | Ile; Leu; Met; Phe; Ala | Leu |

Chimeric Antigen Receptor, Encoding Sequence and Vector

The present invention also provides Chimeric Antigen Receptor which targets ROR1, as well as the corresponding encoding sequence or polynucleotides and vectors.

The term "chimeric antigen receptor (CAR)" as used herein refers to molecules that combine a binding domain against a component present on the target cell, for example an antibody-based specificity for a desired antigen (e.g., tumor antigen) with a T cell receptor-activating intracelluar domain to generate a chimeric protein that exhibits a specific anti-target cellular immune activity.

The chimeric antigen receptor (CAR) of the present invention includes an extracellular domain, a transmembrane domain, and an intracellular domain. The extracellular domain includes a target-specific binding element (also known as an antigen-binding domain). The intracellular domain includes a costimulatory signaling region and a zeta (ζ) chain portion.

Generally, CAR consists of an extracellular single chain antibody fused to the intracellular signaling domain of the T cell antigen receptor complex zeta chain and has the ability, when expressed in T cells, to redirect antigen recognition based on the antibody's specificity.

Preferably, the CAR of the invention comprises a signal peptide, an extracellular antigen binding domain, comprising $V_H$ and $V_L$ from anti-ROR1 antibody, a hinge, a transmembrane domain, a co-stimulatory domain and an intracellular signaling domain.

The term "extracellular antigen binding domain" as used herein is defined as an oligo- or polypeptide that is capable of binding a ligand. Preferably, the domain will be capable of interacting with a cell surface molecule. For example, the extracellular antigen binding domain may be chosen to recognize a ligand that acts as a cell surface marker on target cells associated with a particular disease state. The extracellular antigen binding domain of the anti-ROR1 CARs can be any domain that binds to the off-tissue antigen including but not limited to a monoclonal antibody, a recombinant antibody, a human antibody, a humanized antibody, and a functional fragment thereof. In some embodiment, the extracellular antigen binding domain comprises a single chain antibody fragment (scFv) comprising the light ($V_L$) and the heavy ($V_H$) variable fragment of a target antigen specific anti-ROR1 antibody joined by a linker. Preferably, the single chain antibody or scFV is an amino acid chain sequence encoded by a nucleotide chain.

The $V_L$ and $V_H$ are preferably selected from the antibodies C3, G3 or G6 as indicated in Table 2.

With respect to the transmembrane domain, the CAR can be designed to comprise a transmembrane domain that is fused to the extracellular domain of the CAR. In one embodiment, the transmembrane domain that naturally is associated with one of the domains in the CAR is used. In some instances, the transmembrane domain can be selected or modified by amino acid substitution to avoid binding of such domains to the transmembrane domains of the same or different surface membrane proteins to minimize interactions with other members of the receptor complex.

The transmembrane domain may be derived either from a natural or from a synthetic source. Where the source is natural, the domain may be derived from any membrane-bound or transmembrane protein. Transmembrane regions of particular use in this invention may be derived from (i.e. comprise at least the transmembrane region(s) of) the alpha, beta or zeta chain of the T-cell receptor, CD28, CD3 epsilon, CD45, CD4, CD5, CD8, CD9, CD16, CD22, CD33, CD37, CD64, CD80, CD86, CD134, CD137, CD154. Alternatively the transmembrane domain may be synthetic, in which case it will comprise predominantly hydrophobic residues such as leucine and valine. Preferably a triplet of phenylalanine, tryptophan and valine will be found at each end of a synthetic transmembrane domain. Optionally, a short oligo- or polypeptide linker, preferably between 2 and 10 amino acids in length may form the linkage between the transmembrane domain and the cytoplasmic signaling domain of the CAR A glycine-serine doublet provides a particularly suitable linker.

Preferably, the transmembrane domain in the CAR of the invention is the CD8α transmembrane domain. In some instances, the transmembrane domain of the CAR of the invention comprises the CD8α hinge domain. In an embodiment, the CD8α transmembrane domain and CD8α hinge domain comprises the amino acid sequence of SEQ ID NO: 2.

The cytoplasmic domain or otherwise the intracellular signaling domain of the CAR of the invention is responsible for activation of at least one of the normal effector functions of the immune cell in which the CAR has been placed in. The term "effector function" refers to a specialized function of a cell. Effector function of a T cell, for example, may be cytolytic activity or helper activity including the secretion of cytokines. Thus the term "intracellular signaling domain" refers to the portion of a protein which transduces the effector function signal and directs the cell to perform a specialized function. While usually the entire intracellular signaling domain can be employed, in many cases it is not necessary to use the entire chain. To the extent that a truncated portion of the intracellular signaling domain is used, such truncated portion may be used in place of the intact chain as long as it transduces the effector function signal. The term intracellular signaling domain is thus meant to include any truncated portion of the intracellular signaling domain sufficient to transduce the effector function signal.

Preferred examples of intracellular signaling domains for use in the CAR of the invention include the cytoplasmic sequences of the T cell receptor (TCR) and co-receptors that act in concert to initiate signal transduction following antigen receptor engagement, as well as any derivative or variant of these sequences and any synthetic sequence that has the same functional capability.

It is known that signals generated through the TCR alone are insufficient for full activation of the T cell and that a secondary or co-stimulatory signal is also required. Thus, T cell activation can be said to be mediated by two distinct classes of cytoplasmic signaling sequence: those that initiate antigen-dependent primary activation through the TCR (primary cytoplasmic signaling sequences) and those that act in an antigen-independent manner to provide a secondary or co-stimulatory signal (secondary cytoplasmic signaling sequences).

Primary cytoplasmic signaling sequences regulate primary activation of the TCR complex either in a stimulatory way, or in an inhibitory way. Primary cytoplasmic signaling sequences that act in a stimulatory manner may contain signaling motifs which are known as immunoreceptor tyrosine-based activation motifs or ITAMs.

Examples of ITAM containing primary cytoplasmic signaling sequences that are of particular use in the invention include those derived from TCRζ, FcRγ, FcRβ, CD3γ, CD3δ, CD3ε, CD5, CD22, CD79a, CD79b, and CD66d. It is particularly preferred that cytoplasmic signaling molecule in the CAR of the invention comprises a cytoplasmic signaling sequence derived from CD3ζ.

In a preferred embodiment, the cytoplasmic domain of the CAR can be designed to comprise the CD3ζ signaling domain by itself or combined with any other desired cytoplasmic domain(s) useful in the context of the CAR of the invention. For example, the cytoplasmic domain of the CAR can comprise a CD3ζ chain portion and a costimulatory signaling region. The costimulatory signaling region refers to a portion of the CAR comprising the intracellular domain of a costimulatory molecule. A costimulatory molecule is a cell surface molecule other than an antigen receptor or their ligands that is required for an efficient response of lymphocytes to an antigen. Examples of such molecules include CD27, CD28, 4-1BB (CD137), OX40, CD30, CD40, PD-1, ICOS, lymphocyte function-associated antigen-1 (LFA-1), CD2, CD7, LIGHT, NKG2C, B7-H3, and a ligand that specifically binds with CD83, and the like. Thus, while the invention in exemplified primarily with 4-1BB as the co-stimulatory signaling element, other costimulatory elements are within the scope of the invention.

More specifically, the ROR1 specific CARs of the invention comprising a CD8α signal peptide, an extracellular ROR1 binding domain, a CD8α hinge, a CD8α transmembrane domain, an intracellular CD3 signaling domain and a co-stimulatory domain from 4-1 BB.

In one embodiment, the cytoplasmic domain in the CAR of the invention is designed to comprise the co-stimulatory domain of 4-1BB and the signaling domain of CD3ζ.

CAR Immune Cell

The invention also provides a modified immune cell (e.g., T cell) engineered to express a CAR wherein the CAR immune cell (e.g., CAR-T cell or CAR-NK cell) exhibits an antitumor property.

As used herein, the term "immune cell" or "immune effector cell" refers to a cell that is involved in an immune response, e.g., in the promotion of an immune effector response. Examples of immune cells include T cells, B cells, natural killer (NK) cells, mast cells, and myeloid-derived phagocytes. According to particular embodiments, the engineered immune cells are T cells, and are referred to as CAR-T cells because they are engineered to express CARs of the invention.

The term "modified immune cells" as used herein refers to cells comprise exogenous polynucleotide sequence encoding CAR and expresses at least one CAR as described above. According to embodiments herein, the engineered immune cells have been genetically modified to express a CAR construct according to the invention.

The immune cell can be a dendritic cell, killer dendritic cell, a mast cell, a NK cell, a B cell or a T cell selected from the group consisting of inflammatory T lymphocytes, cytotoxic T lymphocytes, regulatory T lymphocytes or helper T lymphocytes. The cell can be derived from the group consisting of CD4$^+$ T lymphocytes and CD8$^+$ T lymphocytes.

Immune cells and precursor cells thereof can be isolated by methods known in the art, including commercially available methods (see, e.g., Rowland Jones et al., Lymphocytes: A Practical Approach, Oxford University Press, NY 1999). Sources for immune cells or precursors thereof include, but are not limited to, peripheral blood, umbilical cord blood, bone marrow, or other sources of hematopoietic cells. Various techniques can be employed to separate the cells to isolated or enrich desired immune cells. For instance, negative selection methods can be used to remove cells that are not the desired immune cells. Additionally, positive selection methods can be used to isolate or enrich for the desired immune cells or precursors thereof, or a combination of positive and negative selection methods can be employed. If a particular type of cell is to be isolated, e.g., a particular T cell, various cell surface markers or combinations of markers (e.g., CD3, CD4, CD8, CD34) can be used to separate the cells.

The immune cells or precursor cells thereof can be autologous or nonautologous to the subject to which they are administered in the methods of treatment of the invention. Autologous cells are isolated from the subject to which the engineered immune cells recombinantly expressing the CAR are to be administered. Optionally, the cells can be obtained by leukapheresis, where leukocytes are selectively removed from withdrawn blood, made recombinant, and then retransfused into the donor. Alternatively, allogeneic cells from a non-autologous donor that is not the subject can be used. In the case of a non-autologous donor, the cells are typed and matched for human leukocyte antigen (HLA) to determine the appropriate level of compatibility. For both autologous and non-autologous cells, the cells can optionally be cryopreserved until ready for use.

In the present invention, cells can preferably be obtained from a number of non-limiting sources, including peripheral blood mononuclear cells, bone marrow, lymph node tissue, cord blood, thymus tissue, tissue from a site of infection, ascites, pleural effusion, spleen tissue, and tumors. Cells can also derive from T cell lines available and known to those skilled in the art, or from a healthy donor, from a patient diagnosed with cancer.

According to particular embodiments, the method of making the engineered immune cells comprises transfecting or transducing immune effector cells isolated from an individual such that the immune effector cells express one or more CAR(s) according to embodiments of the invention. Methods of preparing immune cells for immunotherapy are described, e.g., in WO2014/130635, which is incorporated herein by reference. Individual steps that can be used for preparing engineered immune cells are disclosed, e.g., in WO2014/039523, WO2014/184741, which are incorporated herein by reference.

In a particular embodiment, the immune effector cells, such as T cells, are genetically modified with CARs of the invention (e.g., transduced with a viral vector comprising a nucleic acid encoding a CAR) and then are activated and expanded in vitro. In various embodiments, T cells can be activated and expanded before or after genetic modification to express a CAR, using methods as described, for example, in U.S. Pat. No. 6,352,694, U57144575, and U.S. Pat. No. 7,067,318, which are incorporated herein by reference. T cells can be expanded in vitro or in viw). Generally, the T cells of the invention can be expanded by contact with a surface having attached thereto an agent that stimulates a CD3/TCR complex-associated signal and a ligand that stimulates a co-stimulatory molecule on the surface of the T cells. As non-limiting examples, T cell populations can be stimulated as described herein, such as by contact with an anti-CD3 antibody, or antigen-binding fragment thereof, or an anti-CD3 antibody immobilized on a surface, or by contact with a protein kinase C activator (e.g., bryostatin) in conjunction with a calcium ionophore, or by activation of the CAR itself. For co-stimulation of an accessory molecule on the surface of the T cells, a ligand that binds the accessory molecule is used. For example, a population of T cells can be contacted with an anti-CD3 antibody and an anti-CD28 antibody, under conditions appropriate for stimulating proliferation of the T cells. Conditions appropriate for T cell culture include, e.g., an appropriate media (e.g., Minimal Essential Media or RPMI Media 1640 or, X-vivo 5 (Lonza)) that can contain factors necessary for proliferation and viability, including serum (e.g., fetal bovine or human serum), cytokines, such as IL-2, IL-7, IL-15, and/or IL-21, insulin, IFN-g, GM-CSF, TGF(3 and/or any other additives for the growth of cells known to the skilled artisan. In other embodiments, the T cells can be activated and stimulated to proliferate with feeder cells and appropriate antibodies and cytokines using methods such as those described in U.S. Pat. Nos. 6,040,177, 5,827,642, and WO2012129514, which are incorporated herein by reference.

When the CAR of the invention expressed in a T cell, the CAR is able to redirect antigen recognition based on the antigen binding specificity. When the CAR-T cell of the invention binds to its cognate antigen, it affects a tumor cell so that the tumor cell fails to grow, is prompted to die, or otherwise is affected so that the tumor burden in a patient is diminished or eliminated.

Pharmaceutical Compositions

The invention also provides a pharmaceutical composition comprising an isolated polynucleotide of the invention, an isolated polypeptide of the invention, a host cell of the invention, and/or an engineered immune cell of the invention and a pharmaceutically acceptable carrier. The term "pharmaceutical composition" as used herein means a product comprising an isolated polynucleotide of the invention, an isolated polypeptide of the invention, a host cell of the invention, and/or an engineered immune cell of the invention together with a pharmaceutically acceptable carrier. Polynucleotides, polypeptides, host cells, and/or engineered immune cells of the invention and compositions comprising them are also useful in the manufacture of a medicament for therapeutic applications mentioned herein.

As used herein, the term "carrier" refers to any excipient, diluent, filler, salt, buffer, stabilizer, solubilizer, oil, lipid, lipid containing vesicle, microsphere, liposomal encapsulation, or other material well known in the art for use in pharmaceutical formulations. It will be understood that the characteristics of the carrier, excipient or diluent will depend on the route of administration for a particular application. As used herein, the term "pharmaceutically acceptable carrier" refers to a non-toxic material that does not interfere with the effectiveness of a composition according to the invention or the biological activity of a composition according to the invention. According to particular embodiments, in view of the present disclosure, any pharmaceutically acceptable carrier suitable for use in a polynucleotide, polypeptide, host cell, and/or engineered immune cell pharmaceutical composition can be used in the invention.

The formulation of pharmaceutically active ingredients with pharmaceutically acceptable carriers is known in the art, e.g., Remington: The Science and Practice of Pharmacy (e.g. 21st edition 2005, and any later editions). Non-limiting examples of additional ingredients include: buffers, diluents, solvents, tonicity regulating agents, preservatives, stabilizers, and chelating agents. One or more pharmaceutically acceptable carriers may be used in formulating the pharmaceutical compositions of the invention.

Preferably, the composition of the invention is liquid preparation, such as aqueous formulation, or an injection.

A pharmaceutical composition of the invention is formulated to be compatible with its intended route of administration. Methods to accomplish the administration are known in the art. The administration may be, for example, intravenous, intraperitoneal, intramuscular, subcutaneous, intradermal, transmucosal or intratumoral.

Pharmaceutical compositions suitable for injection include sterile aqueous solutions or dispersions and sterile powders for the extemporaneous preparation of sterile injectable solutions or dispersion. Sterilization can be accomplished, for example, by filtration through sterile filtration membranes. For intravenous administration, suitable carriers include, for example, physiological saline, bacteriostatic water, Cremophor EL (BASF, Parsippany, N.J.) or phosphate buffered saline (PBS). In many cases, it will be preferable to include isotonic agents, for example, sugars, polyalcohols such as mannitol, sorbitol, and sodium chloride in the composition.

Therapeutic Application

The CAR, expression vector and modified immune cells can be used to treat patients with a pre-malignant or malignant cancer condition characterized by ROR1-expressing cells, especially by an overabundance of ROR1-expressing cells. Such conditions are found in hematological malignancy, such as leukemia.

Leukemia can be acute myelogenous leukemia, chronic myelogenous leukemia, myelodysplastic syndrome, acute lymphoid leukemia, chronic lymphoid leukemia, and myelodysplastic syndrome.

According to one preferred embodiment, said modified immune cells are provided for the treatment of the Chronic Lymphocytic Leukemia (CLL) or the Acute Lymphocytic Leukemia (ALL).

Types of cancers to be treated with the CARs of the invention include, but are not limited to non-solid tumors (such as hematological malignancy). Adult tumors/cancers and pediatric tumors/cancers are also included.

Also, solid tumors such as breast, colon, liver, lung, kidney, pancreas, prostate tumors, renal, and ovarian can be treated by the CARs of the invention.

The main advantages of the present invention include:
(a) The antibody of the present invention has an excellent bioactivity and specificity, it has a good binding affinity for cell surface ROR1, and may be used as an ROR1-targeting antibody and scFV element of ROR1-targeting CAR;
(b) The fully human antibody and scFV of the present invention not only has an activity comparable to that of immune antibodies, but also has a lower immunogenicity;
(c) Both the antibody and ROR1-targeting CAR according to the present invention have a significant anti-tumor activity, and have no obvious toxic side-effects on mammals themselves; and
(d) The antibody and ROR1-targeting CAR according to the present invention not only have significant therapeutic effects in tumor models, but also are applicable to other high ROR1 expression-associated diseases.

The present invention is further described by reference to the following particular examples. It should be understood that the following examples are only used to describe the present invention, rather than limiting the scope of the present invention. The experimental methods in the following examples, the specific conditions of which are not indicated, are usually carried out according to conventional conditions, for example, the conditions described in Sambrook et al., Molecular Cloning: Laboratory Manual (New York: Cold Spring Harbor Laboratory Press, 1989), or the conditions recommended by the manufacturers. Unless otherwise specified, percentages and parts refer to percentages by weight and parts by weight. Cell lines are the conventional products that are commercially available or are purchased from ATCC, and all the plasmids are the products that are commercially available.

Cell Lines

The all cell lines were obtained from American Type Culture Collection (ATCC). The MDA-MB-231, NCL-H358, NCL-H1975, HT-29, SK-OV-3, U87MG, SK-OV-3 and U87MG overexpressing ROR1, jeko-1 were cultured in RPMI1640 with 10% FBS, and 293T, PAN02, PANC-1, A549 were cultured in DMEM1640 with 10% FBS in incubator at 37° C., 5% $CO_2$.

Example 1. Isolation of Anti-ROR1-Specific Binder from a Fully Human Phage Antibody Library Synthetic of human anti-ROR1 antibodies using phage display antibodies that were generated through the use of a proprietary enhanced human naïve phage library (ProMab Biotechnologies, Inc.).

The anti-ROR1 antibodies of clones C3, G33 and G36 were three high affinity antibodies whose amino acid sequences of $V_H$ and $V_L$ were shown in Table 1.

TABLE 1

The amino acid sequence of the anti-ROR1 antibodies of clones C3, G3 and G6.

| Name or region | | Sequence | SEQ ID No./ Position |
|---|---|---|---|
| | | C3 | |
| C3-$V_h$ | | QVQLQESGPGLVKPSETLSLTCTVSGGSIS<u>SYYWS</u>WIRQLPGKG LEWIG<u>YMHYSGSTSYNPSLKG</u>RLTISVDTST<u>TNQFS</u>LKLGSVTAA DTAVYYCAR<u>YYYHDSSGYYSYFDY</u>WGQGTLVTVSS | SEQ ID No: 1 |
| | Kobat | CDR1: SYYWS | SEQ ID No: 2 |
| | | CDR2: YMHYSGSTSYNPSLKG | SEQ ID No: 3 |
| | | CDR3: YYYHDSSGYYSYFDY | SEQ ID No: 4 |
| | | FR1: QVQLQESGPGLVKPSETLSLTCTVSGGSIS | Position 1-30 of SEQ ID No: 1 |
| | | FR2: WIRQLPGKGLEWIG | Position 36-49 of SEQ ID No: 1 |
| | | FR3: RLTISVDTSTNQFSLKLGSVTAADTAVYYCAR | Position 66-97 of SEQ ID No: 1 |
| | | FR4: WGQGTLVTVSS | Position 112-123 of SEQ ID No: 1 |
| | IMGT | CDR1: GGSISSYY | SEQ ID No: 9 |
| | | CDR2: MHYSGST | SEQ ID No: 10 |
| | | CDR3: ARYYYHDSSGYYSYFDY | SEQ ID No: 11 |
| | | FR1: QVQLQESGPGLVKPSETLSLTCTVS | Position 1-25 of SEQ ID No: 1 |
| | | FR2: WSWIRQLPGKGLEWIGY | Position 34-50 of SEQ ID No: 1 |
| | | FR3: SYNPSLKGRLTISVDTSTNQFSLKLGSVTAADTAVYYC | Position 58-95 of SEQ ID No: 1 |
| | | FR4: WGQGTLVTVSS | Position 113-123 of SEQ ID No: 1 |
| C3-$V_L$ | | EIVLTQSPGTLSLSPGERATLSC<u>RASQSVSSYLA</u>WYQQKAGQA PRLLIY<u>DASNRAS</u>GIPARFSGSGSGTDFTLTISSLEPEDFAVYYC <u>QQRSNWPPT</u>FGGGTKVEIK | SEQ ID No: 5 |
| | Kobat: | CDR1: RASQSVSSYLA | SEQ ID No: 6 |
| | | CDR2: DASNRAS | SEQ ID No: 7 |
| | | CDR3: QQRSNWPPT | SEQ ID No: 8 |
| | | FR1: EIVLTQSPGTLSLSPGERATLSC | Position 1-23 of SEQ ID No: 5 |
| | | FR2: WYQQKAGQAPRLLIY | Position 35-49 of SEQ ID No: 5 |
| | | FR3: GIPARFSGSGSGTDFTLTISSLEPEDFAVYYC | Position 57-88 of SEQ ID No: 5 |
| | | FR4: FGGGTKVEIK | Position 98-107 of SEQ ID No: 5 |
| | IMGT: | CDR1: QSVSSY | SEQ ID No: 12 |
| | | CDR2: DA | Position 1-2 of SEQ ID No: 13; or Position 50-51 of SEQ ID No: 5 |

TABLE 1-continued

The amino acid sequence of the anti-ROR1 antibodies of clones C3, G3 and G6.

| Name or region | Sequence | SEQ ID No./ Position |
|---|---|---|
| | CDR3: QQRSNWPPT | SEQ ID No: 14 |
| | FR1: EIVLTQSPGTLSLSPGERATLSCRAS | Position 1-26 of SEQ ID No: 5 |
| | FR2: LAWYQQKAGQAPRLLIY | Position 33-49 of SEQ ID No: 5 |
| | FR3: SNRASGIPARFSGSGSGTDFTLTISSLEPEDFAVYYC | Position 52-88 of SEQ ID No: 5 |
| | FR4: FGGGTKVEIK | Position 98-107 of SEQ ID No: 5 |
| | G3 | |
| G3-V$_H$ | QVQLQQWGAGLLKPSETLSLTCAVYGGSFSGYYWSWIRQPPG KGLEWIGEINHSGSTSYNPSLKSRVTISVDTSKNQFSLKLSSVTA ADTAVYYCARGHSSGWYRRYFDLWGRGTLVTVSS | SEQ ID No: 15 |
| Kabat | CDR1: GYYWS | SEQ ID No: 16 |
| | CDR2: EINHSGSTSYNPSLKS | SEQ ID No: 17 |
| | CDR3: GHSSGWYRRYFDL | SEQ ID No: 18 |
| | FR1: QVQLQQWGAGLLKPSETLSLTCAVYGGSFS | Position 1-30 of SEQ ID No: 15 |
| | FR2: WIRQPPGKGIEWIG | Position 36-49 of SEQ ID No: 15 |
| | FR3: RVTISVDTSKNQFSLKLSSVTAADTAVYYCAR | Position 66-97 of SEQ ID No: 15 |
| | FR4: WGRGTLVTVSS | Position 111-121 of SEQ ID No: 15 |
| IMGT | CDR1: GGSFSGYY | SEQ ID No: 23 |
| | CDR2: INHSGST | SEQ ID No: 24 |
| | CDR3: ARGHSSGWYRRYFDL | SEQ ID No: 25 |
| | FR1: QVQLQQWGAGLLKPSETLSLTCAVY | Position 1-25 of SEQ ID No: 15 |
| | FR2: WSWIRQPPGKGLEWIGE | Position 34-50 of SEQ ID No: 15 |
| | FR3: SYNPSLKSRVTISVDTSKNQFSLKLSSVTAADTAVYYC | Position 58-95 of SEQ ID No: 15 |
| | FR4: WGRGTLVTVSS | Position 111-121 of SEQ ID No: 15 |
| G3-V$_L$ | EIVLTQSPATLSLSPGERATLSCRASQSVSSYLAWYQQKPGQAP RLLIYDASNRATGIPAKFSGSGSGTDFTLTISSLEPEDFAVYYCQ QRSNWPPTFGGGTKVEIK | SEQ ID No: 19 |
| Kabat | CDR1: RASQSVSSYLA | SEQ ID No: 20 |
| | CDR2: DASNRAT | SEQ ID No: 21 |
| | CDR3: QQRSNWPPT | SEQ ID No: 22 |
| | FR1: EIVLTQSPATLSLSPGERATLSC | Position 1-23 of SEQ ID No: 19 |
| | FR2: WYQQKPGQAPRLLIY | Position 35-49 of SEQ ID No: 19 |
| | FR3: GIPAKFSGSGSGTDFTLTISSLEPEDFAVYYC | Position 57-88 of SEQ ID No: 19 |
| | FR4: FGGGTKVEIK | Position 98-107 of SEQ ID No: 19 |
| IMGT | CDR1: QSVSSY | SEQ ID No: 26 |
| | CDR2: DA | Position 1-2 of SEQ ID No: 27; or Posidon 50-51 of SEQ ID No: 19 |
| | CDR3: QQRSNWPPT | SEQ ID No: 28 |
| | FR1: EIVLTQSPATLSLSPGERATLSCRAS | Position 1-26 of SEQ ID No: 19 |
| | FR2: LAWYQQKPGQAPRLLIY | Position 33-49 of SEQ ID No: 19 |
| | FR3: SNRATGIPAKFSGSGSGTDFTLTISSLEPEDFAVYYC | Position 52-88 of SEQ ID No: 19 |
| | FR4: FGGGTKVEIK | Position 98-107 of SEQ ID No: 19 |

TABLE 1-continued

The amino acid sequence of the anti-ROR1 antibodies of clones C3, G3 and G6.

| Name or region | Sequence | SEQ ID No./ Position |
|---|---|---|
| | G6 | |
| G6-V$_H$ | EVQLVESGGGVVQPGGSLRLSCAASGFTFDDYAMHWVRQAP GKGLEWVSLISGDGGSTYYADSVKGRFTISRDNAKNSLYLQM NSLRAEDTAVYYCARDNWNDVYYYGMDVWGQGTTVTVSS | SEQ ID No: 29 |
| Kobat | CDR1: DYAMH | SEQ ID No: 30 |
| | CDR2: LISGDGGSTYYADSVKG | SEQ ID No: 31 |
| | CDR3: DNWNDVYYYGMDV | SEQ ID No: 32 |
| | FR1: EVQLVESGGGVVQPGGSLRLSCAASGFTFD | Position 1-30 of SEQ ID No: 29 |
| | FR2: WVRQAPGKGLEWVS | Position 36-49 of SEQ ID No: 29 |
| | FR3: RFTISRDNAKNSLYLQMNSLRAEDTAVYYCAR | Position 67-98 of SEQ ID No: 29 |
| | FR4: WGQGTTVTVSS | Position 113-123 of SEQ ID No: 29 |
| IMGT: | CDR1: GFTFDDYA | SEQ ID No: 37 |
| | CDR2: ISGDGGST | SEQ ID No: 38 |
| | CDR3: ARDNWNDVYYYGMDV | SEQ ID No: 39 |
| | FR1: EVQLVESGGGVVQPGGSLRLSCAAS | Position 1-25 of SEQ ID No: 29 |
| | FR2: MHWVRQAPGKGLEWVSL | Position 34-50 of SEQ ID No: 29 |
| | FR3: YYADSVKGRFTISRDNAKNSLYLQMNSLRAEDTAVYYC | Position 59-96 of SEQ ID No: 29 |
| | FR4: WGQGTTVTVSS | Position 113-123 of SEQ ID No: 29 |
| G6-V$_L$ | DIQLTQSPSSLSASIGDTVTISCQASRDISDYLNWYQHKPGKAP KLLIYDASNLATGVPSRFSGSGSGTDFTLTIKSLQPEDVATYFC QQDDLLPLTFGGGTKVDIK | SEQ ID No: 33 |
| Kobat | CDR1: QASRDISDYLN | SEQ ID No: 34 |
| | CDR2: DASNLAT | SEQ ID No: 35 |
| | CDR3: QQDDLLPLT | SEQ ID No: 36 |
| | FR1: DIQLTQSPSSLSASIGDTVTISC | Position 1-23 of SEQ ID No: 33 |
| | FR2: WYQHKPGKAPKLLIY | Position 35-49 of SEQ ID No: 33 |
| | FR3: GVPSRFSGSGSGTDFTLTIKSLQPEDVATYFC | Position 57-88 of SEQ ID No: 33 |
| | FR4: FGGGTKVDIK | Position 98-107 of SEQ ID No: 33 |
| IMGT | CDR1: RDISDY | SEQ ID No: 40 |
| | CDR2: DA | Position 1-2 of SEQ ID No: 41; or Position 50-51 of SEQ ID No: 33 |
| | CDR3: QQDDLLPLT | SEQ ID No: 42 |
| | FR1: DIQLTQSPSSLSASIGDTVTISCQAS | Position 1-26 of SEQ ID No: 33 |
| | FR2: LNWYQHKPGKAPKLLIY | Position 33-49 of SEQ ID No: 33 |
| | FR3: SNLATGVPSRFSGSGSGTDFTLTIKSLQPEDVATYFC | Position 52-88 of SEQ ID No: 33 |
| | FR4: FGGGTKVDIK | Position 98-107 of SEQ ID No: 33 |

TABLE 2

Sequence ID of $V_H$, $V_L$ and CDRs of antibodies

| method | Region or CDR | Antibody C3 | G3 | G6 |
|---|---|---|---|---|
| Kobat | $V_H$ | SEQ ID No: 1 | SEQ ID No: 15 | SEQ ID No: 29 |
| | $V_H$-CDR1 | SEQ ID No: 2 | SEQ ID No: 16 | SEQ ID No: 30 |
| | $V_H$-CDR2 | SEQ ID No: 3 | SEQ ID No: 17 | SEQ ID No: 31 |
| | $V_H$-CDR3 | SEQ ID No: 4 | SEQ ID No: 18 | SEQ ID No: 32 |
| IMGT | $V_H$-CDR1 | SEQ ID No: 9 | SEQ ID No: 23 | SEQ ID No: 37 |
| | $V_H$-CDR2 | SEQ ID No: 10 | SEQ ID No: 24 | SEQ ID No: 38 |
| | $V_H$-CDR3 | SEQ ID No: 11 | SEQ ID No: 25 | SEQ ID No: 39 |
| Kobat | $V_L$ | SEQ ID No: 5 | SEQ ID No: 19 | SEQ ID No: 33 |
| | $V_L$-CDR1 | SEQ ID No: 6 | SEQ ID No: 20 | SEQ ID No: 34 |
| | $V_L$-CDR2 | SEQ ID No: 7 | SEQ ID No: 21 | SEQ ID No: 35 |
| | $V_L$-CDR3 | SEQ ID No: 8 | SEQ ID No: 22 | SEQ ID No: 36 |
| IMGT | $V_L$-CDR1 | SEQ ID No: 12 | SEQ ID No: 26 | SEQ ID No: 40 |
| | $V_L$-CDR2 | Position 1-2 of SEQ ID No: 13 | Position 1-2 of SEQ ID No: 27 | Position 1-2 of SEQ ID No: 41 |
| | $V_L$-CDR3 | SEQ ID No: 14 | SEQ ID No: 28 | SEQ ID No: 42 |

The affinity of these three clones for human ROR1 is showed as follows.

| Clone | $K_D$ (M) | Cross activity with mouse ROR1 |
|---|---|---|
| C3 | $3.25 \times 10^{-9}$ | +++ |
| G3 | $4.48 \times 10^{-9}$ | +++ |
| G6 | $4.37 \times 10^{-8}$ | +++ |

Epitope mapping of the interaction between anti-ROR1 antibodies and ROR1 showed that C3 and G3 bind to the Kringle domain of ROR1 and G6 binds to the Ig-like domain of ROR1.

Example 2. Construction of the Anti-ROR1-CAR Expression Vector

The CAR according to the present invention containing whole human anti-ROR1 scFv antibodies were designed to contain an EF1α promoter operably linked to anti-ROR1 scFv, a hinge and transmembrane domain from CD8α and 4-1BB co-stimulatory domain followed by the intracellular signaling domain of the CD3ζ chain. The anti-ROR1 CARs comprised a CD8α signal peptide sequence for the surface expression on immune effector cells. The amino acid sequences of CAR components other than scFv were shown in Table 3. The construction of anti-ROR1 chimeric antigen receptor were showed in FIG. 1B.

TABLE 3

Sequence of CAR components other than scFv.

| Functional domains | SEQ ID NO: | amino acid sequence |
|---|---|---|
| CD8α signal peptide | 43 | MYRMQLLSCIALSLALVTNS |
| CD8α hinge and transmembrane domain | 44 | TTTPAPRPPTPAPTIASQPLSLRPEACRPAAG GAVHTRGLDFACDIYIWAPLAGTCGVLLLS LVITLYC |
| 4-1BB co-stimulatory domain | 45 | KRGRKKLLYIFKQPFMRPVQTTQEEDGCSC RFPEEEEGGCEL |
| CD3ζ intracellular signaling domain | 46 | RVKFSRSADAPAYKQGQNQLYNELNLGRR EEYDVLDKRRGRDPEMGGKPRRKNPQEGL YNELQKDKMAEAYSEIGMKGERRRGKGHD GLYQGLSTATKDTYDALHMQALPPR |
| Linker | 47 | GGGGSGGGGSGGGGS |

The amino acid sequence of scFV encoded by three anti-ROR1 CAR constructs were as follows:

| scFV name | Amino acid sequence | SEQ ID NO: |
|---|---|---|
| C3-scFV | QVQLQESGPGLVKPSETLSLTCTVSGGSISSYYWSWIRQLPG KGLEWIGYMHYSGSTSYNPSLKGRLTISVDTSTNQFSLKLG SVTAADTAVYYCARYYYHDSSGYYSYFDYWGQGTLVTVS SGGGGSGGGGSGGGGSEIVLTQSPGTLSLSPGERATLSCRAS QSVSSYLAWYQQKAGQAPRLLIYDASNRASGIPARFSGSGS GTDFTLTISSLEPEDFAVYYCQQRSNWPPTFGGGTKVEIK | 48 |
| G3-scFV | QVQLQQWGAGLLKPSETLSLTCAVYGGSFSGYYWSWIRQP PGKGLEWIGEINHSGSTSYNPSLKSRVTISVDTSKNQFSLKLS SVTAADTAVYYCARGHSSGWYRRYFDLWGRGTLVTVSSG GGGSGGGGSGGGGSEIVLTQSPATLSLSPGERATLSCRASQS VSSYLAWYQQKPGQAPRLLIYDASNRATGIPAKFSGSGSGT DFTLTISSLEPEDFAVYYCQQRSNWPPTFGGGTKVEIK | 49 |

-continued

| scFV name | Amino acid sequence | SEQ ID NO: |
|---|---|---|
| G6-scFV | EVQLVESGGGVVQPGGSLRLSCAASGFTFDDYAMHWVRQ APGKGLEWVSLISGDGGSTYYADSVKGRFTISRDNAKNSLY LQMNSLRAEDTAVYYCARDNWNDVYYYYGMDVWGQGT TVTVSSGGGGSGGGGSGGGGSDIQLTQSPSSLSASIGDTVTI SCQASRDISDYLNWYQHKPGKAPKLLIYDASNLATGVPSRF SGSGSGTDFTLTIKSLQPEDVATYFCQQDDLLPLTFGGGTKV DTK | 50 |

The anti-ROR1-CAR lentiviral vector was constructed by using standard laboratory protocols. Briefly, the linearized plasmid of GV401 was obtained by digestion with a restriction endonuclease of BamH1 (NEB, Cat: R0136L). The anti-ROR1-scFv sequences was synthesized by GENEWIZ Inc, and the anti-ROR1-CAR gene fragments was acquired by PCR amplification with amplification primers.

The primers were designed by inserting homologous recombination sequences at 5-end for constructing anti-ROR1-CAR lentiviral vector plasmid by overlapping PCR amplification. The structure of anti-ROR1-CAR lentiviral vector show in FIG. 1A. The recombinant plasmid was transformed into E. coli. directly and then the clones were picked for PCR sequencing identification. The correctly sequenced clones were cultured and extracted for packaging lentivirus.

Example 3. Preparation of the Lentivirus Harboring Anti-ROR1-CAR Vector

The anti-ROR1-CAR lentivirus was produced using standard laboratory protocols. Briefly, $2 \times 10^6$ HEK293T cells were plated in 10 cm dishes on day 1 followed by transfection with lipofectamine3000 reagent (Invitrogen, Cat: L3000015) combined with transfection vector, packaging vector anti-ROR1-CAR-GV401, pHelper1.0 vector containing gag, pol, rev gene and pHelper1.0 vector containing VSVG pseudo-typed envelope gene on day 2. The medium was replaced on day 3. Supernatant was harvested on day 5 and centrifuged at 4000 g for 10 minutes to remove contaminating cellular material and filtered through 0.45 micron filters. Next, the supernatant containing lentivirus was centrifuged at 4 C, 25000 rpm for 2 hours. Then, supernatant was discarded, the virus preservation solution was added and stored at −80° C. for subsequent use.

Example 4. PBMC Isolation from Peripheral Blood and Phenotypic Test

Figure 2:
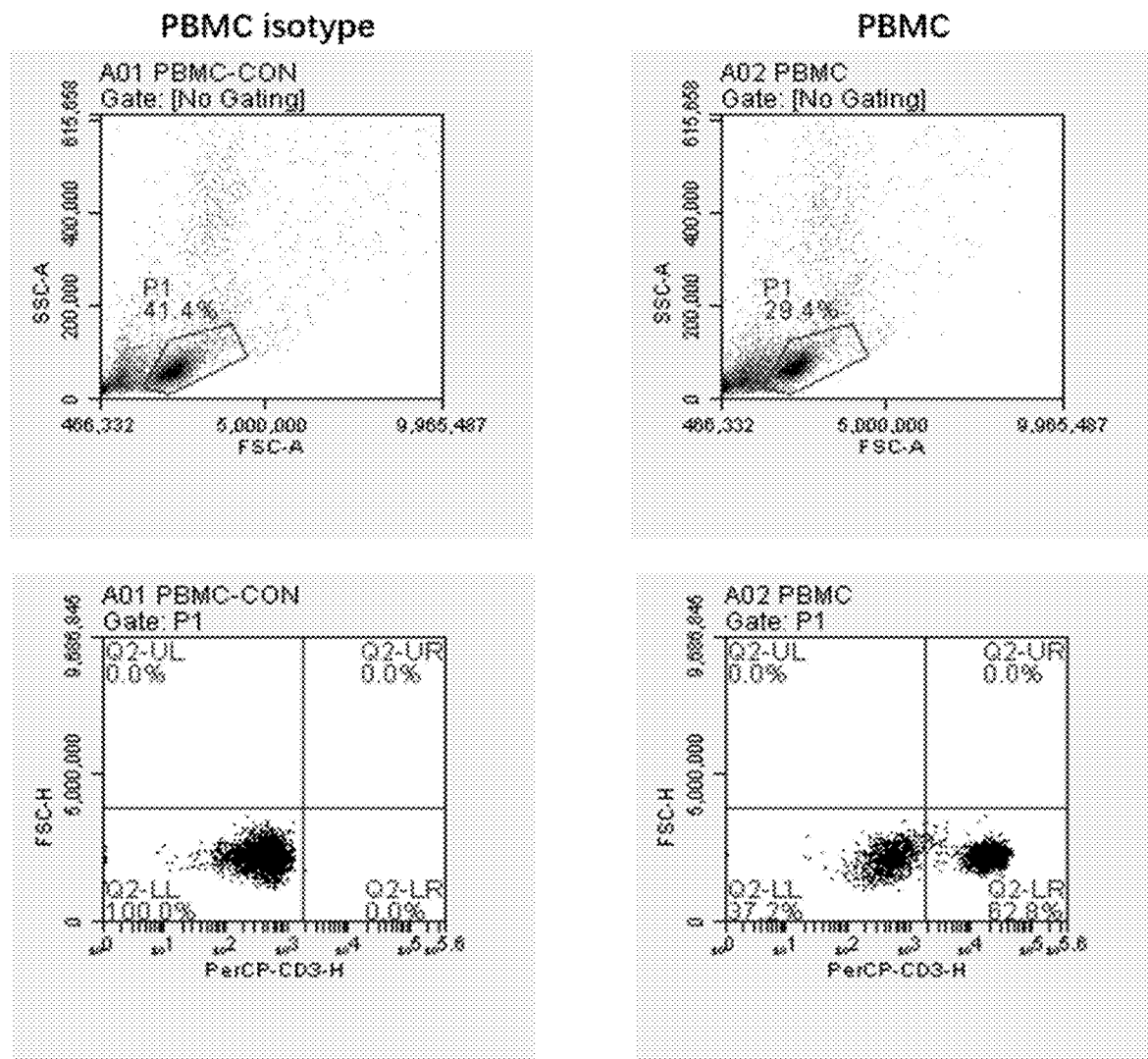
FIG. 2 shows the result of phenotypic test of PBMC from human peripheral blood.

Peripheral blood mononuclear cells (PBMC) were isolated from fresh peripheral blood from healthy volunteer. First, 10-20 mL fresh peripheral blood was taken from healthy volunteer by using vacuum blood collector with anticoagulant and then the fresh blood was transferred into a 50 mL centrifuge tube and centrifuged at 2000 rpm for 10 minutes at room temperature. After discarding the upper plasma, the cells were diluted with saline at 1:1 and gently pipetted up and down for 3-5 times. Then, 15 mL Ficoll-Hypaque of lymphocyte separation liquid (GE, Cat: 17-1440-02) was added into a 50 mL centrifuge tube and the diluted peripheral blood was added slowly. The samples were centrifuged at 2000 rpm for 30 minutes at room temperature. Finally, the supernatant was carefully transferred into a new 50 mL centrifuge tube and lymphocytes were washed with saline three times. The proportion of $CD3^+$ (BD, Cat: 552852), $CD4^+$ (BD, Cat: 555347) and CD8 (BD, Cat: 555369) cell subsets were detected by using flow cytometry. The results are show in FIG. 2.

Example 5. PBMC Infection with Anti-ROR1-CAR Lentivirus

The PBMC were re-suspended at $1.5 \times 10^6$/mL and seeded at 2 mL per 6 well plate and activated with 1 mg/mL CD3 (Miltenyi, Cat: 170-076-116) and 0.5 mg/mL CD28 (Miltenyi, Cat: 170-076-116) soluble antibodies and 15 μg/mL Retronectin (Takara, Cat: T100A). The anti-ROR1-CAR lentivirus at an MOI of 3 was added into each well on the next day. Two days later, cells were harvested and re-suspended at $1.5 \times 10^6$/mL and left to expend for a further four days before being used for FACS and co-culture experiment.

Example 6. Evaluation of the Anti-ROR1-CAR-T Cells Efficiency and Phenotype by FACS Method 1

A lentivirus vector co-expressing anti-ROR1-CAR and Green fluorescent protein separated by the 2A self-shearing peptide was constructed to examine the expression efficacy of anti-ROR1-CAR. The expression efficacy of anti-ROR1-CAR was examined by detecting Green fluorescent protein via Facial Action Coding System (FACS). The detection of infection efficiency and phenotypic test were as follow: First, $1 \times 10^6$ cells were taken out, infected with the lentivirus, and washed twice with wash buffer. Then, 15 μL APC anti-human CD8 (BD, Cat: 555369), 15 μL PE anti-human CD4 (BD, Cat: 555347), 15 μL PerCY5.5 anti-human CD3 (BD, Cat: 552852) were added and incubated at 4° C. in dark for 30 minutes. Second, the samples were centrifuged at 1000 rpm for 5 minutes at room temperature, and then the supernatant was removed. Third, the FACS buffer was added to wash twice and followed by centrifuging at 1000 rpm for 5 minutes at room temperature. Finally, the cells were suspended with 150 μL FACS buffer and the fluorescence was detected by FACS.

Method 2

A lentivirus vector co-expressing anti-ROR1-CAR and Green fluorescent protein separated by the 2A self-shearing peptide was constructed to examine the expression efficacy of anti-ROR1-CAR The expression efficacy of anti-ROR1-CAR was examined by detecting Green fluorescent protein via Facial Action Coding System (FACS). The detection of infection efficiency and phenotypic test were as follow: First, $1 \times 10^6$ cells were taken out, infected with the lentivirus, and washed twice with wash buffer. Then, 15 μL APC anti-human CD8 (BD, Cat: 555369), 15 μL PE anti-human CD4 (BD, Cat: 555347), 15 μL PerCY5.5 anti-human CD3 (BD, Cat: 552852); 5 μL Brilliant Violiant 510™ anti-human CD45RO (Biolegend, Cat: 304246); 5 μL Brilliant Violiant 421™ anti-human CD197 (CCR7) (Biolegend, Cat: 353208) were added and incubated at 4° C. in dark for 30 minutes. Second, the samples were centrifuged at 1000 rpm for 5 minutes at room temperature, and then the supernatant was removed. Third, the FACS buffer was added to wash twice and followed by centrifuging at 1000 rpm for 5 minutes at room temperature. Finally, the cells were suspended with 150 µL FACS buffer and the fluorescence was detected by FACS.

Various modifications to the embodiments will be readily apparent to those skilled in the art. The method defined in Method 1 and Method 2 are universal, and may be applied to analyze of other anti-ROR1-CAR-T cells.

Figure 3:
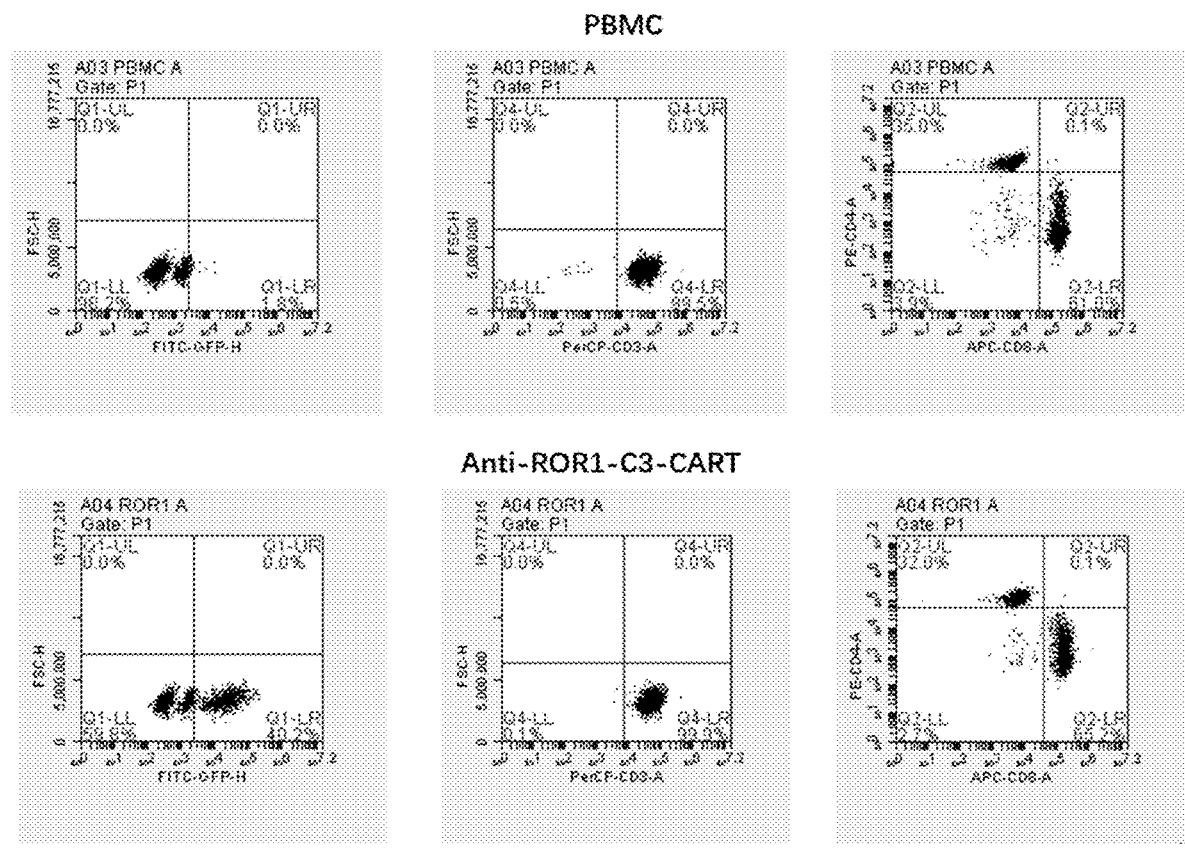
FIG. 3 shows the result of anti-ROR1-C3-CAR lentivirus infection T cells and phenotypic test.

6.1 Analysis of Anti-ROR1-C3-CAR-T Cells:

The anti-ROR1-C3-CAR-T cells were analyzed by method 1, and the results are show in FIG. 3. The infection efficacy of T cell is about 40%, in which 35% of T cells are CD4 T cells and 65% of T cells are CD8 T cells respectively.

Figure 4:
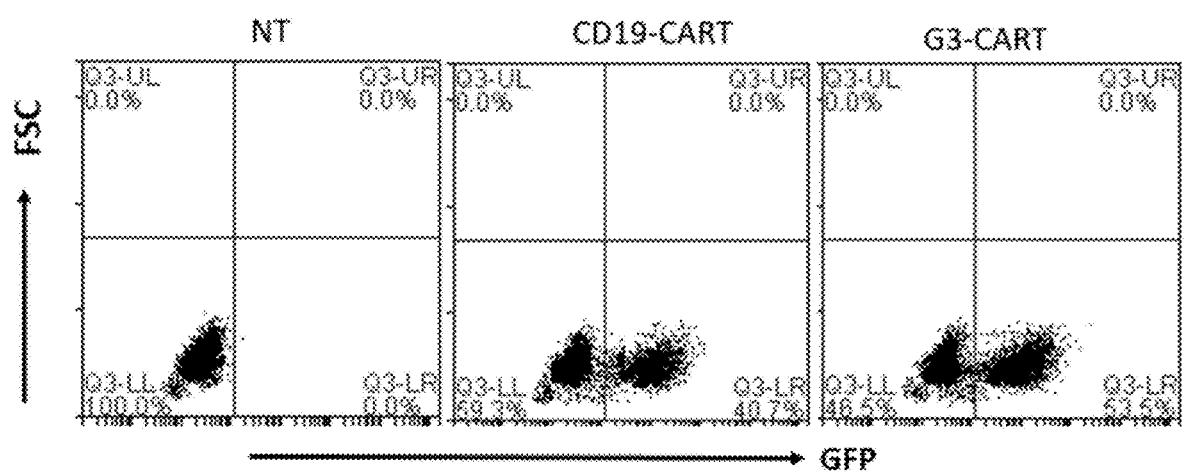
FIG. 4 shows the result of the anti-ROR1-G3-CAR lentivirus infection T cells. NT means non-transduced T cells.
Figure 6:
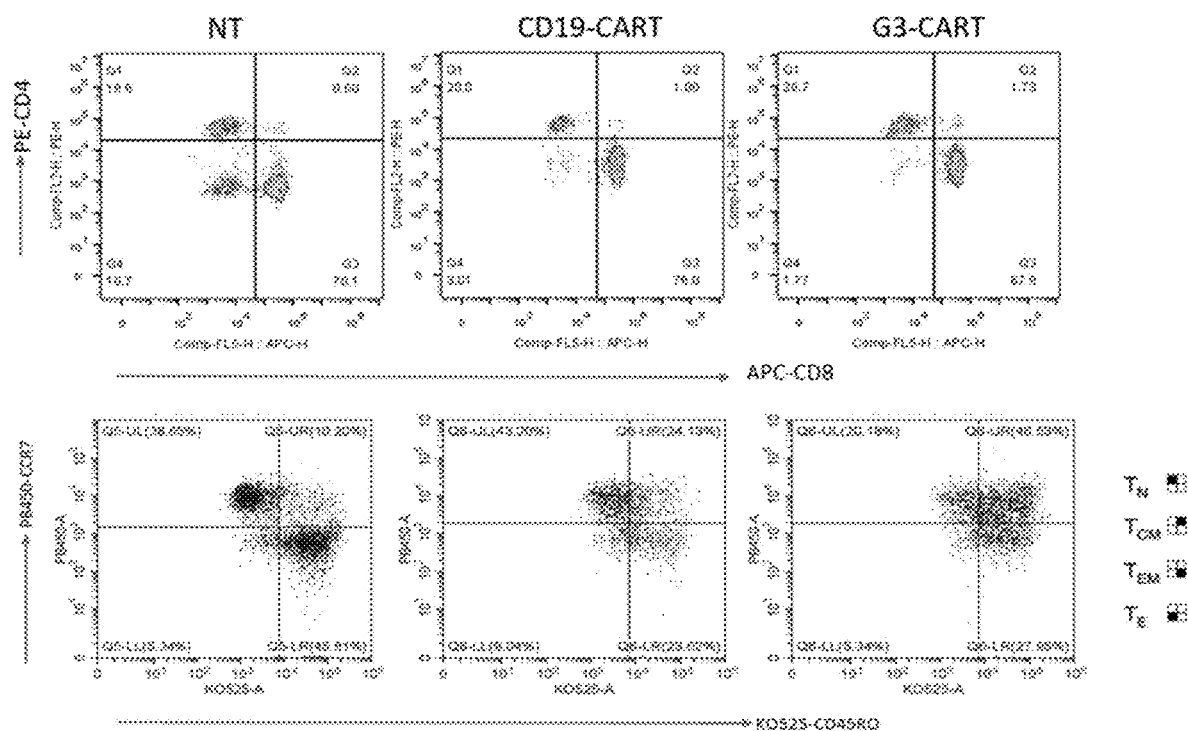
FIG. 6 shows the result of the subset and phenotype of the anti-ROR1-G3-CAR-T cell after proliferation.

6.2 Analysis of Anti-ROR1-G3-CAR-T Cells:

The anti-ROR1-G3-CAR-T cells were analyzed by method 2, and the results are show in FIG. 4 and FIG. 6. The infection efficacy of T cell is about 54%, in which 30% of T cells are CD4 T cells and 70% of T cells are CD8 T cells; 46.5% of anti-ROR1-G3-CAR-T cells are central memory T cell and 28% of anti-ROR1-G3-CAR-T cells are effector T cells and 20% of anti-ROR1-G3-CAR-T cells are naïve T cells.

Example 7. Evaluation of the Anti-ROR1-CAR-T Cells Proliferation Compared with Non-Transduced T Cells To evaluate the anti-ROR1-CAR-T cells proliferation in vitro, $0.5 \times 10^6$/mL anti-ROR1-CAR-T cells, CD19-CAR-T cells and non-transduced T cells were cultured separately in TexMACS (Miltenyi, cat #170-076-309)+10% FBS+200 IU/mL IL-2 (Miltenyi, cat #130-097-748)+100 µg/mL penicillin and 100 µg/mL streptomycin. Replace the complete medium and count the number of T cells every 2 days.

Figure 5:
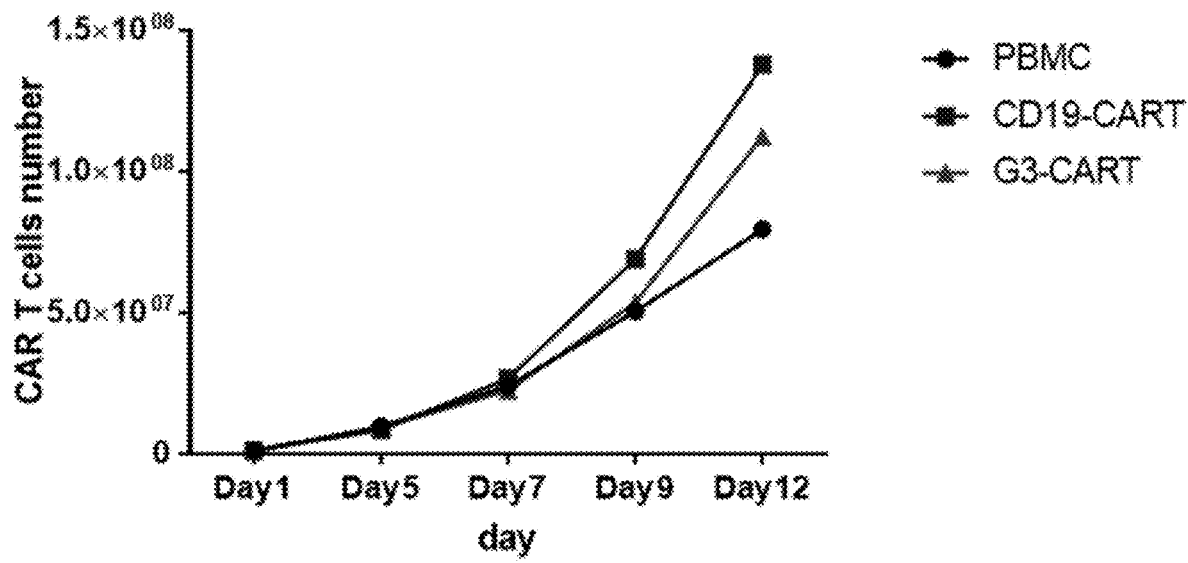
FIG. 5 shows the result of the anti-ROR1-G3-CAR-T cells proliferation in vitro.

The anti-ROR1-G3-CAR-T cells were analyzed and the results are shown in FIG. 5. The expansion number of the anti-ROR1-G3-CAR-T cells remained similar to the non-transduced T cells.

Example 8. Selection of ROR1-Positive and ROR1-Negative Cell Lines

To identify cell lines expressing ROR1 with different cell surface expression levels, eight human cell lines (see Table 4) were analyzed by FACS. The cells were suspended with PBS containing 0.5% BSA and the anti-ROR1 antibody (BD, Cat: 564474) and then incubated at 4° C. for 30 minutes. Then the cells were washed twice with wash buffer and the ROR1 expression was tested.

Figure 7:
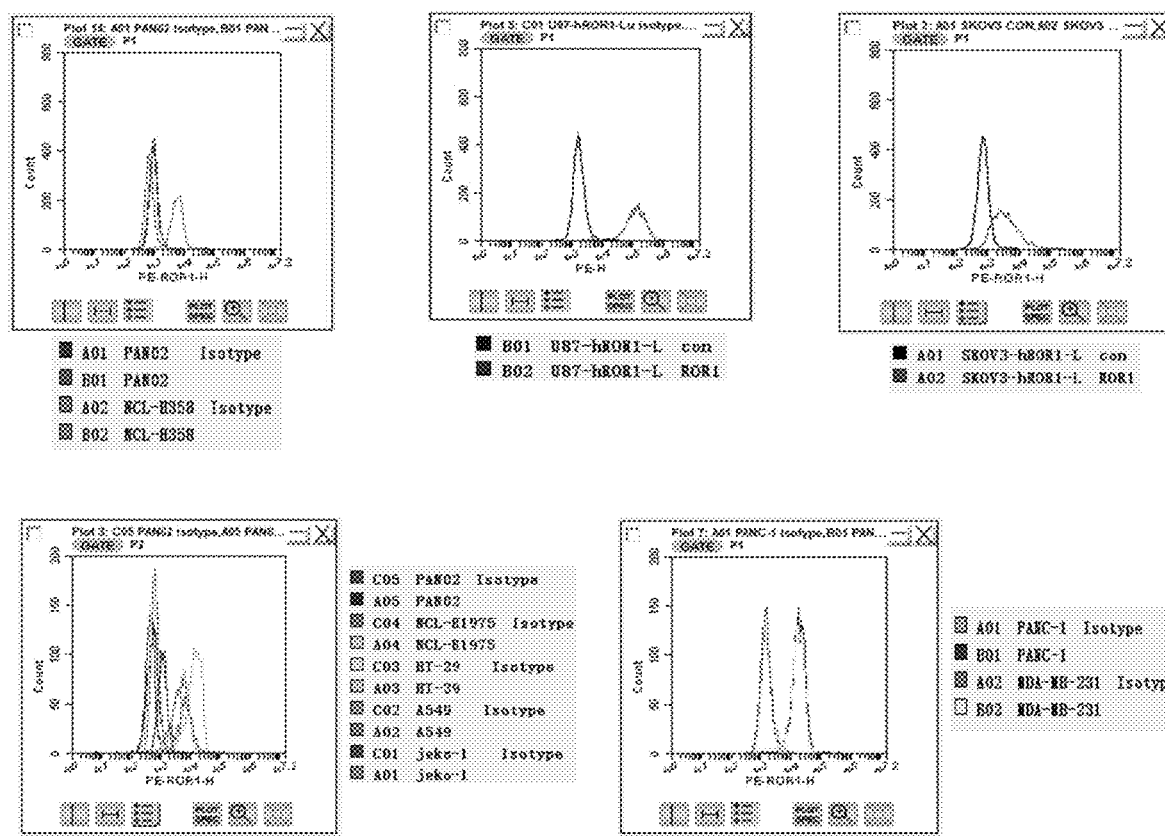
FIG. 7 shows the result of ROR1 expression of tumor cell lines.

The results show that MDA-MB-231, PANC-1, HT-29, A549, NCL-H358, NCL-H1975, JEKO-1 cells had high expression of ROR1, but the PAN02 cells did not express ROR1. The results are show in FIG. 7.

This cell lines were used to test the activity of anti-ROR1-CAR.

TABLE 4

ROR1 expression of different cell lines.

| Cell line | Cell type | ROR1 expression |
| --- | --- | --- |
| MDA-MB-231 | Breast adenocarcinoma | Positive |
| PANC1 | Pancreatic epithelioid carcinoma | Positive |
| PAN02 | Pancreatic epithelioid carcinoma | Negative |
| NCL-H358 | Non-small cell lung cancer | Positive |
| NCL-H1975 | Non-small cell lung cancer | Positive |
| A549 | Lung adenocarcinoma | Positive |
| HT-29 | Colorectal adenocarcinoma | Positive |
| JEKO-1 | Mantle cell lymphoma | Positive |

Example 9. Cytokine Release Assay

Method 1

The biological activity of anti-ROR1-CAR-T cells to ROR1-positive and ROR1-negative tumor cells was evaluated by using human TH1/TH2 cytokine CBA kit (BD, Cat: 550749). The anti-ROR1-CAR-T cells or PBMC were co-culture with MDA-MB-231 (ROR1$^+$), PANC-1 (ROR1$^+$), NCL-H358 (ROR1$^+$), NCL-H1975 (ROR1$^+$), A549 (ROR1$^+$), HT-29 (ROR1$^+$), Jeko-1 (ROR1$^+$) or PAN02 (ROR1$^+$) cell lines for 24 hours. The assay details were as follow: First, the target cell (ROR1$^+$) and no-target cell (ROR1$^-$) were harvested and washed twice with wash buffer. The cells were suspended with RPMI1640 containing 2% FBS and diluted to a concentration of $1 \times 10^6$ cells/mL. Then, the anti-ROR1-CAR-T cells and PBMC (Effector) cells were collected and diluted to a concentration of $1 \times 10^6$ cells/mL. 100 µL target cells (ROR1$^+$) or no-target cells (ROR1$^+$) were mixed with 100 µL anti-ROR1-CAR-T cells or PBMC at 1:1 into a 96-well plate and co-cultured at 37° C. for 20-24 hours. Second, 100 µL culture medium was collected and centrifuged at 1000 rpm for 5 minutes, and the supernatant was used in cytokines release detection. Third, the cytokines capture beads were taken out and vigorously mixed well. 50 µL mixed beads and 50 µL of the PE Detection Reagent were added into 50 µL supernatant of each sample, mixed thoroughly and incubated at room temperature in dark for 3 hours. The wash buffer of 1 mL was added into each sample and centrifuged at 200 g for 5 minutes. The supernatant was discarded and 300 µL wash buffer was added into each sample to suspend the beads. Finally, the samples were analyzed by flow cytometry.

Method 2

The biological activity of anti-ROR1-CAR-T cells to SK-OV-3 and U87MG overexpressing ROR1 cells was evaluated by using human TH1/TH2 cytokine CBA kit (BD, Cat: 550749). The anti-ROR1-CAR-T cells or PBMC were co-culture with SK-OV-3 and U87MG overexpressing ROR1 cell lines for 24 hours. The assay details were as follow: First, the target cell (SK-OV-3 and U87MG overexpressing ROR1 cells) and no-target cell (SK-OV-3 and U87MG) were harvested and washed twice with wash buffer. The cells were suspended with RPMI1640 containing 2% FBS and diluted to a concentration of $1 \times 10^6$ cells/mL. Then, the anti-ROR1-CAR-T cells and PBMC (Effector) cells were collected and diluted to a concentration of $1 \times 10^6$ cells/mL. 100 µL target cell (SK-OV-3 and U87MG overexpressing ROR1 cells) and no-target cell (SK-OV-3 and U87MG) were mixed with 100 µL anti-ROR1-CAR-T cells or PBMC at 1:1 into a 96-well plate and co-cultured at 37° C. for 20-24 hours. Second, 100 µL culture medium was collected and centrifuged at 1000 rpm for 5 minutes, and the supernatant was used in cytokines release detection. Third, the cytokines capture beads were taken out and vigorously mixed well. 50 µL mixed beads and 50 µL of the PE Detection Reagent were added into 50 µL supernatant of each sample, mixed thoroughly and incubated at room temperature under dark for 3 hours. 1 mL wash buffer was added into each sample and centrifuged at 200 g for 5 minutes. The supernatant was discarded and 300 µL wash buffer was added into each sample for suspending the beads. Finally, the samples were analyzed by flow cytometry.

Various modifications to the embodiments will be readily apparent to those skilled in the art. The method defined in Method 1 and Method 2 are universal, and may be applied to analyze of other anti-ROR1-CAR-T cells.

9.1 Analysis of Anti-ROR1-C3-CAR-T Cells:

The biological activity of anti-ROR1-C3-CAR-T cells to ROR1-positive and ROR1-negative tumor cells was evaluated by using method 1.

Figure 8:
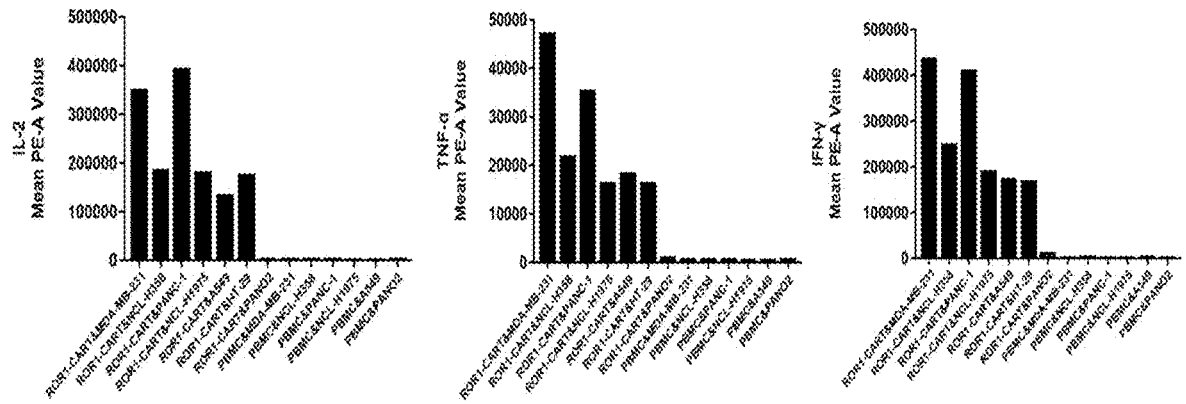
FIG. 8 shows the results of cytokines release of anti-ROR1-C3-CAR-T cells co-cultured with ROR1 positive target cells.

The result showed that the anti-ROR1-C3-CAR-T cells released IL-2, TNFα, IFNγ only in the presence of ROR1 positive cell lines. It showed that anti-ROR1-C3-CAR-T cells produced cytokines only when they were co-cultured with ROR1 positive target cells, but not when they were co-cultured with ROR1 negative cells, indicating that CAR-T cells had the ability to specifically kill ROR1 positive tumor cell lines, but had no killing effect to normal cells. The results are show in FIG. 8.

9.2 Analysis of Anti-ROR1-G3-CAR-T Cells:

The biological activity of anti-ROR1-G3-CAR-T cells to SK-OV-3 and U87MG overexpressing ROR1 cells was evaluated by using method 2.

Figure 9:
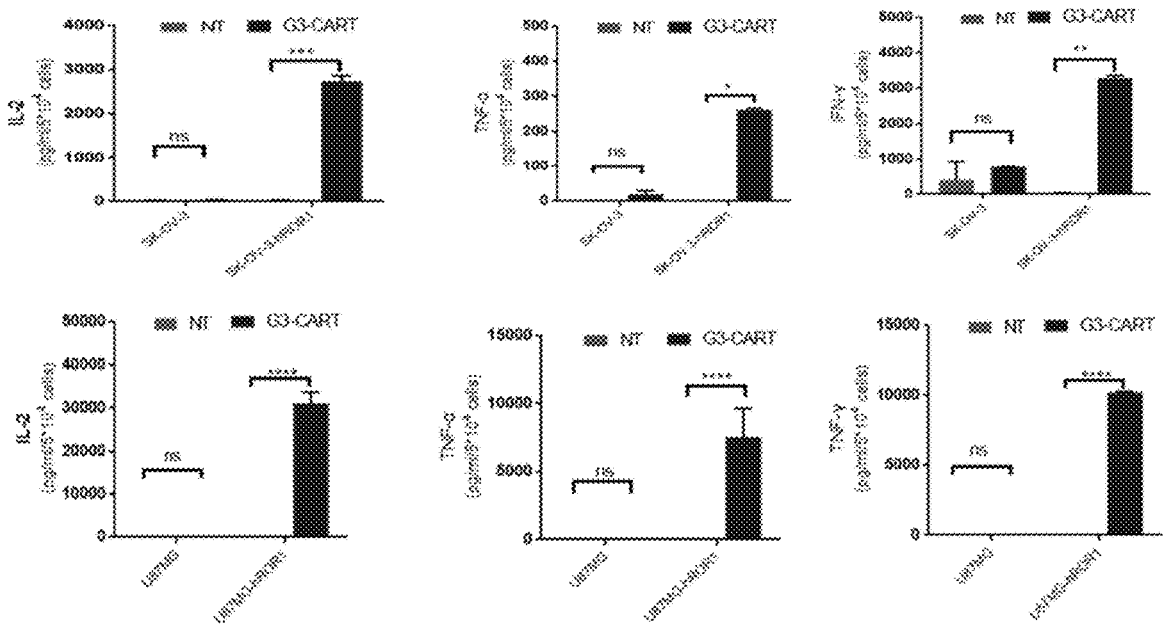
FIG. 9 shows the results of cytokines release of anti-ROR1-G3-CAR-T cells co-cultured with SK-OV-3 and U87MG expressing ROR1.

The result showed that the anti-ROR1-G3-CAR-T cells released IL-2, TNFα, IFNγ only in the presence of target cells (SK-OV-3 and U87MG overexpressing ROR1 cells). It showed that anti-ROR1-G3-CAR-T cells produced cytokines only when they were co-cultured with ROR1 positive target cells (SK-OV-3 and U87MG overexpressing ROR1 cells), but not when they were co-cultured with ROR1 negative cells (SK-OV-3 and U87MG), indicating that CAR-T cells had the ability to specifically kill ROR1 positive tumor cell lines, but had no killing effect to normal cells. The results are show in FIG. 9.

Example 10. Cytolysis Ability Test

Cytolysis caused by anti-ROR1-CAR-T cells was evaluated using co-culture assay. The anti-ROR1-CAR-T cells or PBMC were co-culture with MDA-MB-231 (ROR1$^+$), PANC-1 (ROR1$^+$), NCL-H358 (ROR1$^+$), NCL-H1975 (ROR1$^+$), A549 (ROR1$^+$), HT-29 (ROR1$^+$), or PAN02 (ROR1$^+$) cells for 24 hours. The cytolysis assay details were as follow: First, the target cell (ROR1$^+$) and non-target cell (ROR1$^+$) were harvested and washed twice with wash buffer. The cells were suspended with RPMI1640 containing 2% FBS and diluted to a concentration of $1\times10^6$ cells/mL. Then, the anti-ROR1-CAR-T cells and PBMC (Effector) were collected and diluted to $1\times10^6$ cells/mL. The effector and target cells or non-target cell were seeded at 1:1 into a 12-well plate and co-cultured at 37° C. for 24 hours. Thereafter, the cell survival rate was evaluated and photos were taken.

Figure 10:
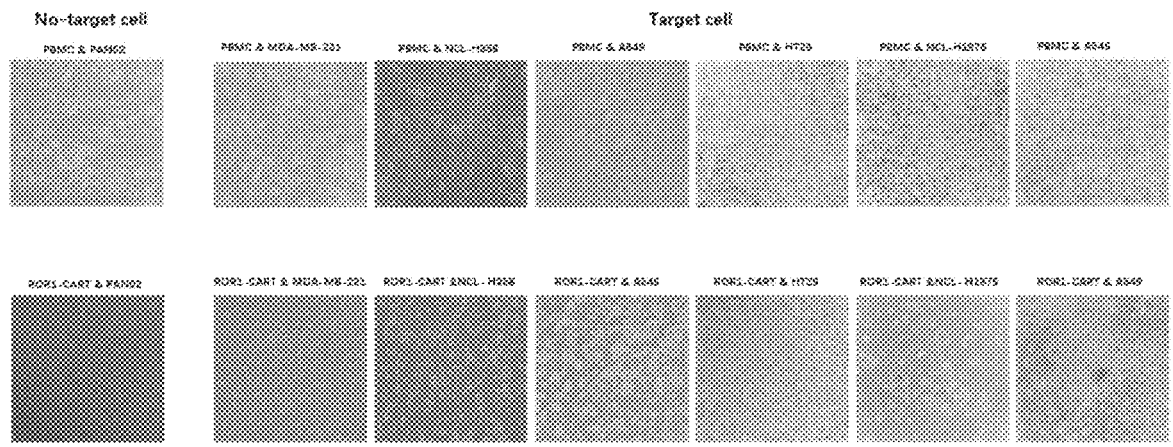
FIG. 10 shows the result of anti-ROR1-C3-CAR-T cells lyse ROR1 positive target cells.

The anti-ROR1-G3-CAR-T cells were analyzed. The anti-ROR1-C3-CAR-T cells resulted in the cytolysis of MDA-MB-231 (ROR1$^+$), PANC-1 (ROR1$^+$), NCL-H358 (ROR1$^+$), NCL-H1975 (ROR1$^+$), A549 (ROR1$^+$), HT-29 (ROR1$^+$), but did not result in the cytolysis of PAN02 (ROR1$^+$) as shown in FIG. 10.

Example 11. Cytotoxicity Assay

Method 1

The cytotoxicity was evaluated by LDH release assay using CytoTox 96® Non-Radioactive Cytotoxicity Assay (Promega, Cat: G1780). Anti-ROR1-CAR-T cells or PBMC were co-culture with MDA-MB-231 (ROR1$^+$), PANC-1 (ROR1$^+$), NCL-H358 (ROR1$^+$), NCL-H1975 (ROR1$^+$), A549 (ROR1$^+$), HT-29 (ROR1$^+$), Jeko-1 (ROR1$^+$) or PAN02 (ROR1$^+$) cells for 4-6 hours. The cytotoxicity assay details were as follow: First, target cell (ROR1$^+$) and no-target cell (ROR1$^+$) were harvested and washed twice with wash buffer. The cells were suspended with RPMI1640 containing 2% FBS and diluted to a concentration of $1\times10^5$ cells/mL. Then the anti-ROR1-CAR-T cells and PBMC (Effector) were collected and diluted to $2\times10^6$ cells/mL, $1\times10^6$ cells/mL, $0.5\times10^6$ cells/mL, $0.1\times10^6$ cells/mL, respectively. The above cells were added into the 96-well plate (200 µL system) and the composition of each group were indicated in Table 5. The ratio of Effector:Target was 20:1, 10:1, 5:1, 1:1, respectively. Then, cells were cultured at 37° C. for 4-6 hours and 20 µL 10×lysis (assay kit) was added to the maximum target cell release group 45 minutes before the end point of the experiment. 50 µL supernatant from each well was taken out and transferred to the new 96-well plate, then 50 µL substrate was added in 96 well plate and incubated at room temperature in dark for 30 minutes. Finally, 50 µL termination solution was added and the absorption value was measured at 490 nm. The percentage of specific lysis was calculated using the following formula:

$$(X-\text{Effector}-\text{Target Auto Release}+\text{Back Ground})/(Y-B).$$

TABLE 5

Experimental groups design of the LDH release assay.

| Group | System of medium |
| --- | --- |
| Background control group (B) | 200 µL medium |
| Target cells auto release group | 100 µL medium, 100 µL target cell |
| Different concentration effector cells background release group (Effector) | 100 µL medium, 100 µL effector cells at different concentrations |
| Largest target cells release group (Y) | 100 µL medium, target cells 100 µL. Before the experiment finish add 2.0 µL lysis buffer (10x) |
| Different ratio of effector:target group (X) | 100 µL effector cells, 100 µL target cells |

Method 2

The cytotoxicity was evaluated by LDH release assay using CytoTox 96® Non-Radioactive Cytotoxicity Assay (Promega, Cat: G1780). Anti-ROR1-CAR-T cells or PBMC were co-culture with SK-OV-3 and U87MG overexpressing ROR1 cells (ROR1$^+$), or SK-OV-3 and U87MG (ROR1$^+$) cell lines for 4-6 hours. The cytotoxicity assay details were as follow: First, target cell (ROR1$^+$) and no-target cell (ROR1$^+$) were harvested and washed twice with wash buffer. The cells were suspended with RPMI1640 containing 2% FBS and diluted to a concentration of $1\times10^5$ cells/mL. Then the anti-ROR1-CAR-T cells and PBMC (Effector) were collected and diluted to $2\times10^6$ cells/mL, $1\times10^6$ cells/mL, $0.5\times10^6$ cells/mL, $0.1\times10^6$ cells/mL, respectively. The above cells were added into the 96-well plate (200 µL system) and the composition of each group were indicated in Table 5. The ratio of Effector:Target was 20:1, 10:1, 5:1, 1:1, respectively. Then, the cells were cultured at 37° C. for 4-6 hours and 20 μL 10×lysis (assay kit) was added to the maximum target cell release group 45 minutes before the end point of the experiment. 50 μL supernatant from each well was taken out and transferred to the new 96-well plate, then 50 μL substrate was added in 96 well plate and incubated at room temperature in dark for 30 minutes. Finally, 50 μL termination solution was added and the absorption value was measured at 490 nm. The percentage of specific lysis was calculated using the following formula.

$$(X-\text{Effector}-\text{Target Auto Release}+\text{Back Ground})/(Y-B).$$

TABLE 5

Experimental groups design of the LDH release assay.

| Group | System of medium |
|---|---|
| Background control group (B) | 200 μL medium |
| Target cells auto release group | 100 μL medium, 100 μL target cell |
| Different concentration effector cells background release group (Effector) | 100 μL medium, 100 μL effector cells at different concentrations |
| Largest target cells release group (Y) | 100 μL medium, target cells 100 μL. Before the experiment finish add 20 μL lysis buffer (10x) |
| Different ratio of effector:target group (X) | 100 μL effector cells, 100 μL target cells |

Various modifications to the embodiments will be readily apparent to those skilled in the art. The method defined in Method 1 and Method 2 are universal, and may be applied to analyze of other anti-ROR1-CAR-T cells.

Figure 11:
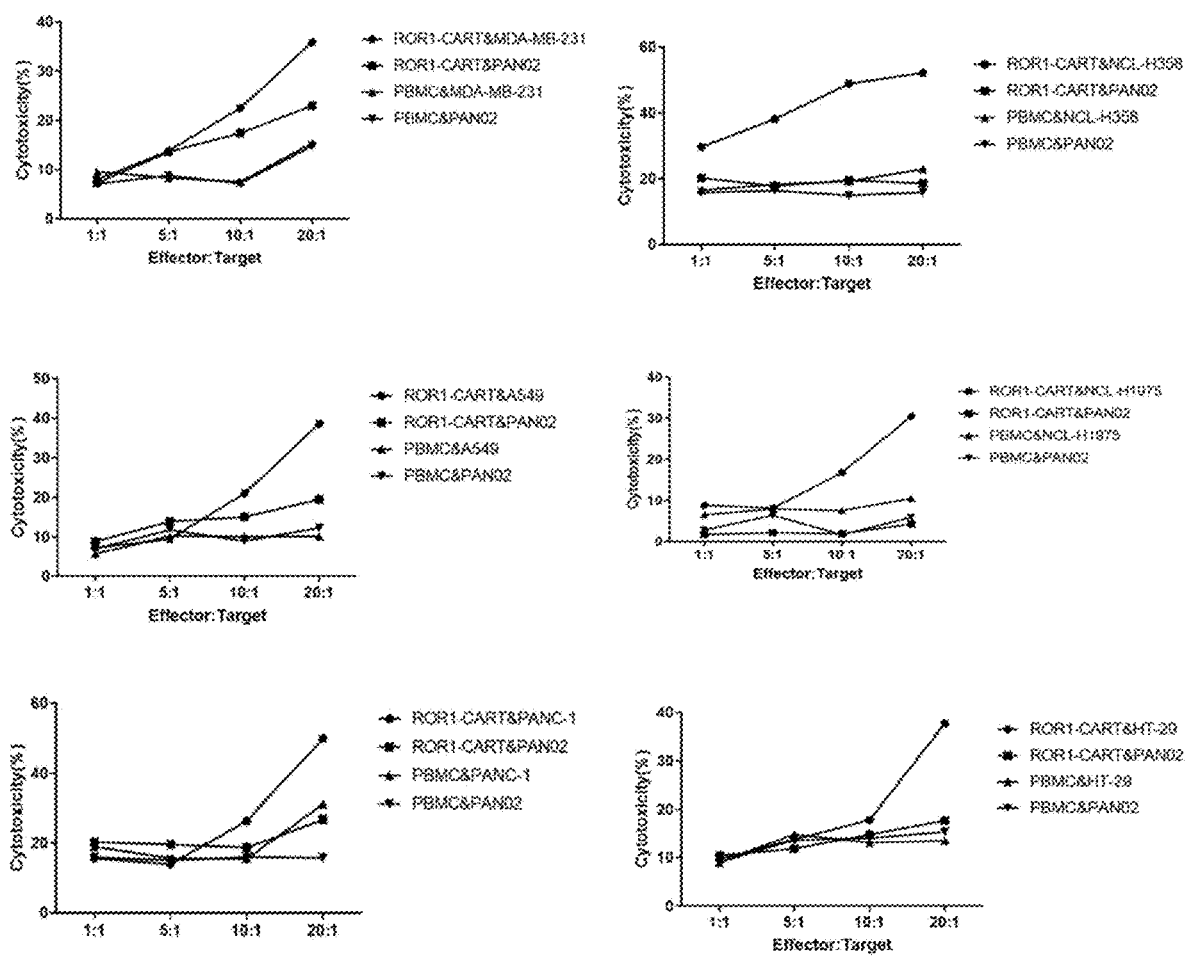
FIG. 11 shows the results of cytotoxicity of anti-ROR1-C3-CAR-T cells against ROR1 positive target cells in vitro.

11.1 Analysis of Anti-ROR1-C3-CAR-T Cells:

The cytotoxicity of anti-ROR1-C3-CAR-T cells was evaluated by using method 1. Anti-ROR1-C3-CAR-T cells caused significant cytotoxicity on ROR1 positive tumor cells, but had no cytotoxicity on ROR1-negative tumor cells, indicating that CAR-T cells had the ability to specifically kill ROR1 positive tumor cell lines, but had no killing effect to normal cells. The results are show in FIG. 11.

Figure 12:
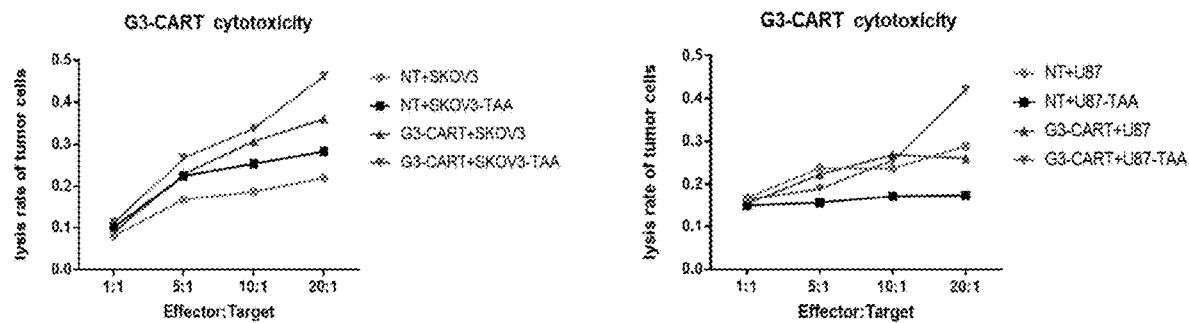
FIG. 12 shows the results of cytotoxicity of anti-ROR1-G3-CAR-T cells co-cultured with SK-OV-3 and U87MG expressing ROR1.

11.2 Analysis of Anti-ROR1-G3-CAR-T Cells:

The cytotoxicity of anti-ROR1-G3-CAR-T cells was evaluated by using method 2. Anti-ROR1-G3-CAR-T cells caused significant cytotoxicity on SK-OV-3 and U87MG overexpressing ROR1 cells, but had no cytotoxicity on SK-OV-3 and U87MG cells, indicating that CAR-T cells had the ability to specifically kill ROR1 positive tumor cell lines, but had no killing effect to normal cells. The results are show in FIG. 12.

Example 12. Safety Testing of Anti-ROR1-CAR-T Cells

To evaluate the safety of anti-ROR1-CAR-T cells, NSG mice at the age of 8 weeks were used in this study. The animals were purchased from Shanghai Research Center for Model organisms. The mice were maintained in the facility with a temperature of 20-25° C. and a relative humidity of 40-70%. The mice were subcutaneously inoculated with $5×10^6$ of ROR1 expressed tumor cells SK-OV-3. After one week, the animals were received anti-ROR1 chimeric antigen receptor T cells with different doses and control T cells or PBS solution when the tumor-bearing volume of the mice reached 100 mm³.

Total 40 tumor-bearing mice were divided into 5 groups, each group with 4 male and 4 female mice. The first group was given $1×10^6$ CAR-T cells, the second group was given the $5×10^6$ CAR-T cells, and the third group was given $1×10^7$ CAR-T cells. The fourth group was given the $1×10^7$ normal T cells and the fifth group was injected the PBS solvent as controls. After the mice were infused with CAR-T cells, the adverse reactions and activity status of the mice were closely observed every day for a total of 28 days, bodyweight was recorded at the beginning day of CAR-T cells and then weekly up to day 28. At the end of the study, the mice were euthanized, necropsy was performed to observe gross pathology change for main organs. No pathology change was observed for heart, liver, spleen, lung, kidney, stomach, intestine, brain, cerebellum, lymph nodes. No abnormal symptoms of respiratory system, digestive system, and cranial nervous system were observed. Therefore, anti-ROR1-CAR-T cells showed high safety in NSG tumor-bearing mice.

Various modifications to the embodiments will be readily apparent to those skilled in the art. The method defined herein may be applied to analyze any of the anti-ROR1-CAR-T cells.

Example 13. Function Testing of Anti-ROR1-CAR-T Cells

Method 1

To evaluate the in vivo function of the anti-ROR1-scFV sequences in CAR format, a murine model utilizing MB-MDA-231 cells transduced to express firefly luciferase was utilized. $1×10^7$ cells were subcutaneously injected into NOD-Prkdc$^{scid}$Il2rg$^{cm1}$/Smoc mice (from Shanghai Model Organisms Center, Inc.). Then, $1×10^7$ anti-ROR1-CAR-T cells were injected into the tumor on day 20. The MDA-MB-231 cells were inoculated in NSG mice. After 44 days, anti-ROR1-CAR-T cells were injected and the tumor size was measured.

Method 2

To evaluate the in vivo function of the anti-ROR1-scFV sequences in CAR format, a murine model utilizing Jeko-1, SK-OV-3 and U87MG overexpressing ROR1 cells transduced to express firefly luciferase was utilized. In mantle cell lymphoma xenograft, $1×10^6$ Jeko-1 cells were tail vein injected into NOD-Prkdc$^{scid}$Il2rg$^{cm1}$/Smoc mice (from Shanghai Model Organisms Center, Inc.). Then, anti-ROR1-CAR-T cells were intravenous injected into the mice on day 2 or day 12 with different dose; In ovarian cancer xenograft, $1×10^6$ SK-OV-3-ROR1 cells were intraperitoneally injected into NOD-Prkdc$^{scid}$Il2rg$^{cm1}$/Smoc mice (from Shanghai Model Organisms Center, Inc.). Then, $1×10^7$ anti-ROR1-CAR-T cells were injected into abdominal cavity on day 2. In brain glioma xenograft, $1×10^5$ U87MG-ROR1 cells were intracranially injected into NOD-Prkdc$^{scid}$Il2rg$^{cm1}$/Smoc mice (from Shanghai Model Organisms Center, Inc.). Then, $2×10^6$ anti-ROR1-CAR-T cells were injected into the tumor on day 5 and the tumor size was measured.

Various modifications to the embodiments will be readily apparent to those skilled in the art. The method defined in Method 1 and Method 2 are universal, and may be applied to analyze of other anti-ROR1-CAR-T cells.

Figure 13:
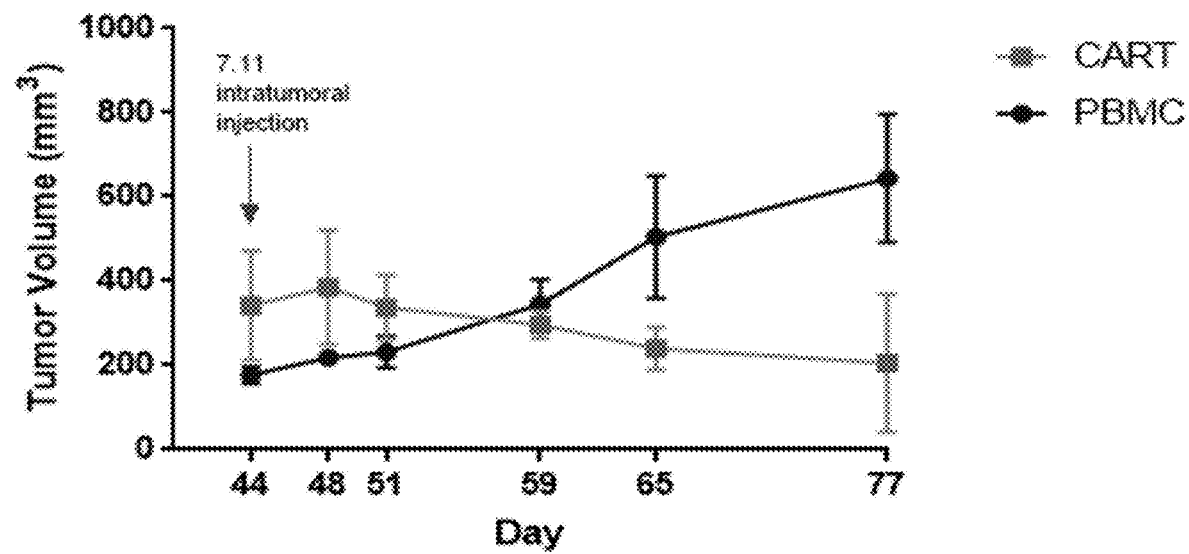
FIG. 13 shows the result of the antitumor activity of anti-ROR1-C3-CAR-T cells in MDA-MB-231 xenograft.
Figure 14:
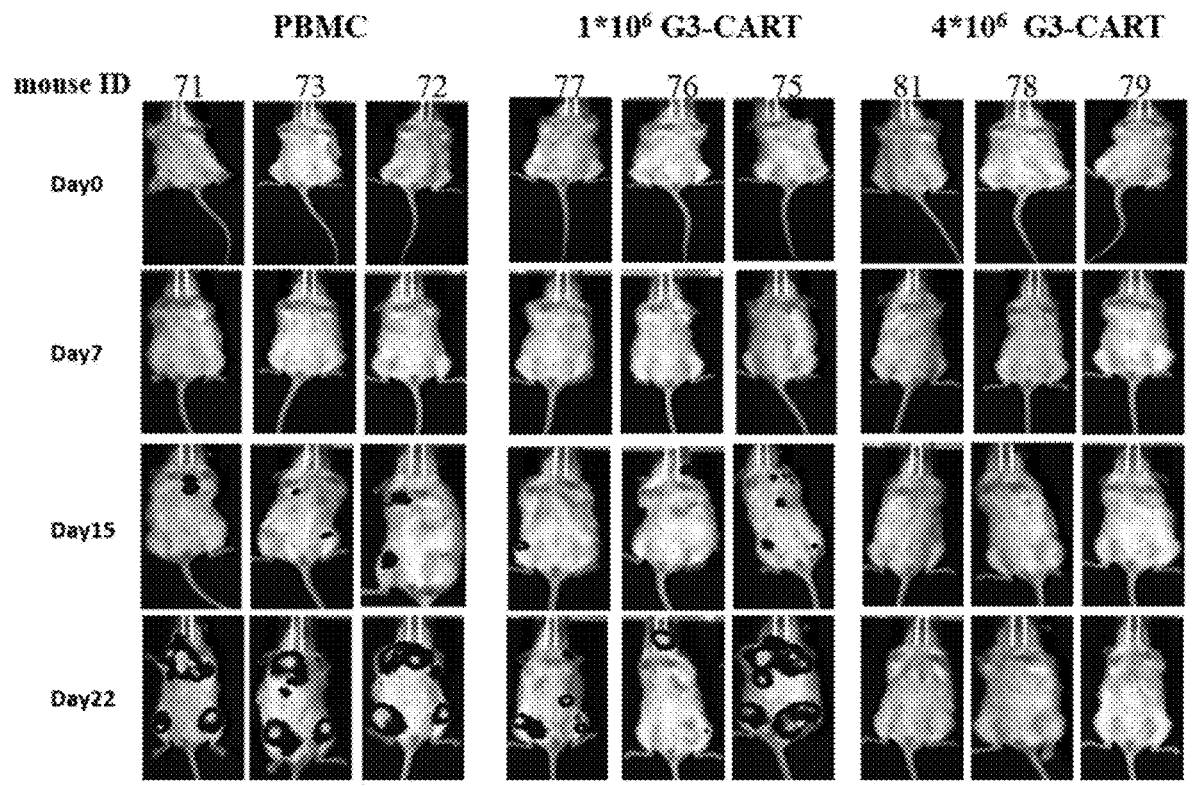
FIG. 14 shows the result of the antitumor activity of anti-ROR1-G3-CAR-T cells in Jeko1 xenograft.
Figure 14:
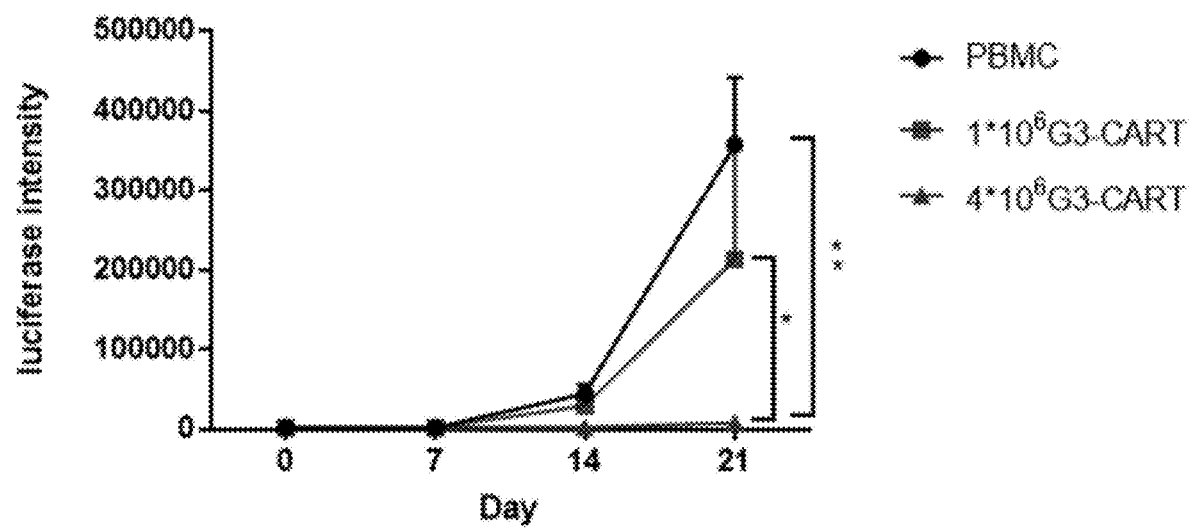
Figure 15:
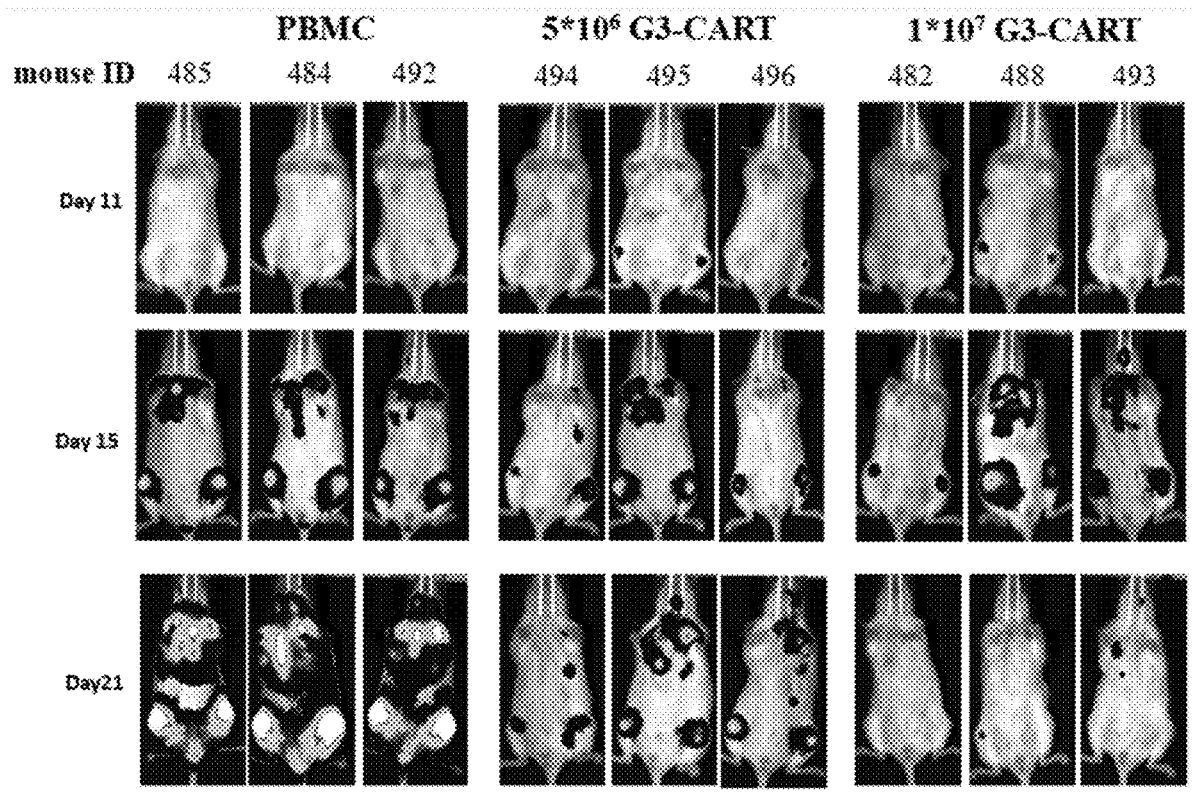
FIG. 15 shows the result of the antitumor activity of anti-ROR1-G3-CAR-T cells in Jeko1 xenograft.
Figure 15:
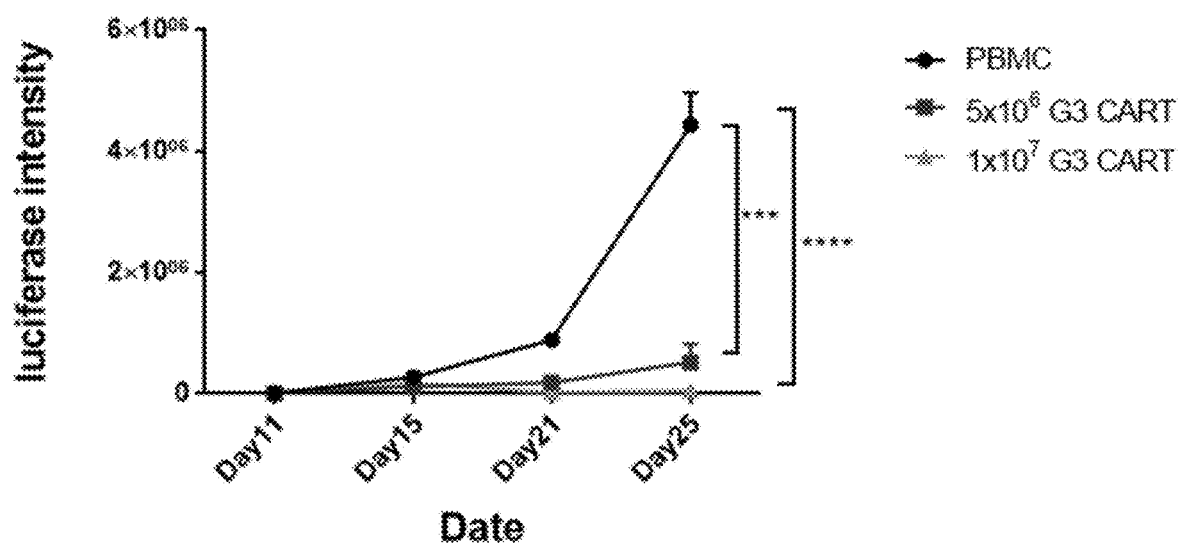
Figure 16:
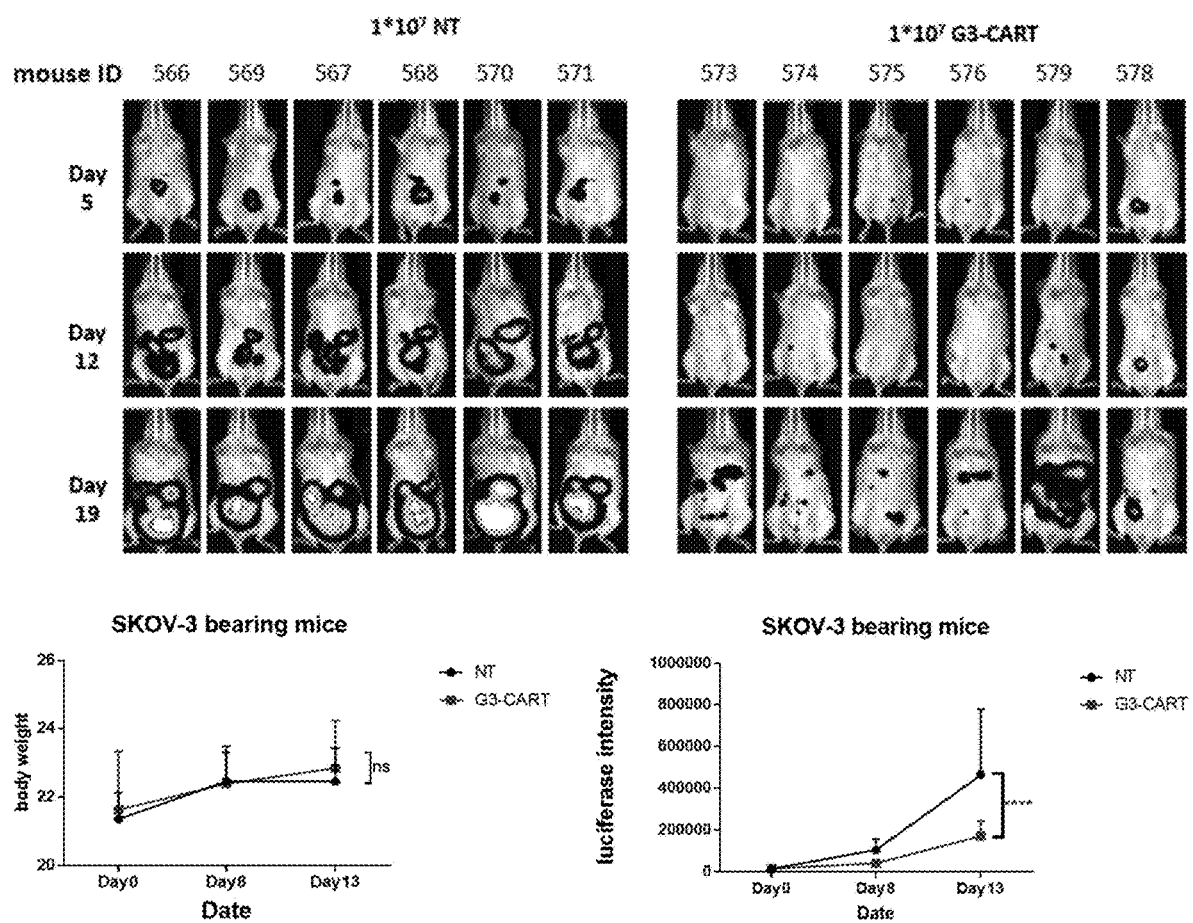
FIG. 16 shows the result of the antitumor activity of anti-ROR1-G3-CAR-T cells in SK-OV-3-ROR1 xenograft.
Figure 17:
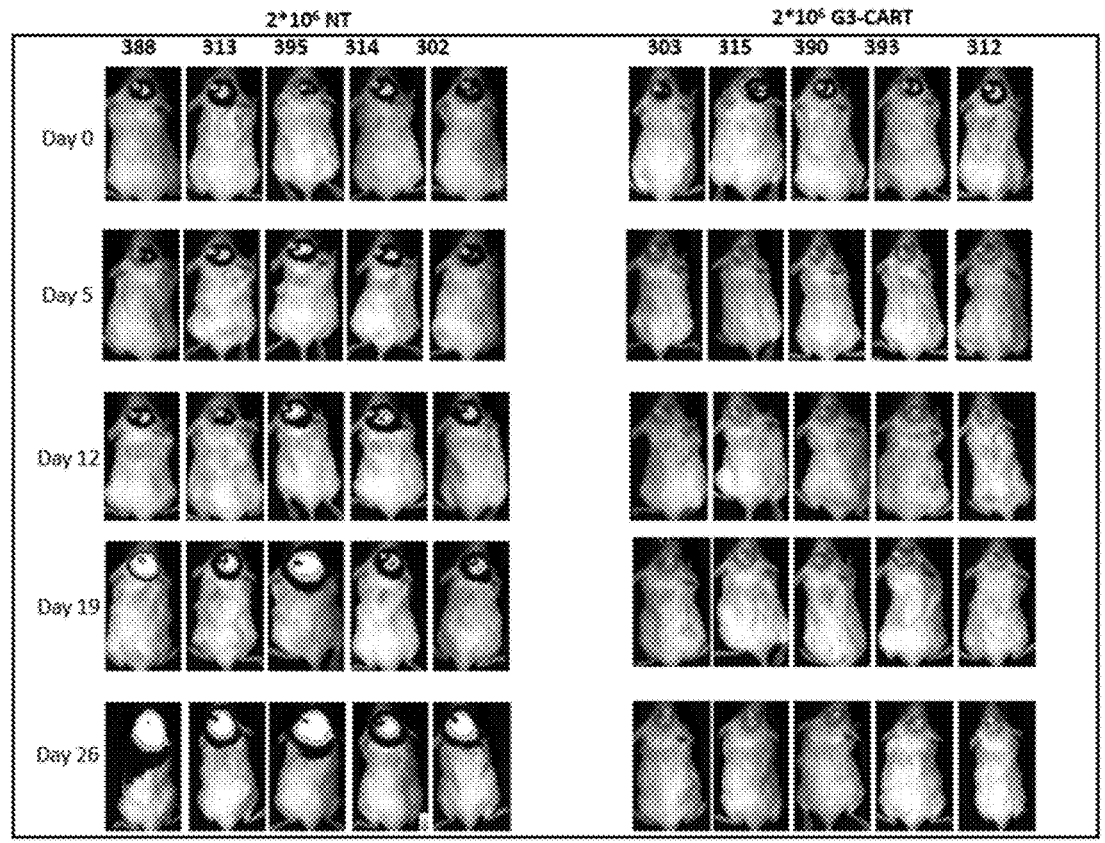
FIG. 17 shows the result of the antitumor activity of anti-ROR1-G3-CAR-T cells in U87MG-ROR1 xenograft.
Figure 17:
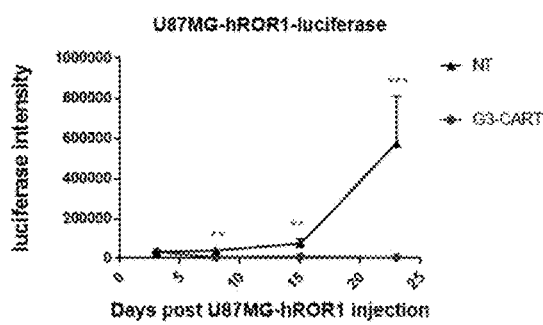
Figure 17:
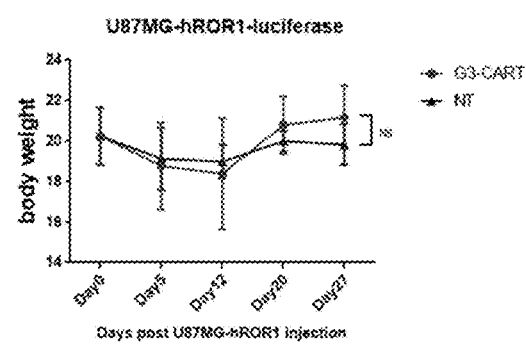
Figure 18:
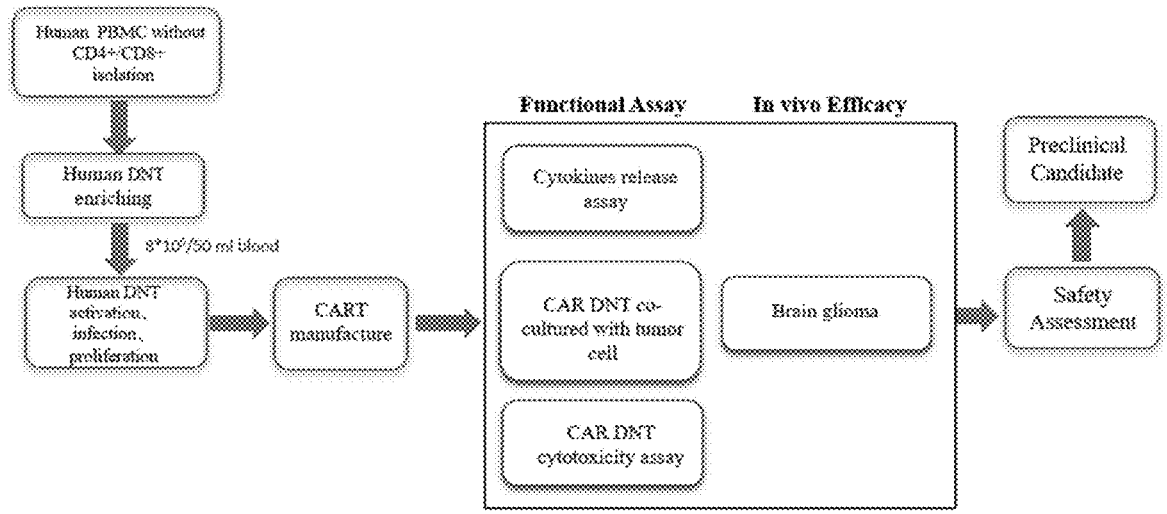
FIG. 18 shows the anti-ROR1-G3-CAR-DNT research pathway.

13.1 Analysis of Anti-ROR1-C3-CAR-T Cells:

The function of anti-ROR1-C3-CAR-T cells was evaluated by using method 1. The results are shown in FIG. 13. According to the tumor growth curve, tumor growth was significantly inhibited in the mouse group injected with anti-ROR1-C3-CAR-T cells, while the PBMC group showed normal tumor growth.

13.2 Analysis of Anti-ROR1-G3-CAR-T Cells:

The function of anti-ROR1-G3-CAR-T cells was evaluated by using method 2. The results are show in FIG. 14, FIG. 15, FIG. 16 and FIG. 17.

In multiple animal models, treatment with anti-ROR1-G3-CAR-T cells provided protection against tumor progression. According to the tumor growth curve, tumor growth was significantly inhibited in the mouse group injected with anti-ROR1-G3-CAR-T cells, while the PBMC group showed normal tumor growth.

Example 14. Double Negative T Cells were Isolated and Enriched from Peripheral Blood of Healthy People 14.1 Isolation of the DNT Cells from Peripheral Blood:

20-50 mL peripheral blood was collected by 2 disposable blood vacuum tube containing sodium citrate. RosetteSep™ Human CD8 Depletion Kit (Stemcell Cat: 15663) and RosetteSep™ Human CD4 Depletion Kit (Stemcell, Cat: 15662) were used to conduct DNT cell isolation. The isolation process was described simply: First, 50 uL/mL anti-human CD4 and CD8 Depletion Cocktail were added to the freshly collected blood samples followed incubating for 20 minutes at room temperature, and then added the equal volume of normal saline to blood sample. Then, the blood sample was add to 50 mL SepMate™-50 tube (Stemcell, Cat:104950) containing 15 mL density gradient centrifuge ficoll-paque-plus (GE,Cat:17-1440-02). The SepMate™-50 tube (Stemcell, Cat:104950) was centrifuged at 1200 g for 15 minutes. The PBMC without CD4 and CD8 positive T cells were collected at the Ficoll and plasma interface. Finally, the obtained PBMC was centrifuged with 0.87% normal saline at 150 g for 10 minutes and washed for 3 times.

Figure 19:
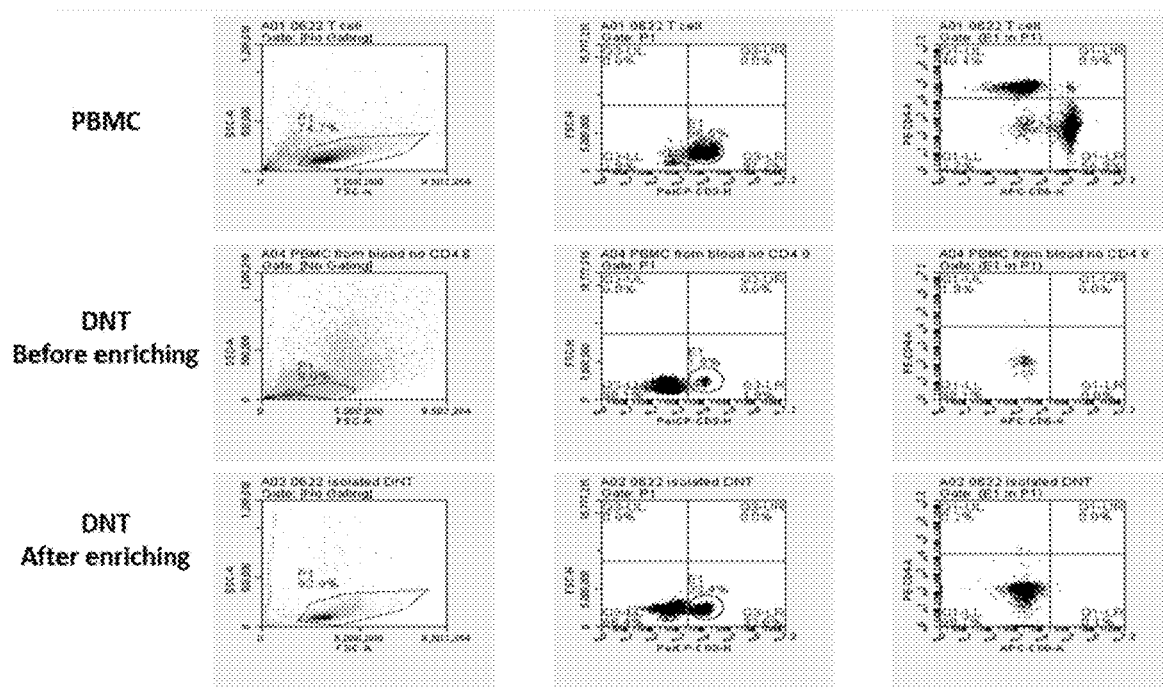
FIG. 19 shows the result of phenotypic test of DNT from human peripheral blood.

14.2 Enrichment of the DNT Cells from Peripheral Blood:

DNT cells were enriched from PBMC without CD4 and CD8 positive T cells obtained from the step 1 using the Human Pan T Cell isolation Kit (Miltenyi, Cat: 130-096-535). The isolation steps are as follows: First, PBMC were washed and suspended in precooled PBS at a density of $1 \times 10^7/40$ μL, then add 10 μL/$1 \times 10^7$ cells Pan T Cell Biotin-Antibody cocktail to sample at 4° C. incubation for 5 minutes, then, 30 μL PBS and 20 μL Pan T Cell Microbead cocktail was added to sample at 4° C. incubation for 10 minutes. The above cells were added into the LS column (Miltenyi, Cat:130-042-401) and the magnetic frame was used for cell separation. Finally, the obtained DNT cells were washed with PBS for three times. The proportion of CD3 (BD, Cat: 552852), CD4⁻ (BD, Cat: 555347) and CD8⁻ (BD, Cat: 555369) cell subsets were detected by using flow cytometry. The results are shown in FIG. 19.

There about 35% of cells was the DNT cells after isolation and enrichment, The DNT cells were with higher purity and easy to be used for anti-ROR1-G3-CAR lentivirus infection.

Example 15. DNT Cells Infection with Anti-ROR1-G3-CAR Lentivirus

The DNT cells were re-suspended at $1.5 \times 10^6$/mL and seeded in 6 well plate, each well with 2 mL media, the cells were activated with 5 μg/mL CD3 (Miltenyi, Cat: 170-076-116) and 0.5 μg/mL CD28 (Miltenyi, Cat: 170-076-116) soluble antibodies and 15 μg/mL Retronectin (Takara, Cat: T100A). The anti-ROR1-G3-CAR lentivirus at an MOI of 5 and 15 was added into each well on the next day. Two days later, cells were harvested and re-suspended at $1.5 \times 10^6$/mL and left to expend for a further four days before being used for FACS and co-culture experiment.

Figure 20:
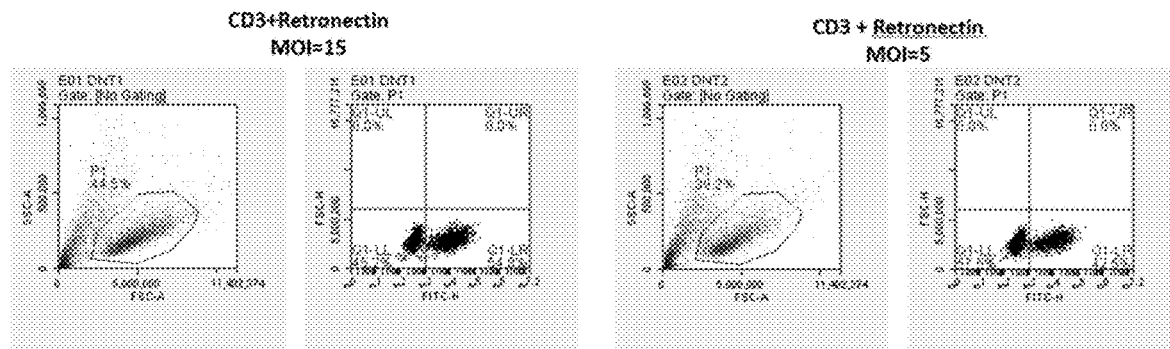
FIG. 20 shows the result of anti-ROR1-G3-CAR lentivirus infection DNT cells.
Figure 21:
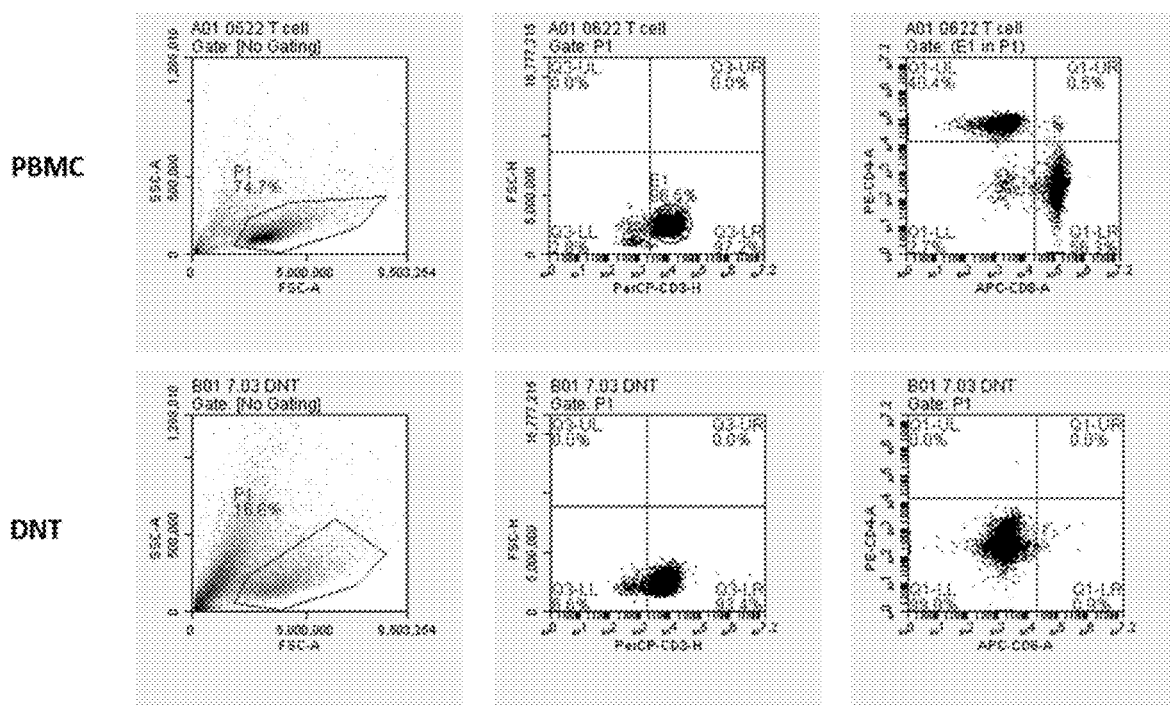
FIG. 21 shows the result of the subset and phenotype of the anti-ROR1-G3-CAR-DNT cells after proliferation.

Example 16. Evaluation of the Anti-ROR1-G3-CAR-DNT Cells Efficiency and Phenotype by FACS A lentivirus vector co-expressing anti-ROR1-G3-CAR and Green fluorescent protein separated by the 2A self-shearing peptide was constructed to examine the expression efficacy of anti-ROR1-G3-CAR The expression efficacy of anti-ROR1-G3-CAR was examined by detecting Green fluorescent protein via Facial Action Coding System (FACS). The detection of infection efficiency and phenotypic test were as follow: First, $1 \times 10^6$ cells were collected and infected with the lentivirus, and washed twice with wash buffer. Then, 15 μL APC anti-human CD8 (BD, Cat: 555369), 15 μL PE anti-human CD4 (BD, Cat: 555347), 15 μL PerCY5.5 anti-human CD3 (BD, Cat: 552852) were added and incubated at 4° C. in dark for 30 minutes. Second, the samples were centrifuged at 1000 rpm for 5 minutes at room temperature, and then the supernatant was removed. Third, the FACS buffer was added to wash twice and followed by centrifuging at 1000 rpm for 5 minutes at room temperature. Finally, the cells were suspended with 150 μL FACS buffer and the fluorescence was detected by FACS. The results are show in FIG. 20.

The infection efficacy of DNT cell is about 43% at an MOI of 5 and 55% at an MOI of 15, and the anti-ROR1-G3-CAR-DNT cells are both CD4 and CD8 negative T cells.

Example 17. Evaluation the Anti-ROR1-G3-CAR-DNT Cells Proliferation In Vitro To confirm the ability of the anti-ROR1-G3-CART cells proliferation in vitro, DNT cells were collected at the $3^{th}$ day after infection lentivirus and cultured in TexMACS (Miltenyi, cat #170-076-309)+10% FBS+200 IU/mL IL-2 (Miltenyi, cat #130-097-748)+5 ng/mL IL-4 (Proptech, cat #200-07-10)+10 ng/mL IL-7 (Proptech, cat #200-04-5)+10 ng/mL IL-15 (Proptech, cat #200-15-10)+100 μg/mL penicillin and 100 μg/mL streptomycin for 4 days.

Anti-ROR1-G3-CAR-DNT cells were collected on the $7^{th}$ day, washed with PBS for 1-2 times and cultured in the complete medium containing 100 ng/mL CD3 (Miltenyi, Cat: 170-076-116). After that, the complete medium containing 100 ng/mL CD3 (Miltenyi, Cat: 170-076-116) was replaced every 3 to 4 days, and the culture lasted for 21 days. In the culture process, the number of anti-ROR1-G3-CAR-DNT cells was recorded every 3 to 4 days.

Figure 22:
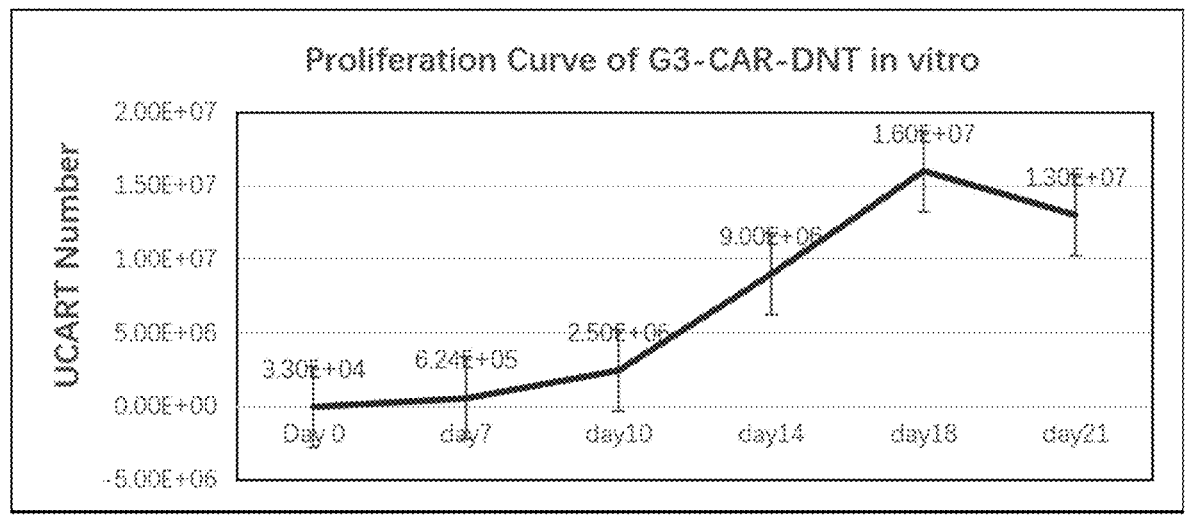
FIG. 22 shows the result of the anti-ROR1-G3-CAR-DNT cells proliferation in vitro.
Figure 23:
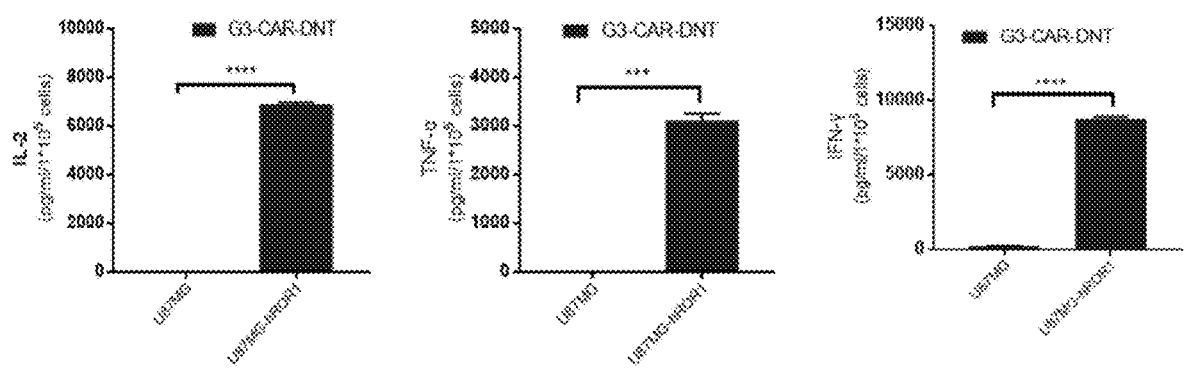
FIG. 23 shows the results of cytokines release of anti-ROR1-G3-CAR-DNT cells co-cultured with U87MG expressing ROR1.

The number of anti-ROR1-G3-CAR-DNT cells were shown in FIG. 22. On the $18^{th}$ day of culture, the anti-ROR1-G3-CAR-DNT cells could be expanded more than 500 times. However, the number of anti-ROR1-G3-CAR-DNT cells gradually decreased after the $18^{th}$ day of culture. It may be due to the long time of anti-ROR1-G3-CAR-DNT cells cultured in vitro, leading to cell apoptosis.

Example 18. Cytokine Release Assay of Anti-ROR1-G3-CAR-DNT Cells

The biological activity of anti-ROR1-G3-CAR-DNT cells to U87MG overexpressing ROR1 cells was evaluated by using human TH1/TH2 cytokine CBA kit (BD, Cat:

550749). The anti-ROR1-G3-CAR-DNT cells or PBMC were co-culture with U87MG overexpressing ROR1 cell lines for 24 hours. The assay details were as follow: First, the target cell (U87MG overexpressing ROR1 cells) and no-target cell (U87MG) were harvested and washed twice with wash buffer. The cells were suspended with RPMI1640 containing 2% FBS and diluted to a concentration of 1×10⁶ cells/mL Then, the anti-ROR1-G3-CAR-DNT cells and PBMC (Effector) cells were collected and diluted to a concentration of 1×10⁶ cells/mL. 100 µL target cell (U87MG overexpressing ROR1 cells) and no-target cell (U87MG) were mixed with 100 µL anti-ROR1-G3-CAR-DNT cells or PBMC at 1:1 into a 96-well plate and co-cultured at 37° C. for 20-24 hours. Second, 100 µL culture medium was collected and centrifuged at 1000 rpm for 5 minutes, and the supernatant was used in cytokines release detection. Third, the cytokines capture beads were taken out and vigorously mixed well. 50 µL mixed beads and 50 µL of the PE Detection Reagent were added into 50 µL supernatant of each sample, mixed thoroughly and incubated at room temperature under dark for 3 hours. The wash buffer was added into each sample and centrifuged at 200 g for 5 minutes. The supernatant was discarded and 300 µL wash buffer was added into each sample for suspending the beads. Finally, the samples were analyzed by flow cytometry.

The result showed that the anti-ROR1-G3-CAR-DNT cells released IL-2, TNFα, IFNγ only in the presence of target cell (U87MG overexpressing ROR1 cells) cell lines. It showed that anti-ROR1-G3-CAR-DNT cells produced cytokines only when they were co-cultured with ROR1 positive target cells (U87MG overexpressing ROR1 cells), but not when they were co-cultured with ROR1 negative cells (U87MG), indicating that CAR-T cells had the ability to specifically kill ROR1 positive tumor cell lines, but had no killing effect to normal cells. The results are show in FIG. 13.

Example 19. Cytolysis Ability Test of Anti-ROR1-G3-CAR-DNT Cells

U87MG and U87MG overexpressing ROR1 cells were seeded in 24-well plates at a concentration of 1×10⁵ cells/well. The equal anti-ROR1-G3-CAR-DNT cells were added the culture without the addition of exogenous cytokines. Cell were analyzed at 24 hour to measure residual tumor cells and Anti-ROR1-G3-CAR-DNT cells by FACS. Anti-ROR1-G3-CAR-DNT cells were identified by expression of CD3 and GFP, and tumor cells by the expression of B7H3.

Figure 24:
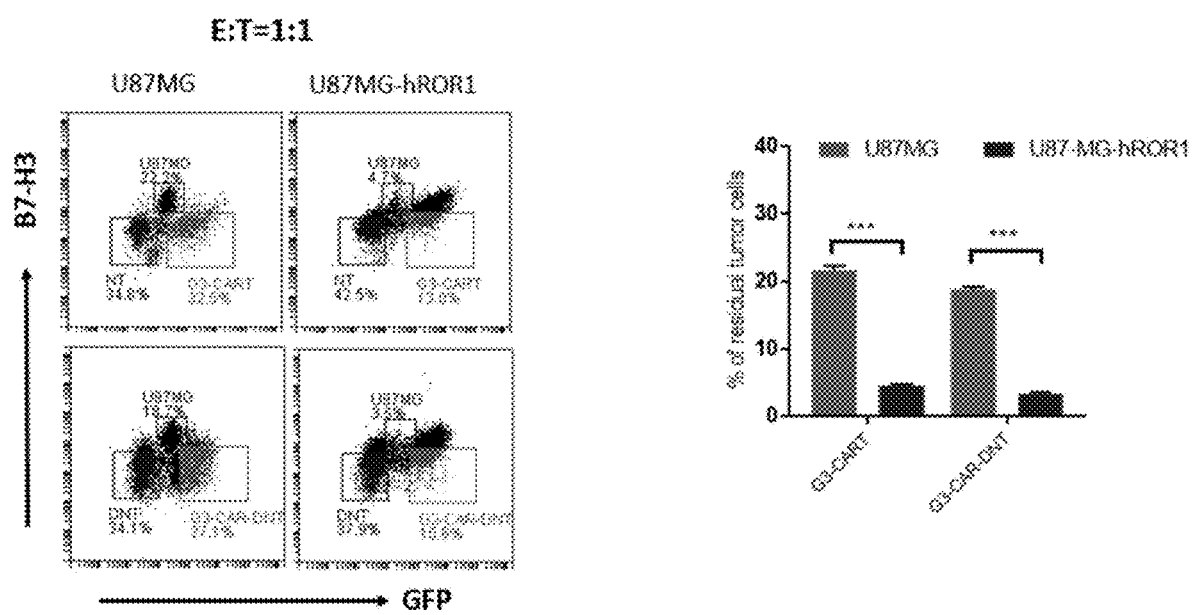
FIG. 24 shows the results of cytotoxicity of anti-ROR1-G3-CAR-DNT cells co-cultured with U87MG expressing ROR1 by FACS.

Anti-ROR1-G3-CAR-DNT cells resulted in significant cytotoxicity to U87MG overexpressing ROR1 cells, but had no cytotoxicity to U87MG cells, indicating that CAR-T cells had the ability to specifically kill ROR1 positive tumor cell lines, but had no killing effect to normal cells. The results are show in FIG. 24.

All the documents mentioned in the present invention are incorporated in the present application by reference to the same extent as if each individual document is specifically and individually indicated to be incorporated by reference. In addition, it should be understood that after reading the contents taught in the present invention, various modifications and changes may be made to the present invention by those skilled in the art, and these equivalents also fall into the scope defined by the claims.

What is claimed:

1. An ROR1 specific chimeric antigen receptor (CAR), which comprises:
   (1) an extracellular domain comprising at least one antigen binding domain or scFv that binds ROR1;
   (2) a hinge region;
   (3) a transmembrane region; and
   (4) an intracellular signaling domain;
   wherein the antigen binding domain comprises a heavy chain variable region which has a heavy chain complementarity determining region (HCDR)1 (HCDR1), HCDR2, and HCDR3, and a light chain variable region which has complementarity determining region (LCDR)1 (LCDR1), LCDR2, and LCDR3;
   wherein:
   (a) HCDR2 and HCDR3 comprise SEQ ID NOs: 3 and 4, respectively; or
   (b) HCDR3 comprises SEQ ID NO: 18; or
   (c) HCDR3, LCDR1, and LCDR3 comprise SEQ ID NOs: 32, 34 and 36, respectively; or
   (d) HCDR3 comprises SEQ ID NO: 11; or
   (e) HCDR3 comprises SEQ ID NO: 25; or
   (f) HCDR3 and LCDR3 comprise SEQ ID NOs: 39 and 42, respectively.

2. The ROR1 specific chimeric antigen receptor of claim 1, wherein the antigen binding domain comprises:
   (i) a heavy chain variable region having the polypeptide sequence of SEQ ID NO: 1, and a light chain variable region having the polypeptide sequence of SEQ ID NO: 5; or
   (ii) a heavy chain variable region having the polypeptide sequence of SEQ ID NO: 15, and a light chain variable region having the polypeptide sequence of SEQ ID NO: 19; or
   (iii) a heavy chain variable region having the polypeptide sequence of SEQ ID NO: 29, and a light chain variable region having the polypeptide sequence of SEQ ID NO: 33.

3. The ROR1 specific chimeric antigen receptor of claim 1, wherein the scFv is represented by the following formula A or formula B:

$$V_H\text{-}V_L \quad (A);$$

$$V_L\text{-}V_H \quad (B)$$

wherein, $V_H$ is the variable region of the heavy chain of the antibody; and $V_L$ is the variable region of the light chain of the antibody; "-" is a linker peptide or peptide bond.

4. The ROR1 specific chimeric antigen receptor of claim 3, wherein the ROR1 specific chimeric antigen receptor shares at least 90% sequence identity with the amino acid sequence of SEQ ID NO: 48, 49, or 50;
   or the $V_H$ chain and the $V_L$ chain have at least 80% sequence identity respectively with the amino acid sequence of SEQ ID NO: 1, 15 or 29 ($V_H$) and SEQ ID. NO: 5, 19 or 33 ($V_L$).

5. The ROR1 specific chimeric antigen receptor of claim 1, wherein the structure of the ROR1 specific chimeric antigen receptor is shown in the following formula I:

$$\text{L-scFv-H-TM-C-CD3}\zeta \quad (I)$$

wherein
L is none or a signal peptide sequence;
scFv is the scFv that binds ROR1;
H is none or a hinge;
TM is a transmembrane domain;
C is a costimulatory signal domain:
CD3ζ is a cytoplasmic signaling sequence derived from CD3ζ; and
each "-" is independently a linker peptide or a peptide bond.

6. The ROR1 specific chimeric antigen receptor of claim 5, wherein L is a signal peptide derived from CD8.

7. The ROR1 specific chimeric antigen receptor of claim 5, wherein H is a hinge region derived from CD8.

8. The ROR1 specific chimeric antigen receptor of claim 5, wherein TM is a transmembrane region derived from CD8 or CD28.

9. The ROR1 specific chimeric antigen receptor of claim 5, wherein C is a costimulatory signal domain derived from CD28 and/or 4-1BB.

10. An engineered immune cell which expresses the ROR1 specific chimeric antigen receptor of claim 1.

11. The engineered immune cell of claim 10, which is selected from the following group:
    (i) a chimeric antigen receptor T cell (CAR-T cell); or
    (ii) a chimeric antigen receptor NK cell (CAR-NK cell).

12. The engineered immune cell of claim 11, wherein the T cell is a cytotoxic T cell.

13. The engineered immune cell of claim 11, wherein the T cell is a double negative T cell (DNT cell).

14. A method for treating a disease, which comprises administering the engineered immune cell of claim 10 to a subject in need thereof.

15. The method of claim 14, wherein the disease is cancer.

16. The method of claim 15, wherein the cancer is pre-malignant or malignant cancer characterized by ROR1-expressing cells.

17. The method of claim 15, wherein the cancer is a hematological malignancy.

18. The method of claim 17, wherein the hematological malignancy is selected from the group consisting of: chronic lymphocytic leukemia (CLL), the small lymphocytic lymphoma (SLL), acute myelogenous leukemia, chronic myelogenous leukemia, myelodysplastic syndrome, mantle cell lymphoma (MCL), and acute lymphoblastic leukemia (ALL).

19. The method of claim 15, wherein the cancer is selected from the group consisting of: breast cancer, prostate cancer, liver cancer, lung cancer, pancreatic cancer, colon cancer, and kidney cancer.

20. A pharmaceutical composition which comprises (i) the ROR1 specific chimeric antigen receptor of claim 1, and (ii) a pharmaceutically acceptable carrier, diluent or excipient.

21. The ROR1 specific chimeric antigen receptor of claim 1,
  wherein HCDR1 comprises SEQ ID NO: 16.

22. The ROR1 specific chimeric antigen receptor of claim 1,
  wherein the antigen binding domain comprises a heavy chain variable region having the polypeptide sequence of SEQ ID NO: 15, and a light chain variable region having the polypeptide sequence of SEQ ID NO: 19.

\* \* \* \* \*

SEQUENCE LISTING

<160> NUMBER OF SEQ ID NOS: 42

<210> SEQ ID NO 1
<211> LENGTH: 123
<212> TYPE: PRT
<213> ORGANISM: Artificial Sequence
<220> FEATURE:
<223> OTHER INFORMATION: VH of antibody C3

<400> SEQUENCE: 1

```
Gln Val Gln Leu Gln Glu Ser Gly Pro Gly Leu Val Lys Pro Ser Glu
1               5                   10                  15

Thr Leu Ser Leu Thr Cys Thr Val Ser Gly Gly Ser Ile Ser Ser Tyr
            20                  25                  30

Tyr Trp Ser Trp Ile Arg Gln Leu Pro Gly Lys Gly Leu Glu Trp Ile
        35                  40                  45

Gly Tyr Met His Tyr Ser Gly Ser Thr Ser Tyr Asn Pro Ser Leu Lys
    50                  55                  60

Gly Arg Leu Thr Ile Ser Val Asp Thr Ser Thr Asn Gln Phe Ser Leu
65                  70                  75                  80

Lys Leu Gly Ser Val Thr Ala Ala Asp Thr Ala Val Tyr Tyr Cys Ala
                85                  90                  95

Arg Tyr Tyr His Asp Ser Ser Gly Tyr Tyr Ser Tyr Phe Asp Tyr
            100                 105                 110

Trp Gly Gln Gly Thr Leu Val Thr Val Ser Ser
        115                 120
```

<210> SEQ ID NO 2

```
<211> LENGTH: 5
<212> TYPE: PRT
<213> ORGANISM: Artificial Sequence
<220> FEATURE:
<223> OTHER INFORMATION: VH-CDR1

<400> SEQUENCE: 2

Ser Tyr Tyr Trp Ser
1               5

<210> SEQ ID NO 3
<211> LENGTH: 16
<212> TYPE: PRT
<213> ORGANISM: Artificial Sequence
<220> FEATURE:
<223> OTHER INFORMATION: VH-CDR2

<400> SEQUENCE: 3

Tyr Met His Tyr Ser Gly Ser Thr Ser Tyr Asn Pro Ser Leu Lys Gly
1               5                   10                  15

<210> SEQ ID NO 4
<211> LENGTH: 15
<212> TYPE: PRT
<213> ORGANISM: Artificial Sequence
<220> FEATURE:
<223> OTHER INFORMATION: VH-CDR3

<400> SEQUENCE: 4

Tyr Tyr Tyr His Asp Ser Ser Gly Tyr Tyr Ser Tyr Phe Asp Tyr
1               5                   10                  15

<210> SEQ ID NO 5
<211> LENGTH: 107
<212> TYPE: PRT
<213> ORGANISM: Artificial Sequence
<220> FEATURE:
<223> OTHER INFORMATION: VL of antibody C3

<400> SEQUENCE: 5

Glu Ile Val Leu Thr Gln Ser Pro Gly Thr Leu Ser Leu Ser Pro Gly
1               5                   10                  15

Glu Arg Ala Thr Leu Ser Cys Arg Ala Ser Gln Ser Val Ser Ser Tyr
                20                  25                  30

Leu Ala Trp Tyr Gln Gln Lys Ala Gly Gln Ala Pro Arg Leu Leu Ile
            35                  40                  45

Tyr Asp Ala Ser Asn Arg Ala Ser Gly Ile Pro Ala Arg Phe Ser Gly
    50                  55                  60

Ser Gly Ser Gly Thr Asp Phe Thr Leu Thr Ile Ser Ser Leu Glu Pro
65                  70                  75                  80

Glu Asp Phe Ala Val Tyr Tyr Cys Gln Gln Arg Ser Asn Trp Pro Pro
                85                  90                  95

Thr Phe Gly Gly Gly Thr Lys Val Glu Ile Lys
            100                 105

<210> SEQ ID NO 6
<211> LENGTH: 11
<212> TYPE: PRT
<213> ORGANISM: Artificial Sequence
<220> FEATURE:
<223> OTHER INFORMATION: VL-CDR1

<400> SEQUENCE: 6

Arg Ala Ser Gln Ser Val Ser Ser Tyr Leu Ala
```

<210> SEQ ID NO 7
<211> LENGTH: 7
<212> TYPE: PRT
<213> ORGANISM: Artificial Sequence
<220> FEATURE:
<223> OTHER INFORMATION: VL-CDR2

<400> SEQUENCE: 7

Asp Ala Ser Asn Arg Ala Ser
1               5

<210> SEQ ID NO 8
<211> LENGTH: 9
<212> TYPE: PRT
<213> ORGANISM: Artificial Sequence
<220> FEATURE:
<223> OTHER INFORMATION: VL-CDR3

<400> SEQUENCE: 8

Gln Gln Arg Ser Asn Trp Pro Pro Thr
1               5

<210> SEQ ID NO 9
<211> LENGTH: 8
<212> TYPE: PRT
<213> ORGANISM: Artificial Sequence
<220> FEATURE:
<223> OTHER INFORMATION: VH-CDR1

<400> SEQUENCE: 9

Gly Gly Ser Ile Ser Ser Tyr Tyr
1               5

<210> SEQ ID NO 10
<211> LENGTH: 7
<212> TYPE: PRT
<213> ORGANISM: Artificial Sequence
<220> FEATURE:
<223> OTHER INFORMATION: VH-CDR2

<400> SEQUENCE: 10

Met His Tyr Ser Gly Ser Thr
1               5

<210> SEQ ID NO 11
<211> LENGTH: 17
<212> TYPE: PRT
<213> ORGANISM: Artificial Sequence
<220> FEATURE:
<223> OTHER INFORMATION: VH-CDR3

<400> SEQUENCE: 11

Ala Arg Tyr Tyr Tyr His Asp Ser Ser Gly Tyr Tyr Ser Tyr Phe Asp
1               5                   10                  15

Tyr

<210> SEQ ID NO 12
<211> LENGTH: 6
<212> TYPE: PRT
<213> ORGANISM: Artificial Sequence
<220> FEATURE:
<223> OTHER INFORMATION: VL-CDR1

<400> SEQUENCE: 12

```
Gln Ser Val Ser Ser Tyr
1               5

<210> SEQ ID NO 13
<211> LENGTH: 39
<212> TYPE: PRT
<213> ORGANISM: Artificial Sequence
<220> FEATURE:
<223> OTHER INFORMATION: VL-CDR2 and FR3 of VL

<400> SEQUENCE: 13

Asp Ala Ser Asn Arg Ala Ser Gly Ile Pro Ala Arg Phe Ser Gly Ser
1               5                   10                  15

Gly Ser Gly Thr Asp Phe Thr Leu Thr Ile Ser Ser Leu Glu Pro Glu
            20                  25                  30

Asp Phe Ala Val Tyr Tyr Cys
        35

<210> SEQ ID NO 14
<211> LENGTH: 9
<212> TYPE: PRT
<213> ORGANISM: Artificial Sequence
<220> FEATURE:
<223> OTHER INFORMATION: VL-CDR3

<400> SEQUENCE: 14

Gln Gln Arg Ser Asn Trp Pro Pro Thr
1               5

<210> SEQ ID NO 15
<211> LENGTH: 121
<212> TYPE: PRT
<213> ORGANISM: Artificial Sequence
<220> FEATURE:
<223> OTHER INFORMATION: VH of antibody G3

<400> SEQUENCE: 15

Gln Val Gln Leu Gln Gln Trp Gly Ala Gly Leu Leu Lys Pro Ser Glu
1               5                   10                  15

Thr Leu Ser Leu Thr Cys Ala Val Tyr Gly Gly Ser Phe Ser Gly Tyr
            20                  25                  30

Tyr Trp Ser Trp Ile Arg Gln Pro Pro Gly Lys Gly Leu Glu Trp Ile
        35                  40                  45

Gly Glu Ile Asn His Ser Gly Ser Thr Ser Tyr Asn Pro Ser Leu Lys
    50                  55                  60

Ser Arg Val Thr Ile Ser Val Asp Thr Ser Lys Asn Gln Phe Ser Leu
65                  70                  75                  80

Lys Leu Ser Ser Val Thr Ala Ala Asp Thr Ala Val Tyr Tyr Cys Ala
                85                  90                  95

Arg Gly His Ser Ser Gly Trp Tyr Arg Arg Tyr Phe Asp Leu Trp Gly
            100                 105                 110

Arg Gly Thr Leu Val Thr Val Ser Ser
        115                 120

<210> SEQ ID NO 16
<211> LENGTH: 5
<212> TYPE: PRT
<213> ORGANISM: Artificial Sequence
<220> FEATURE:
<223> OTHER INFORMATION: VH-CDR1

<400> SEQUENCE: 16
```

```
Gly Tyr Tyr Trp Ser
1               5

<210> SEQ ID NO 17
<211> LENGTH: 16
<212> TYPE: PRT
<213> ORGANISM: Artificial Sequence
<220> FEATURE:
<223> OTHER INFORMATION: VH-CDR2

<400> SEQUENCE: 17

Glu Ile Asn His Ser Gly Ser Thr Ser Tyr Asn Pro Ser Leu Lys Ser
1               5                   10                  15

<210> SEQ ID NO 18
<211> LENGTH: 13
<212> TYPE: PRT
<213> ORGANISM: Artificial Sequence
<220> FEATURE:
<223> OTHER INFORMATION: VH-CDR3

<400> SEQUENCE: 18

Gly His Ser Ser Gly Trp Tyr Arg Arg Tyr Phe Asp Leu
1               5                   10

<210> SEQ ID NO 19
<211> LENGTH: 107
<212> TYPE: PRT
<213> ORGANISM: Artificial Sequence
<220> FEATURE:
<223> OTHER INFORMATION: VL of antibody G3

<400> SEQUENCE: 19

Glu Ile Val Leu Thr Gln Ser Pro Ala Thr Leu Ser Leu Ser Pro Gly
1               5                   10                  15

Glu Arg Ala Thr Leu Ser Cys Arg Ala Ser Gln Ser Val Ser Ser Tyr
                20                  25                  30

Leu Ala Trp Tyr Gln Gln Lys Pro Gly Gln Ala Pro Arg Leu Leu Ile
            35                  40                  45

Tyr Asp Ala Ser Asn Arg Ala Thr Gly Ile Pro Ala Lys Phe Ser Gly
50                  55                  60

Ser Gly Ser Gly Thr Asp Phe Thr Leu Thr Ile Ser Ser Leu Glu Pro
65                  70                  75                  80

Glu Asp Phe Ala Val Tyr Tyr Cys Gln Gln Arg Ser Asn Trp Pro Pro
                85                  90                  95

Thr Phe Gly Gly Gly Thr Lys Val Glu Ile Lys
            100                 105

<210> SEQ ID NO 20
<211> LENGTH: 11
<212> TYPE: PRT
<213> ORGANISM: Artificial Sequence
<220> FEATURE:
<223> OTHER INFORMATION: VL-CDR1

<400> SEQUENCE: 20

Arg Ala Ser Gln Ser Val Ser Ser Tyr Leu Ala
1               5                   10

<210> SEQ ID NO 21
<211> LENGTH: 7
<212> TYPE: PRT
<213> ORGANISM: Artificial Sequence
<220> FEATURE:
```

```
<223> OTHER INFORMATION: VL-CDR2

<400> SEQUENCE: 21

Asp Ala Ser Asn Arg Ala Thr
1               5

<210> SEQ ID NO 22
<211> LENGTH: 9
<212> TYPE: PRT
<213> ORGANISM: Artificial Sequence
<220> FEATURE:
<223> OTHER INFORMATION: VL-CDR3

<400> SEQUENCE: 22

Gln Gln Arg Ser Asn Trp Pro Pro Thr
1               5

<210> SEQ ID NO 23
<211> LENGTH: 8
<212> TYPE: PRT
<213> ORGANISM: Artificial Sequence
<220> FEATURE:
<223> OTHER INFORMATION: VH-CDR1

<400> SEQUENCE: 23

Gly Gly Ser Phe Ser Gly Tyr Tyr
1               5

<210> SEQ ID NO 24
<211> LENGTH: 7
<212> TYPE: PRT
<213> ORGANISM: Artificial Sequence
<220> FEATURE:
<223> OTHER INFORMATION: VH-CDR2

<400> SEQUENCE: 24

Ile Asn His Ser Gly Ser Thr
1               5

<210> SEQ ID NO 25
<211> LENGTH: 15
<212> TYPE: PRT
<213> ORGANISM: Artificial Sequence
<220> FEATURE:
<223> OTHER INFORMATION: VH-CDR3

<400> SEQUENCE: 25

Ala Arg Gly His Ser Ser Gly Trp Tyr Arg Arg Tyr Phe Asp Leu
1               5                   10                  15

<210> SEQ ID NO 26
<211> LENGTH: 6
<212> TYPE: PRT
<213> ORGANISM: Artificial Sequence
<220> FEATURE:
<223> OTHER INFORMATION: VL-CDR1

<400> SEQUENCE: 26

Gln Ser Val Ser Ser Tyr
1               5

<210> SEQ ID NO 27
<211> LENGTH: 39
<212> TYPE: PRT
<213> ORGANISM: Artificial Sequence
<220> FEATURE:
<223> OTHER INFORMATION: VL-CDR2 and FR3 of VL
```

```
<400> SEQUENCE: 27

Asp Ala Ser Asn Arg Ala Thr Gly Ile Pro Ala Lys Phe Ser Gly Ser
1               5                   10                  15

Gly Ser Gly Thr Asp Phe Thr Leu Thr Ile Ser Ser Leu Glu Pro Glu
            20                  25                  30

Asp Phe Ala Val Tyr Tyr Cys
            35

<210> SEQ ID NO 28
<211> LENGTH: 9
<212> TYPE: PRT
<213> ORGANISM: Artificial Sequence
<220> FEATURE:
<223> OTHER INFORMATION: VL-CDR3

<400> SEQUENCE: 28

Gln Gln Arg Ser Asn Trp Pro Pro Thr
1               5

<210> SEQ ID NO 29
<211> LENGTH: 123
<212> TYPE: PRT
<213> ORGANISM: Artificial Sequence
<220> FEATURE:
<223> OTHER INFORMATION: VH of antibody G6

<400> SEQUENCE: 29

Glu Val Gln Leu Val Glu Ser Gly Gly Gly Val Val Gln Pro Gly Gly
1               5                   10                  15

Ser Leu Arg Leu Ser Cys Ala Ala Ser Gly Phe Thr Phe Asp Asp Tyr
            20                  25                  30

Ala Met His Trp Val Arg Gln Ala Pro Gly Lys Gly Leu Glu Trp Val
        35                  40                  45

Ser Leu Ile Ser Gly Asp Gly Gly Ser Thr Tyr Tyr Ala Asp Ser Val
    50                  55                  60

Lys Gly Arg Phe Thr Ile Ser Arg Asp Asn Ala Lys Asn Ser Leu Tyr
65                  70                  75                  80

Leu Gln Met Asn Ser Leu Arg Ala Glu Asp Thr Ala Val Tyr Tyr Cys
                85                  90                  95

Ala Arg Asp Asn Trp Asn Asp Val Tyr Tyr Tyr Gly Met Asp Val
            100                 105                 110

Trp Gly Gln Gly Thr Thr Val Thr Val Ser Ser
        115                 120

<210> SEQ ID NO 30
<211> LENGTH: 5
<212> TYPE: PRT
<213> ORGANISM: Artificial Sequence
<220> FEATURE:
<223> OTHER INFORMATION: VH-CDR1

<400> SEQUENCE: 30

Asp Tyr Ala Met His
1               5

<210> SEQ ID NO 31
<211> LENGTH: 17
<212> TYPE: PRT
<213> ORGANISM: Artificial Sequence
<220> FEATURE:
<223> OTHER INFORMATION: VH-CDR2
```

<400> SEQUENCE: 31

Leu Ile Ser Gly Asp Gly Gly Ser Thr Tyr Tyr Ala Asp Ser Val Lys
1               5                   10                  15

Gly

<210> SEQ ID NO 32
<211> LENGTH: 14
<212> TYPE: PRT
<213> ORGANISM: Artificial Sequence
<220> FEATURE:
<223> OTHER INFORMATION: VH-CDR3

<400> SEQUENCE: 32

Asp Asn Trp Asn Asp Val Tyr Tyr Tyr Gly Met Asp Val
1               5                   10

<210> SEQ ID NO 33
<211> LENGTH: 107
<212> TYPE: PRT
<213> ORGANISM: Artificial Sequence
<220> FEATURE:
<223> OTHER INFORMATION: VL of antibody G3

<400> SEQUENCE: 33

Asp Ile Gln Leu Thr Gln Ser Pro Ser Ser Leu Ser Ala Ser Ile Gly
1               5                   10                  15

Asp Thr Val Thr Ile Ser Cys Gln Ala Ser Arg Asp Ile Ser Asp Tyr
            20                  25                  30

Leu Asn Trp Tyr Gln His Lys Pro Gly Lys Ala Pro Lys Leu Leu Ile
        35                  40                  45

Tyr Asp Ala Ser Asn Leu Ala Thr Gly Val Pro Ser Arg Phe Ser Gly
    50                  55                  60

Ser Gly Ser Gly Thr Asp Phe Thr Leu Thr Ile Lys Ser Leu Gln Pro
65                  70                  75                  80

Glu Asp Val Ala Thr Tyr Phe Cys Gln Gln Asp Asp Leu Leu Pro Leu
                85                  90                  95

Thr Phe Gly Gly Gly Thr Lys Val Asp Ile Lys
            100                 105

<210> SEQ ID NO 34
<211> LENGTH: 11
<212> TYPE: PRT
<213> ORGANISM: Artificial Sequence
<220> FEATURE:
<223> OTHER INFORMATION: VL-CDR1

<400> SEQUENCE: 34

Gln Ala Ser Arg Asp Ile Ser Asp Tyr Leu Asn
1               5                   10

<210> SEQ ID NO 35
<211> LENGTH: 7
<212> TYPE: PRT
<213> ORGANISM: Artificial Sequence
<220> FEATURE:
<223> OTHER INFORMATION: VL-CDR2

<400> SEQUENCE: 35

Asp Ala Ser Asn Leu Ala Thr
1               5

```
<210> SEQ ID NO 36
<211> LENGTH: 9
<212> TYPE: PRT
<213> ORGANISM: Artificial Sequence
<220> FEATURE:
<223> OTHER INFORMATION: VL-CDR3

<400> SEQUENCE: 36

Gln Gln Asp Asp Leu Leu Pro Leu Thr
1               5

<210> SEQ ID NO 37
<211> LENGTH: 8
<212> TYPE: PRT
<213> ORGANISM: Artificial Sequence
<220> FEATURE:
<223> OTHER INFORMATION: VH-CDR1

<400> SEQUENCE: 37

Gly Phe Thr Phe Asp Asp Tyr Ala
1               5

<210> SEQ ID NO 38
<211> LENGTH: 8
<212> TYPE: PRT
<213> ORGANISM: Artificial Sequence
<220> FEATURE:
<223> OTHER INFORMATION: VH-CDR2

<400> SEQUENCE: 38

Ile Ser Gly Asp Gly Gly Ser Thr
1               5

<210> SEQ ID NO 39
<211> LENGTH: 16
<212> TYPE: PRT
<213> ORGANISM: Artificial Sequence
<220> FEATURE:
<223> OTHER INFORMATION: VH-CDR3

<400> SEQUENCE: 39

Ala Arg Asp Asn Trp Asn Asp Val Tyr Tyr Tyr Tyr Gly Met Asp Val
1               5                   10                  15

<210> SEQ ID NO 40
<211> LENGTH: 6
<212> TYPE: PRT
<213> ORGANISM: Artificial Sequence
<220> FEATURE:
<223> OTHER INFORMATION: VL-CDR1

<400> SEQUENCE: 40

Arg Asp Ile Ser Asp Tyr
1               5

<210> SEQ ID NO 41
<211> LENGTH: 39
<212> TYPE: PRT
<213> ORGANISM: Artificial Sequence
<220> FEATURE:
<223> OTHER INFORMATION: VL-CDR2 and FR3 of VL

<400> SEQUENCE: 41

Asp Ala Ser Asn Leu Ala Thr Gly Val Pro Ser Arg Phe Ser Gly Ser
1               5                   10                  15

Gly Ser Gly Thr Asp Phe Thr Leu Thr Ile Lys Ser Leu Gln Pro Glu
            20                  25                  30
```

```
Asp Val Ala Thr Tyr Phe Cys
        35

<210> SEQ ID NO 42
<211> LENGTH: 9
<212> TYPE: PRT
<213> ORGANISM: Artificial Sequence
<220> FEATURE:
<223> OTHER INFORMATION: VL-CDR3

<400> SEQUENCE: 42

Gln Gln Asp Asp Leu Leu Pro Leu Thr
1               5
```